US010938390B2

(12) United States Patent
Camacho Cardenas et al.

(10) Patent No.: US 10,938,390 B2
(45) Date of Patent: Mar. 2, 2021

(54) SHAFT PROXIMITY SENSORS

(71) Applicant: SCHLUMBERGER TECHNOLOGY CORPORATION, Sugar Land, TX (US)

(72) Inventors: Alejandro Camacho Cardenas, Houston, TX (US); Peter Benjamin Johnson, Cambridge (GB); Leo Steenson, Cambridge (GB); Dudi Abdullah Rendusara, Woodlands (SG); Andrew William Meredith, Cambridge (GB)

(73) Assignee: SCHLUMBERGER TECHNOLOGY CORPORATION, Sugar Land, TX (US)

(*) Notice: Subject to any disclaimer, the term of this patent is extended or adjusted under 35 U.S.C. 154(b) by 19 days.

(21) Appl. No.: 16/314,186

(22) PCT Filed: Jun. 30, 2016

(86) PCT No.: PCT/US2016/040242
§ 371 (c)(1),
(2) Date: Dec. 28, 2018

(87) PCT Pub. No.: WO2018/004577
PCT Pub. Date: Jan. 4, 2018

(65) Prior Publication Data
US 2019/0326906 A1   Oct. 24, 2019

(51) Int. Cl.
*G01R 23/20* (2006.01)
*H03K 17/945* (2006.01)
(Continued)

(52) U.S. Cl.
CPC .......... *H03K 17/945* (2013.01); *E21B 43/12* (2013.01); *F04B 17/03* (2013.01); *F04B 47/06* (2013.01);
(Continued)

(58) Field of Classification Search
CPC ........ G01R 23/20; G01R 27/28; G01R 27/32; G01R 31/2825; G01R 19/2513; G01R 1/07; G01R 23/16; G01R 23/165
(Continued)

(56) References Cited

U.S. PATENT DOCUMENTS 6,811,382 B2   11/2004   Buchanan et al.
7,215,252 B2   5/2007   Schenck
(Continued)

FOREIGN PATENT DOCUMENTS

JP   2001090688 A   4/2001

OTHER PUBLICATIONS

WO 2014179160 Copy Disclosed by Applicant, Apr. 25, 2014 (Year: 2014).*
(Continued)

*Primary Examiner* — Raul J Rios Russo

(57) ABSTRACT

A system can include a housing that defines an interior space; a shaft disposed at least in part in the interior space of the housing where the shaft includes a longitudinal axis, a curved surface and an end surface; a submersible electric motor operatively coupled to the shaft where the submersible electric motor includes a cable connector; two proximity sensors where each of the proximity sensors includes a sensor aperture disposed in the interior space of the housing; and circuitry operatively coupled to the proximity sensors that determines position values of the shaft with respect to time based at least in part on output of the proximity sensors.

20 Claims, 34 Drawing Sheets

(51) Int. Cl.

| | |
|---|---|
| *E21B 43/12* | (2006.01) |
| *F04B 17/03* | (2006.01) |
| *F04B 47/06* | (2006.01) |
| *F04D 15/00* | (2006.01) |
| *F04D 29/043* | (2006.01) |
| *F04D 29/08* | (2006.01) |
| *F04D 29/18* | (2006.01) |
| *G01R 27/28* | (2006.01) |
| *G01R 27/32* | (2006.01) |
| *G01R 31/28* | (2006.01) |
| *G01R 19/25* | (2006.01) |
| *G01R 1/07* | (2006.01) |
| *G01R 23/16* | (2006.01) |
| *G01R 23/165* | (2006.01) |

(52) U.S. Cl.
CPC ....... *F04D 15/0077* (2013.01); *F04D 29/043* (2013.01); *F04D 29/086* (2013.01); *F04D 29/18* (2013.01); *G01R 19/2513* (2013.01); *G01R 23/20* (2013.01); *G01R 27/28* (2013.01); *G01R 27/32* (2013.01); *G01R 31/2825* (2013.01); *G01R 1/07* (2013.01); *G01R 23/16* (2013.01); *G01R 23/165* (2013.01)

(58) Field of Classification Search
USPC ... 324/76.11–76.83, 459, 600, 612, 620, 623
See application file for complete search history.

(56) References Cited

U.S. PATENT DOCUMENTS

| | | | |
|---|---|---|---|
| 7,648,332 | B2 | 1/2010 | Eslinger et al. |
| 10,280,734 | B2 | 5/2019 | Camacho Cardenas et al. |
| 2002/0066568 | A1 | 6/2002 | Buchanan et al. |
| 2007/0252717 | A1 | 11/2007 | Fielder |
| 2009/0180866 | A1 | 7/2009 | Bourgeois et al. |
| 2010/0256953 | A1 | 10/2010 | Kar |
| 2010/0288493 | A1 | 11/2010 | Fielder et al. |
| 2011/0044831 | A1 | 2/2011 | Cunningham et al. |
| 2011/0050145 | A1 | 3/2011 | Plitt et al. |
| 2011/0052432 | A1 | 3/2011 | Cunningham et al. |
| 2011/0231110 | A1 | 9/2011 | Johnston |
| 2011/0255951 | A1 | 10/2011 | Song et al. |
| 2012/0257995 | A1 | 10/2012 | True |
| 2013/0148127 | A1 | 6/2013 | Sheth et al. |
| 2013/0272898 | A1 | 10/2013 | Toh et al. |
| 2013/0341498 | A1 | 12/2013 | Sheth et al. |
| 2015/0098488 | A1 | 4/2015 | Wang et al. |
| 2015/0260550 | A1 | 9/2015 | Harrison et al. |
| 2015/0300841 | A1 | 10/2015 | Campbell et al. |
| 2016/0084069 | A1* | 3/2016 | Camacho Cardenas ............. F04D 29/528 415/118 |
| 2017/0089192 | A1* | 3/2017 | Rendusara ............. F04D 13/10 |
| 2018/0328365 | A1* | 11/2018 | Eslinger ............. E21B 43/128 |
| 2019/0257188 | A1* | 8/2019 | Camacho Cardenas ............. E21B 43/128 |

OTHER PUBLICATIONS

International Search Report and Written Opinion issued in the PCT Application PCT/US2016/040242, dated Mar. 24, 2017 (14 pages).
International Preliminary Report on Patentability issued in the PCT Application PCT/US2016/040242, dated Jan. 1, 2019 (10 pages).
Extended Search Report issued in EP Application 16907540.5, dated Jan. 24, 2020 (6 pages).
International Search Report and Written Opinion issued in the PCT Application PCT/US2014/035417, dated Aug. 29, 2014 (14 pages).
International Preliminary Report on Patentability Issued in PCT Application PCT/US2014/035417 dated Nov. 3, 2015 (9 pages).
European Search Report issued in related EP application 14792249.6 dated Aug. 12, 2016, 6 pages.
Article 94(3) EPC issued in related EP application 14792249.6 dated Sep. 27, 2016, 6 pages.
Schlumberger, Phoenix MultiSensor xt150, Brochure, 2011, 10-AL-0129 (2 pages).
Schlumberger, Phoenix SoloConn and ARConn, Brochure, 2012, 11-AL-0092 (3 pages).
Schlumberger, REDA Hotline, Brochure, 2011, 11-AL-0062 (3 pages).
Schlumberger, Advanced ESP Lifting Service, Brochure, 2008, 08-AL-042 (1 page).
Schlumberger, SpeedStar MVD, Brochure, 2016, 15-AL-43886 (2 pages).
Schlumberger, WellWatcher UniConn, Brochure, 2016, 16-CO-224868 (2 pages).
Schlumberger, WellWatcher BriteBlue HT, Brochure, 2014, 13-CO-0050 (2 pages).
Schlumberger, OPTICall, Distributed Temperature Sensing. On Demand., Brochure, 2009, 09-TS-0277 (8 pages).
Schlumberger, Case Study, Extremely Abrasive Colombia Well Produces for 797 Days with a Rugged Maximus ESP System, 2017, 17-AL-285610 (2 pages).
American Petroleum Institute (API), Recommended Practice on Electric Submersible Pump System Vibrations, API Recommended Practice 11S8 (RP11S8), First Edition, May 1, 1993 (17 pages).

* cited by examiner

System 1800

SHAFT PROXIMITY SENSORS

BACKGROUND

As an example, an electric submersible pump (ESP) can include a stack of impeller and diffuser stages where the impellers are operatively coupled to a shaft driven by an electric motor. As an example, an electric submersible pump (ESP) can include a piston that is operatively coupled to a shaft driven by an electric motor, for example, where at least a portion of the shaft may include one or more magnets and form part of the electric motor.

SUMMARY

A system can include a shaft that includes a longitudinal axis; an electric motor operatively coupled to the shaft; proximity sensors directed at the shaft; and circuitry that receives information from the proximity sensors and that determines runout values of the shaft with respect to time. A method can include receiving parameter values for a shaft disposed at least in part in a housing and driven by a submersible electric motor where the parameter values are based at least in part on measurements acquired by proximity sensors disposed in the housing; and determining an operational state of the system based at least in part on the parameter values. A protector of an electric submersible pump system can include a shaft that includes a longitudinal axis; a thrust bearing; a runner; a proximity sensor; and circuitry that determines axial distance between a surface of the thrust bearing and a surface of the runner based at least in part on output of the proximity sensor.

This summary is provided to introduce a selection of concepts that are further described below in the detailed description. This summary is not intended to identify key or essential features of the claimed subject matter, nor is it intended to be used as an aid in limiting the scope of the claimed subject matter.

BRIEF DESCRIPTION OF THE DRAWINGS

Features and advantages of the described implementations can be more readily understood by reference to the following description taken in conjunction with the accompanying drawings.

DETAILED DESCRIPTION

The following description includes the best mode presently contemplated for practicing the described implementations. This description is not to be taken in a limiting sense, but rather is made merely for the purpose of describing the general principles of the implementations. The scope of the described implementations should be ascertained with reference to the issued claims.

Figure 1:
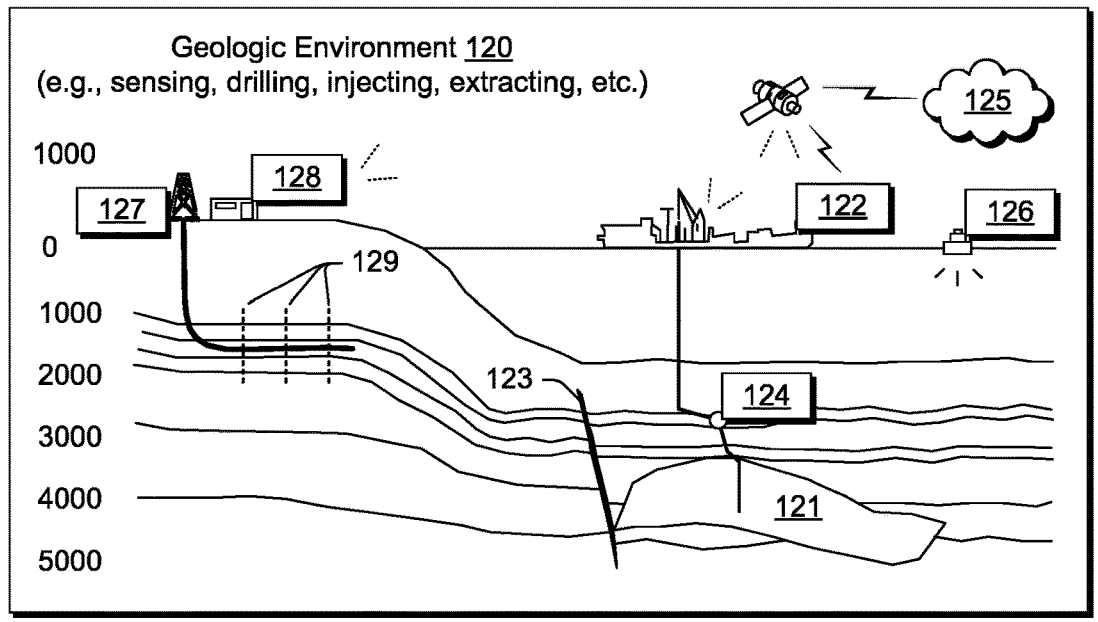
FIG. 1 illustrates examples of equipment in geologic environments.
Figure 1:
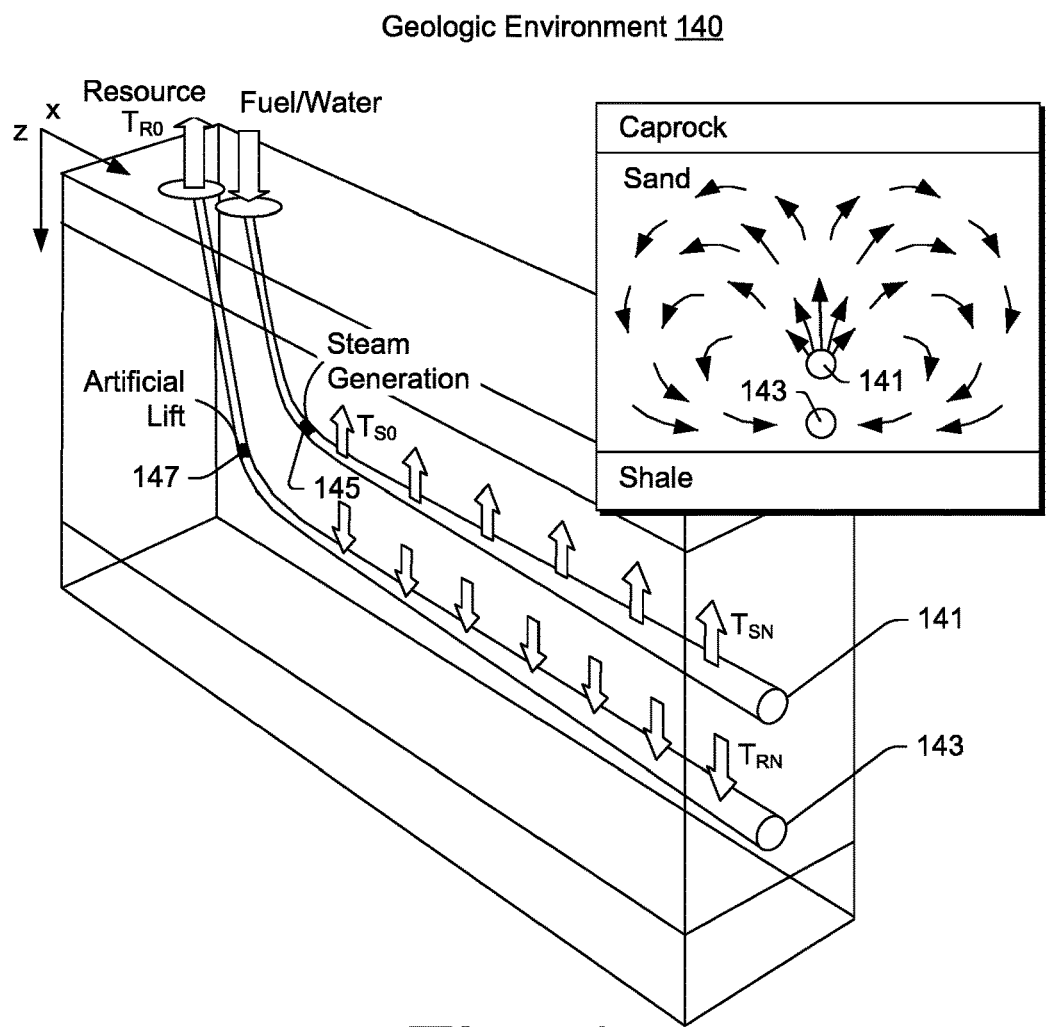

FIG. 1 shows examples of geologic environments 120 and 140. In FIG. 1, the geologic environment 120 may be a sedimentary basin that includes layers (e.g., stratification) that include a reservoir 121 and that may be, for example, intersected by a fault 123 (e.g., or faults). As an example, the geologic environment 120 may be outfitted with any of a variety of sensors, detectors, actuators, etc. For example, equipment 122 may include communication circuitry to receive and to transmit information with respect to one or more networks 125. Such information may include information associated with downhole equipment 124, which may be equipment to acquire information, to assist with resource recovery, etc. Other equipment 126 may be located remote from a well site and include sensing, detecting, emitting or other circuitry. Such equipment may include storage and communication circuitry to store and to communicate data, instructions, etc. As an example, one or more satellites may be provided for purposes of communications, data acquisition, etc. For example, FIG. 1 shows a satellite in communication with the network 125 that may be configured for communications, noting that the satellite may additionally or alternatively include circuitry for imagery (e.g., spatial, spectral, temporal, radiometric, etc.).

FIG. 1 also shows the geologic environment 120 as optionally including equipment 127 and 128 associated with a well that includes a substantially horizontal portion that may intersect with one or more fractures 129. For example, consider a well in a shale formation that may include natural fractures, artificial fractures (e.g., hydraulic fractures) or a combination of natural and artificial fractures. As an example, a well may be drilled for a reservoir that is laterally extensive. In such an example, lateral variations in properties, stresses, etc. may exist where an assessment of such variations may assist with planning, operations, etc. to develop the reservoir (e.g., via fracturing, injecting, extracting, etc.). As an example, the equipment 127 and/or 128 may include components, a system, systems, etc. for fracturing, seismic sensing, analysis of seismic data, assessment of one or more fractures, etc.

As to the geologic environment 140, as shown in FIG. 1, it includes two wells 141 and 143 (e.g., bores), which may be, for example, disposed at least partially in a layer such as a sand layer disposed between caprock and shale. As an example, the geologic environment 140 may be outfitted with equipment 145, which may be, for example, steam assisted gravity drainage (SAGD) equipment for injecting steam for enhancing extraction of a resource from a reservoir. SAGD is a technique that involves subterranean delivery of steam to enhance flow of heavy oil, bitumen, etc. SAGD can be applied for Enhanced Oil Recovery (EOR), which is also known as tertiary recovery because it changes properties of oil in situ.

As an example, a SAGD operation in the geologic environment 140 may use the well 141 for steam-injection and the well 143 for resource production. In such an example, the equipment 145 may be a downhole steam generator and the equipment 147 may be an electric submersible pump (e.g., an ESP).

As illustrated in a cross-sectional view of FIG. 1, steam injected via the well 141 may rise in a subterranean portion of the geologic environment and transfer heat to a desirable resource such as heavy oil. In turn, as the resource is heated, its viscosity decreases, allowing it to flow more readily to the well 143 (e.g., a resource production well). In such an example, equipment 147 (e.g., an ESP) may then assist with lifting the resource in the well 143 to, for example, a surface facility (e.g., via a wellhead, etc.). As an example, where a production well includes artificial lift equipment such as an ESP, operation of such equipment may be impacted by the presence of condensed steam (e.g., water in addition to a desired resource). In such an example, an ESP may experience conditions that may depend in part on operation of other equipment (e.g., steam injection, operation of another ESP, etc.).

Conditions in a geologic environment may be transient and/or persistent. Where equipment is placed within a geologic environment, longevity of the equipment can depend on characteristics of the environment and, for example, duration of use of the equipment as well as function of the equipment. Where equipment is to endure in an environment over an extended period of time, uncertainty may arise in one or more factors that could impact integrity or expected lifetime of the equipment. As an example, where a period of time may be of the order of decades, equipment that is intended to last for such a period of time may be constructed to endure conditions imposed thereon, whether imposed by an environment or environments and/or one or more functions of the equipment itself.

Figure 2:
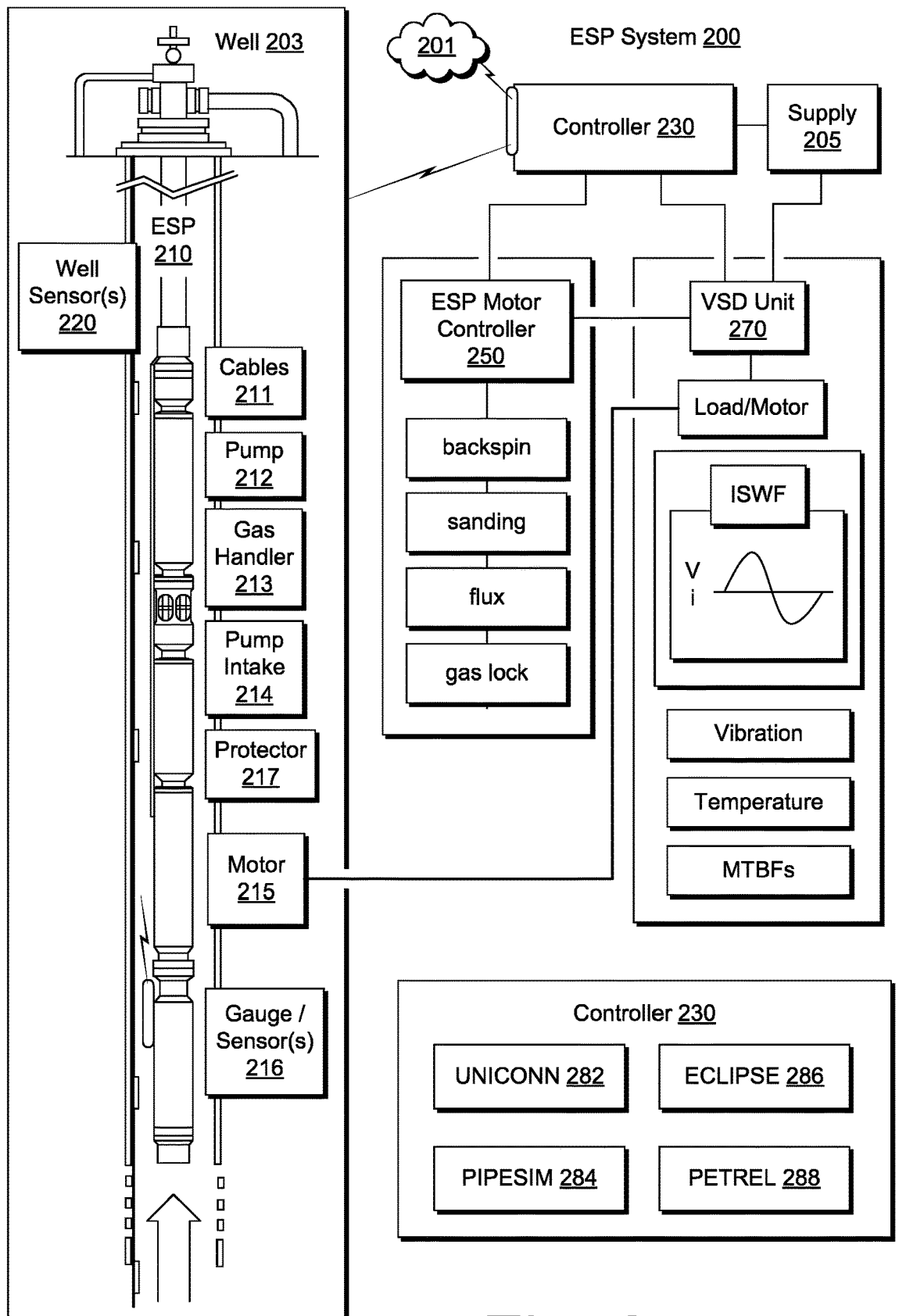
FIG. 2 illustrates an example of an electric submersible pump system.

FIG. 2 shows an example of an ESP system 200 that includes an ESP 210 as an example of equipment that may be placed in a geologic environment. As an example, an ESP may be expected to function in an environment over an extended period of time (e.g., optionally of the order of years). As an example, commercially available ESPs (such as the REDA™ ESPs marketed by Schlumberger Limited, Houston, Tex.) may find use in applications that call for, for example, pump rates in excess of about 4,000 barrels per day and lift of about 12,000 feet or more.

In the example of FIG. 2, the ESP system 200 includes a network 201, a well 203 disposed in a geologic environment (e.g., with surface equipment, etc.), a power supply 205, the ESP 210, a controller 230, a motor controller 250 and a VSD unit 270. The power supply 205 may receive power from a power grid, an onsite generator (e.g., natural gas driven turbine), or other source. The power supply 205 may supply a voltage, for example, of about 4.16 kV.

As shown, the well 203 includes a wellhead that can include a choke (e.g., a choke valve). For example, the well 203 can include a choke valve to control various operations such as to reduce pressure of a fluid from high pressure in a closed wellbore to atmospheric pressure. Adjustable choke valves can include valves constructed to resist wear due to high-velocity, solids-laden fluid flowing by restricting or sealing elements. A wellhead may include one or more sensors such as a temperature sensor, a pressure sensor, a solids sensor, etc.

As to the ESP 210, it is shown as including cables 211 (e.g., or a cable), a pump 212, gas handling features 213, a pump intake 214, a motor 215, one or more sensors 216 (e.g., temperature, pressure, strain, current leakage, vibration, etc.) and optionally a protector 217.

As an example, an ESP may include a REDA™ HOTLINE™ high-temperature ESP motor. Such a motor may be suitable for implementation in a thermal recovery heavy oil production system, such as, for example, SAGD system or other steam-flooding system.

As an example, an ESP motor can include a three-phase squirrel cage with two-pole induction. As an example, an ESP motor may include steel stator laminations that can help focus magnetic forces on rotors, for example, to help reduce energy loss. As an example, stator windings can include copper and insulation.

In the example of FIG. 2, the well 203 may include one or more well sensors 220, for example, such as the commercially available OPTICLINE™ sensors or WELL-WATCHER BRITEBLUE™ sensors marketed by Schlumberger Limited (Houston, Tex.). Such sensors are fiber-optic based and can provide for real time sensing of temperature, for example, in SAGD or other operations. As shown in the example of FIG. 1, a well can include a relatively horizontal portion. Such a portion may collect heated heavy oil responsive to steam injection. Measurements of temperature along the length of the well can provide for feedback, for example, to understand conditions downhole of an ESP. Well sensors may extend thousands of feet into a well (e.g., 4,000 feet or more) and beyond a position of an ESP.

In the example of FIG. 2, the controller 230 can include one or more interfaces, for example, for receipt, transmission or receipt and transmission of information with the motor controller 250, a VSD unit 270, the power supply 205 (e.g., a gas fueled turbine generator, a power company, etc.), the network 201, equipment in the well 203, equipment in another well, etc.

As shown in FIG. 2, the controller 230 may include or provide access to one or more modules or frameworks. Further, the controller 230 may include features of an ESP motor controller and optionally supplant the ESP motor controller 250. For example, the controller 230 may include the UNICONN™ motor controller 282 marketed by Schlumberger Limited (Houston, Tex.). In the example of FIG. 2, the controller 230 may access one or more of the PIPESIM™ framework 284, the ECLIPSE™ framework 286 marketed by Schlumberger Limited (Houston, Tex.) and the PETREL™ framework 288 marketed by Schlumberger Limited (Houston, Tex.) (e.g., and optionally the OCEAN™ framework marketed by Schlumberger Limited (Houston, Tex.)).

In the example of FIG. 2, the motor controller 250 may be a commercially available motor controller such as the UNICONN™ motor controller. The UNICONN™ motor controller can connect to a SCADA system, the ESP-WATCHER™ surveillance system, etc. The UNICONN™ motor controller can perform some control and data acquisition tasks for ESPs, surface pumps or other monitored wells. The UNICONN™ motor controller can interface with the PHOENIX™ monitoring system, for example, to access pressure, temperature and vibration data and various protection parameters as well as to provide direct current power to downhole sensors (e.g., sensors of a gauge, etc.). The UNICONN™ motor controller can interface with fixed speed drive (FSD) controllers or a VSD unit, for example, such as the VSD unit 270.

For FSD controllers, the UNICONN™ motor controller can monitor ESP system three-phase currents, three-phase surface voltage, supply voltage and frequency, ESP spinning frequency and leg ground, power factor and motor load.

For VSD units, the UNICONN™ motor controller can monitor VSD output current, ESP running current, VSD output voltage, supply voltage, VSD input and VSD output power, VSD output frequency, drive loading, motor load, three-phase ESP running current, three-phase VSD input or output voltage, ESP spinning frequency, and leg-ground.

In the example of FIG. 2, the ESP motor controller 250 includes various modules to handle, for example, backspin of an ESP, sanding of an ESP, flux of an ESP and gas lock of an ESP. The motor controller 250 may include any of a variety of features, additionally, alternatively, etc.

In the example of FIG. 2, the VSD unit 270 may be a low voltage drive (LVD) unit, a medium voltage drive (MVD) unit or other type of unit (e.g., a high voltage drive, which may provide a voltage in excess of about 4.16 kV). As an example, the VSD unit 270 may receive power with a voltage of about 4.16 kV and control a motor as a load with a voltage from about 0 V to about 4.16 kV. The VSD unit 270 may include commercially available control circuitry such as the SPEEDSTAR™ MVD control circuitry marketed by Schlumberger Limited (Houston, Tex.).

Figure 3:
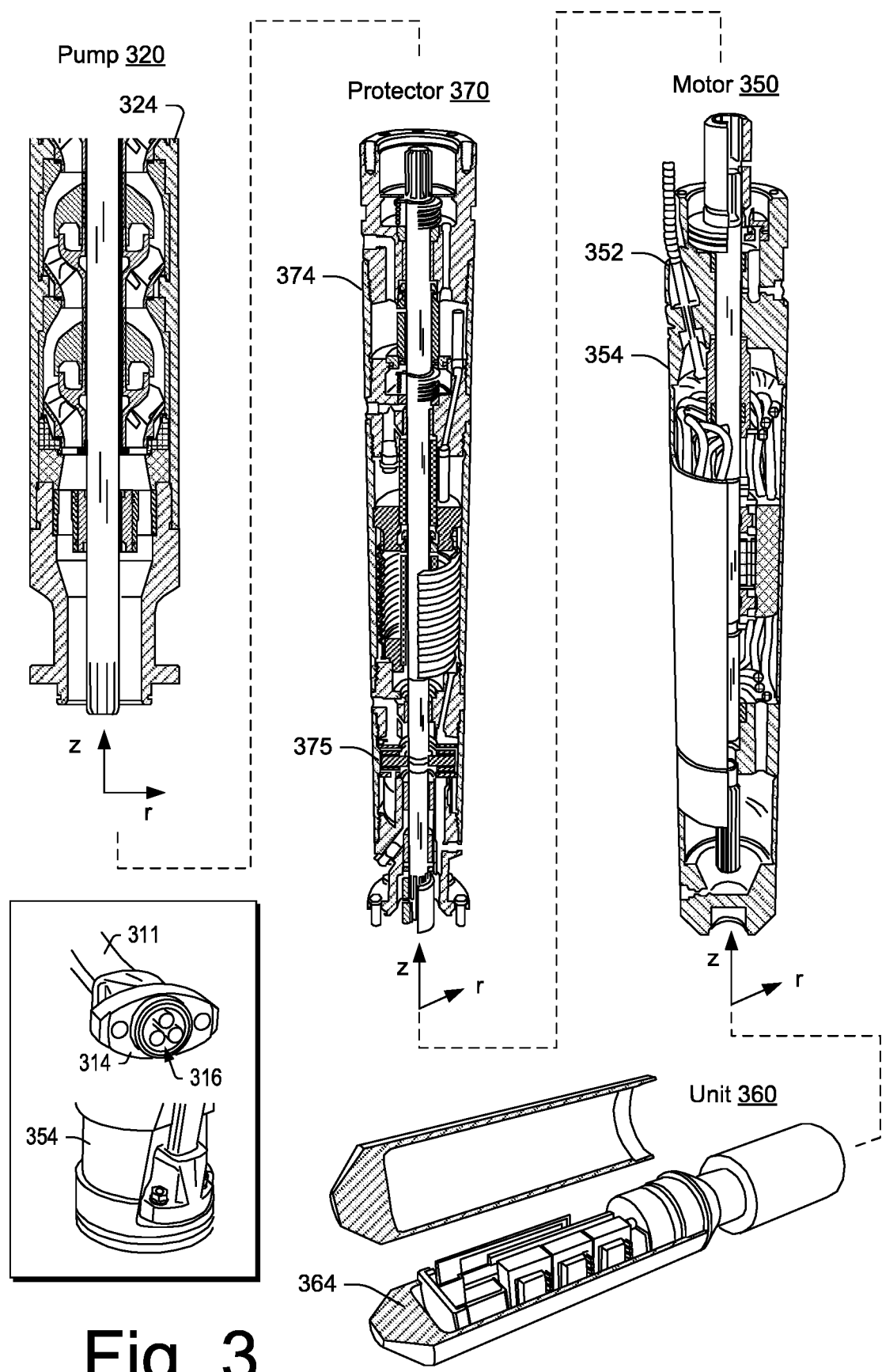
FIG. 3 illustrates examples of equipment.

FIG. 3 shows cut-away views of examples of equipment such as, for example, a portion of a pump 320, a protector 370, a motor 350 of an ESP and a sensor unit 360. The pump 320, the protector 370, the motor 350 and the sensor unit 360 are shown with respect to cylindrical coordinate systems (e.g., r, z, Θ). Various features of equipment may be described, defined, etc. with respect to a cylindrical coordinate system. As an example, a lower end of the pump 320 may be coupled to an upper end of the protector 370, a lower end of the protector 370 may be coupled to an upper end of the motor 350 and a lower end of the motor 350 may be coupled to an upper end of the sensor unit 360 (e.g., via a bridge or other suitable coupling).

As shown in FIG. 3, the pump 320 can include a housing 324, the motor 350 can include a housing 354, the sensor unit 360 can include a housing 364 and the protector 370 can include a housing 374 where such housings may define interior spaces for equipment. As an example, a housing may have a maximum diameter of up to about 30 cm and a shaft may have a minimum diameter of about 2 cm. As an example, a sensor can include a sensor aperture that is disposed within an interior space of a housing where, for example, an aperture may be in a range of about 1 mm to about 20 mm. In some examples, the size of an aperture may be taken into account, particularly with respect to the size of a shaft (e.g., diameter or circumference of a shaft). As an example, given dynamics that may be experienced during operation of equipment (e.g., a pump, a motor, a protector, etc.), error compensation may be performed that accounts for curvature of a shaft or, for example, curvature of a rotating component connected to the shaft.

As an example, an annular space can exist between a housing and a bore, which may be an open bore (e.g., earthen bore, cemented bore, etc.) or a completed bore (e.g., a cased bore). In such an example, where a sensor is disposed in an interior space of a housing, the sensor may not add to the overall transverse cross-sectional area of the housing. In such an example, risk of damage to a sensor may be reduced while tripping in, moving, tripping out, etc., equipment in a bore.

As an example, a protector can include a housing with an outer diameter up to about 30 cm. As an example, consider a REDA MAXIMUS™ protector (Schlumberger Limited, Houston, Tex.), which may be a series 387 with a 3.87 inch housing outer diameter (e.g., about 10 cm) or a series 562 with a 5.62 inch housing outer diameter (e.g., about 14 cm) or another series of protector. As an example, a REDA MAXIMUS™ series 540 protector can include a housing outer diameter of about 13 cm and a shaft diameter of about 3 cm and a REDA MAXIMUS™ series 400 protector can include a housing outer diameter of about 10 cm and a shaft diameter of about 2 cm. In such examples, a shaft to inner housing clearance may be an annulus with a radial dimension of about 5 cm and about 4 cm, respectively. Where a sensor and/or circuitry operatively coupled to a sensor are to be disposed in an interior space of a housing, space may be limited radially; noting that axial space can depend on one or more factors (e.g., components within a housing, etc.). For example, a protector can include one or more dielectric oil chambers and, for example, one or more bellows, bags, labyrinths, etc. In the example of FIG. 3, the protector 370 is shown as including a thrust bearing 375 (e.g., including a thrust runner, thrust pads, etc.).

As to a motor, consider, for example, a REDA MAXIMUS™ PRO MOTOR™ electric motor (Schlumberger Limited, Houston, Tex.), which may be a 387/456 series with a housing outer diameter of about 12 cm or a 540/562 series with a housing outer diameter of about 14 cm. As an example, consider a carbon steel housing, a high-nickel alloy housing, etc. As an example, consider an operating frequency of about 30 to about 90 Hz. As an example, consider a maximum windings operating temperature of about 200 degrees C. As an example, consider head and base radial bearings that are self-lubricating and polymer lined. As an example, consider a pot head that includes a cable connector for electrically connecting a power cable to a motor.

As shown in FIG. 3, a shaft segment of the pump 320 may be coupled via a connector to a shaft segment of the protector 370 and the shaft segment of the protector 370 may be coupled via a connector to a shaft segment of the motor 350. As an example, an ESP may be oriented in a desired direction, which may be vertical, horizontal or other angle (e.g., as may be defined with respect to gravity, etc.). Orientation of an ESP with respect to gravity may be considered as a factor, for example, to determine ESP features, operation, etc.

As shown in FIG. 3, the motor 350 is an electric motor that includes a cable connector 352, for example, to operatively couple the electric motor to a multiphase power cable, for example, optionally via one or more motor lead extensions. Power supplied to the motor 350 via the cable connector 352 may be further supplied to the sensor unit 360, for example, via a wye point of the motor 350 (e.g., a wye point of a multiphase motor).

As an example, a connector may include features to connect one or more transmission lines dedicated to a monitoring system. For example, the cable connector 352 may optionally include a socket, a pin, etc., that can couple to a transmission line dedicated to the sensor unit 360. As an example, the sensor unit 360 can include a connector that can connect the sensor unit 360 to a dedicated transmission line or lines, for example, directly and/or indirectly.

As an example, the motor 350 may include a transmission line jumper that extends from the cable connector 352 to a connector that can couple to the sensor unit 360. Such a transmission line jumper may be, for example, one or more conductors, twisted conductors, an optical fiber, optical fibers, a waveguide, waveguides, etc. As an example, the motor 350 may include a high-temperature optical material that can transmit information. In such an example, the optical material may couple to one or more optical transmission lines and/or to one or more electrical-to-optical and/or optical-to-electrical signal converters.

FIG. 3 shows an example of a cable 311 that includes a connector 314 and conductors 316, which may be utilized to deliver multiphase power to an electric motor and/or to communicate signals and/or to delivery DC power (e.g., to power circuitry operatively coupled to a wye point of an electric motor, one or more sensors, etc.). As an example, the cable connector 352 may be part of a pot head portion of a housing 354. As an example, the cable 311 may be flat or round. As an example, a system may utilized one or more motor lead extensions (MLEs) that connect to one or more cable connectors of an electric motor. As an example, the sensor unit 360 can include transmission circuitry that can transmit information via a wye point of the motor 350 and via the cable connection 352 to the cable 311 where such information may be received at a surface unit, etc. (e.g., consider a choke, etc. that can extract information from one or more multiphase power conductors, etc.).

Figure 4:
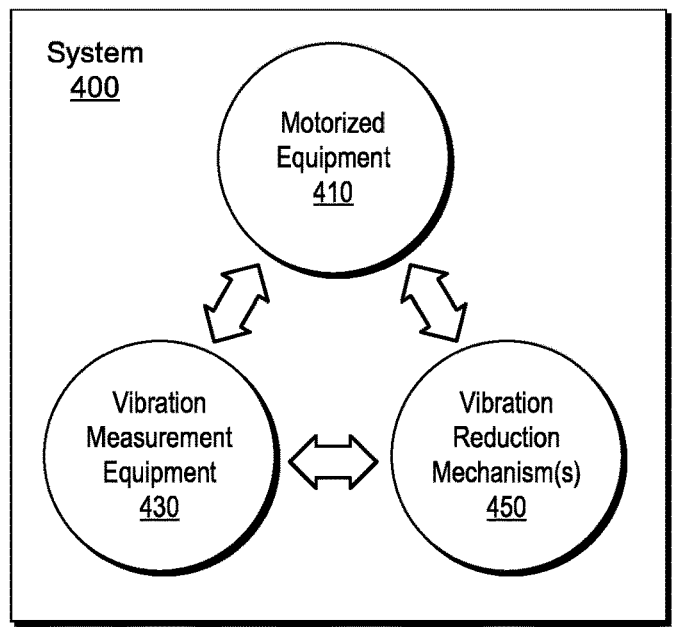
FIG. 4 illustrates an example of a system and examples of methods.
Figure 4:
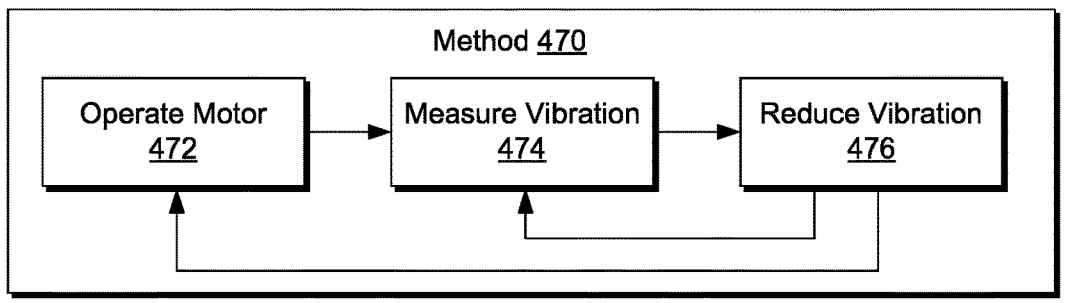
Figure 4:
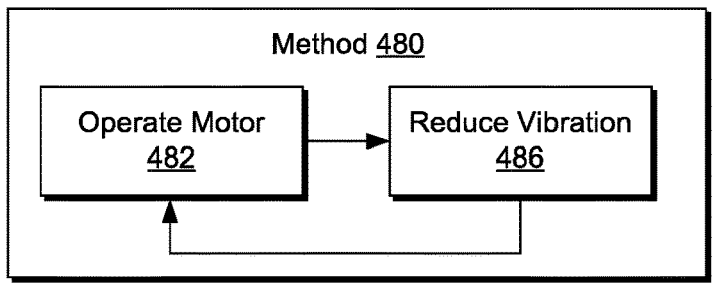
Figure 4:
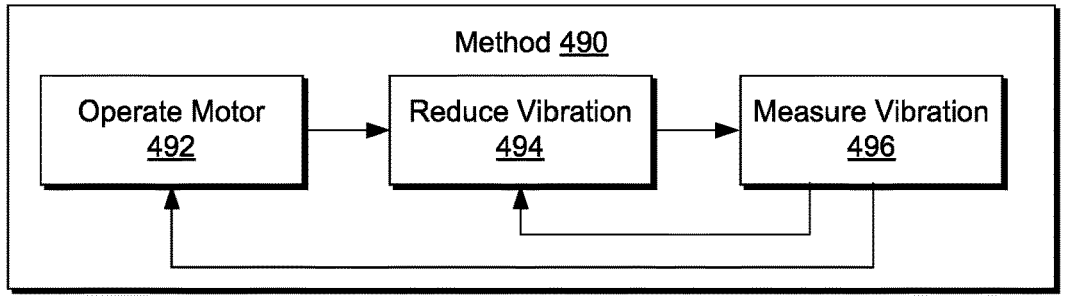

FIG. 4 shows an example of a system 400 and examples of methods 470, 480 and 490. As shown, the system 400 includes motorized equipment 410, vibration measurement equipment 430 and one or more vibration reduction mechanisms 450. As an example, the vibration measurement equipment 430 may be optional as, for example, one or more of the one or more vibration reduction mechanisms 450 may be self-adjusting (e.g., responsive to vibration to reduce vibration).

As shown, the method 470 includes an operation block 472 for operating a motor (e.g., of motorized equipment), a measurement block 474 for measuring vibration and a reduction block 476 for reducing vibration; the method 480 includes an operation block 482 for operating a motor (e.g., of motorized equipment) and a reduction block 486 for reducing vibration; and the method 490 includes an operation block 492 for operating a motor (e.g., of motorized equipment), a reduction block 494 for reducing vibration and a measurement block 496 for measuring vibration. As shown in the examples of FIG. 4, one or more control loops may exist within a method. For example, a loop may exist between operation of motorized equipment and reduction of vibration, a loop may exist between measurement of vibration and reduction of vibration, a loop may exist between reduction of vibration and measurement of vibration, a loop may exist between operation of motorized equipment and measurement of vibration, etc.

As an example, motorized equipment may include an electric motor operatively coupled to a shaft where operation of the electric motor rotates the shaft or, for example, reciprocates the shaft. As an example, an electric submersible pump (ESP) may be constructed to pump fluid via rotation of a shaft or may be constructed to pump fluid via reciprocation of a shaft (e.g., consider a plunger operatively coupled to a valve, etc.).

Vibration during operation of motorized equipment may lead to wear, degraded performance, etc. As an example, excessive vibration may lead to fatigue and possibly breakage of one or more components of motorized equipment (e.g., premature failure).

One type of vibration is shaft vibration such vibration can occur during rotation or reciprocation of the shaft as directly or indirectly coupled to an electric motor. Shaft vibration may lead to fatigue and breakage of a shaft or, for a multi-piece shaft, one or more pieces or connectors of the shaft. Vibration may also affect condition of one or more support bearings, which may lead to excessive wear and failure of a support bearing. Various components may perform at reduced capabilities while operating under vibration. For example, a shaft seal may experience leakage (e.g., an increased level of leakage). As another example, a thrust bearing may experience an increase in temperature, a reduction in load capacity, etc.

As an example, motorized equipment may include one or more sensors that can measure vibration (e.g., sense vibration). For example, an ESP may be fit with a sensor that can measure vibration in real-time. As an example, vibration information may be detectable via electronics associated with supply of power to an electric motor. For example, vibration of a rotor within a stator of an electric motor may be sensed via a change in load, energy demand, etc. (e.g., consider that vibration can "waste" energy and thus be modeled as an energy sink or energy leak).

As an example, a vibration reduction mechanism may affect a vibration regime in real-time and, for example, reduce vibration magnitude, alter vibration frequency, etc. As an example, a mechanism may compensate for vibration caused by unbalance, loading, bending, etc. of a body and/or a shaft. For example, consider an ESP housing as a body where the shaft passes through at least a portion of the ESP housing. In such an example, vibrations of a housing may effect a shaft and/or vibrations of a shaft may effect a housing. Further, a housing may vibration within a bore, which may be, for example, a cased bore (e.g., a bore fit with one or more casings).

As an example, a mechanism may operate in conjunction with vibration measurement equipment and adjust in real-time, for example, to achieve lower operational vibration. As an example, a mechanism may act to alter operational vibration in type, character, etc. such that vibration that exists is less detrimental to equipment, performance, etc.

As an example, a mechanism may be an internal mechanism attached to a shaft (e.g., a rotary shaft, a reciprocating shaft, etc.). As an example, a mechanism may be an internal mechanism attached to a housing (e.g., that houses at least a portion of a shaft, etc.). As an example, a mechanism may be an external mechanism attached to a housing of motorized equipment or optionally other equipment that may experience undesirable vibration.

Vibration may be defined as a mechanical phenomenon whereby one or more mechanical components move, for example, as oscillations (e.g., oscillating movement). As an example, oscillations may occur about an equilibrium point. As an example, oscillations may be periodic or they may be random.

Vibration may be undesirable, desirable or neutral. For example, a type of vibration may aid with clearing debris from a fluid inlet (e.g., a screen, openings, etc.) and thus be considered desirable. Whereas, as mentioned, other types of vibration may be undesirable and shorten lifetime of equipment, compromise performance of equipment, etc. Yet other types of vibration may be considered to be neutral, for example, of a nature that do not particularly detriment or that do not particularly benefit longevity and/or operation of equipment.

As an example, vibration can generate noise (e.g., sound). In such an example, sound, or pressure waves, may be generated by one or more vibrating structures, which may induce vibration of one or more other structures. As an example, one or more mechanisms may operate in response to pressure waves. As an example, one or more sensors may measure vibration via pressure waves.

As an example, vibration may be modeled using one or more types of models. As an example, consider a mass-spring-damper model. As an example, a system may be modeled via a plurality of individual mass-spring-damper models. As an example, a mass-spring-damper model may represent a harmonic oscillator where, for example, equations such as those for an RLC circuit may be implemented.

As an example, a mechanism may be a damping mechanism. As an example, a mechanism may be an alteration mechanism. As an example, a mechanism may be both a damping mechanism and an alteration mechanism. To understand damping and alteration mechanisms, consider a vibrating guitar string where placing a flat hand over the string quickly damps its motion; whereas, placing a finger over a fret acts to change the length of the string and hence its frequency of motion. Without intervention, a vibrating guitar string will eventually stop moving due to frictional damping, for example, viscous damping due to air (e.g., metal strings), internal damping (e.g., nylon strings), etc. A vibration that is damped may be characterized, for example, via a decay rate. A decay rate may provide information as to one or more types of damping mechanism, types of materials undergoing vibration, etc. As an example, an alteration mechanism may act to damp a particular vibration and, in such an example, be considered to be a damping mechanism.

As an example, one or more mechanisms may be dynamic in their response to vibration. For example, a mechanism may respond to vibration to damp and/or alter the vibration (e.g., directly and/or indirectly).

As an example, a mechanism that can dynamically modify vibration of motorized equipment may be operatively coupled to control logic of the motorized equipment. For example, a mechanism may be operatively coupled to a motor controller for an ESP. In such an example, the controller may receive one or more vibration measurements form sensors (e.g., internal, external, etc.) and, in turn, trigger one or more adjustments to a vibration-reduction mechanism (e.g., damping, alteration, damping and alteration, etc.). As an example, a closed loop may be formed to achieve real-time vibration reduction.

As an example, a system may include multiple vibration-reduction mechanisms of one or more types, for example, located at one or more axial locations of an ESP. As mentioned, a mechanism may be internal to an ESP and attached to a rotational shaft assembly (e.g., or a reciprocating shaft assembly), internal to an ESP and attached to a housing (e.g., a non-motor driven component such as a component intended to be "stationary"), or external to an ESP and attached to an ESP housing. As an example, a system may include a combination of mechanisms of one or more types.

Figure 5:
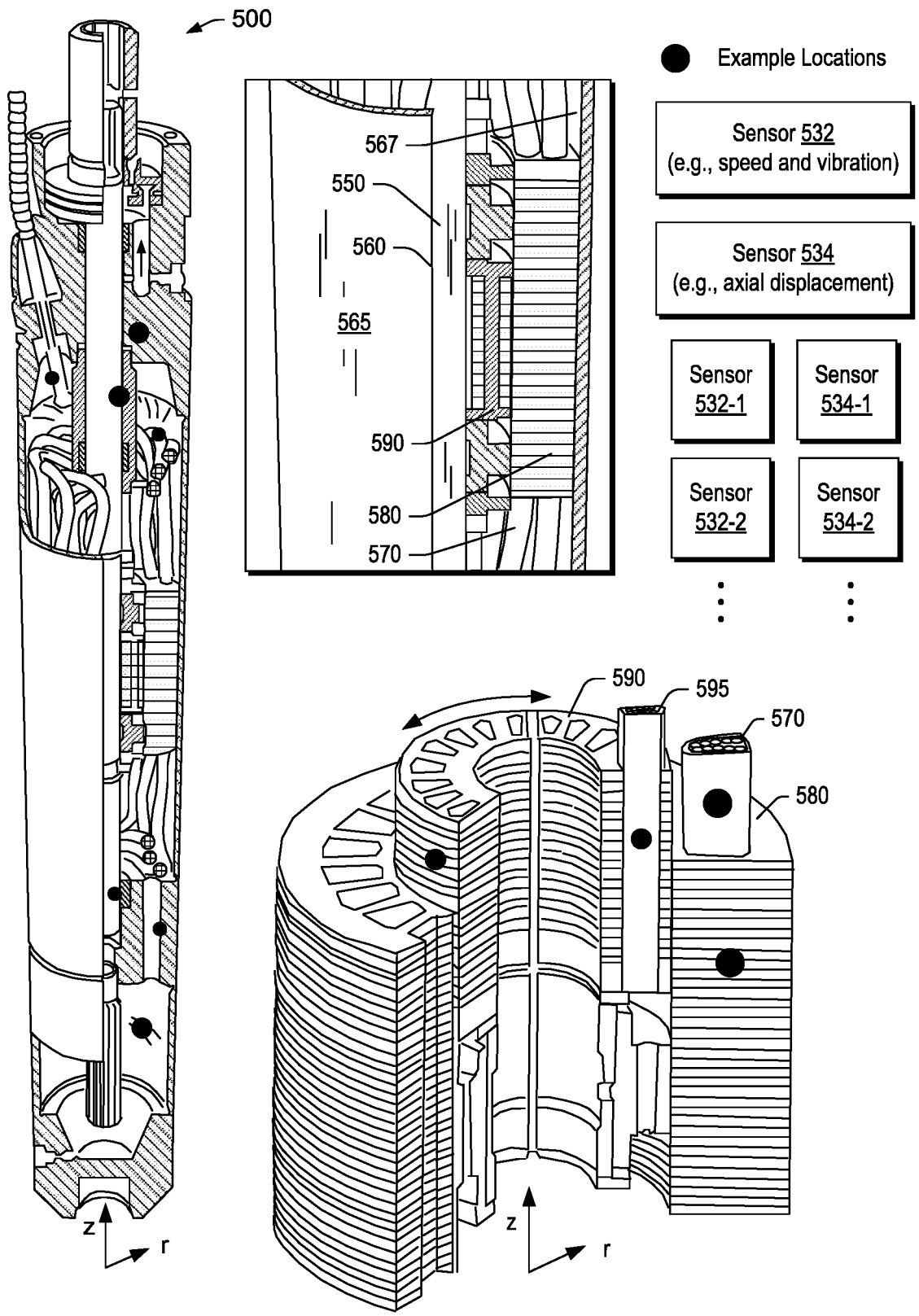
FIG. 5 illustrates an example of a system that includes one or more sensors.

FIG. 5 shows an example of an electric motor assembly 500 that includes a shaft 550, a housing 560 with an outer surface 565 and an inner surface 567, stator windings 570, stator laminations 580, rotor laminations 590 and rotor windings 595. As shown, the rotor laminations 590 are operatively coupled to the shaft 550 such that rotation of the rotor laminations 590, with the rotor windings 595 therein, can rotate the shaft 550. As mentioned, a shaft may be reciprocating, for example, where a shaft includes one or more magnets (e.g., permanent magnets) that respond to current that passes through stator windings. As an example, the housing 560 may define a cavity via its inner surface 567 where the cavity may be hermetically sealed. As an example, such a cavity may be filled at least partially with dielectric oil. As an example, dielectric oil may be formulated to have a desired viscosity and/or viscoelastic properties, etc.

FIG. 5 also shows examples of sensors 532 and 534, where a system may include one or more of the sensors 532 and/or one or more of the sensors 534 (e.g., and/or optionally one or more other types of sensors). In FIG. 5, filled circles represent some example sensor locations.

As an example, a sensor may be integrated into one or more of the stator windings 570 and/or into one or more of the stator laminations 580. As an example, a sensor may be integrated into one or more of the rotor windings 595 and/or into one or more of the rotor laminations 590.

As an example, one or more sensors may be disposed within a space defined by the housing 560 of the electric motor assembly 500. As an example, a sensor may be an accelerometer (e.g., a single or multi-axis accelerometer) that can sense movement. As an example, the housing 560 of the electric motor assembly 500 may be at least partially filled with a fluid (e.g., dielectric fluid, etc.) where a sensor may sense pressure waves that pass through the fluid. In such an example, pressure waves may be sensed that are due to vibration, which may be undesirable vibration. As an example, circuitry may filter pressure waves associated with rotational operation of an electric motor from pressure waves associated with vibration of one or more components of the electric motor (e.g., a housing, a shaft, etc.). As an example, a sensor may include one or more piezo-elements that respond to stress and/or strain. As an example, a sensor may detect movement of one component with respect to another component.

As shown in FIG. 5, the sensor 532 may include circuitry for speed and/or vibration sensing and the sensor 534 may include circuitry for axial displacement sensing. As an example, sensors may include one or more of an impeller vane sensor configured for vane pass speed and/or vane wear sensing, a hydraulic seal sensor configured for leakage and/or wear sensing, a diffuser sensor configured for separation sensing, a bellows sensor configured for expansion and/or contraction sensing, a shaft seal sensor configured for separation, wear and/or skipping sensing and/or a thrust bearing sensor configured for lift sensing. As an example, one or more sensors may be part of equipment such as equipment that can be deployed in a downhole environment. As an example, one or more sensors may be a proximity sensor.

Figure 6:
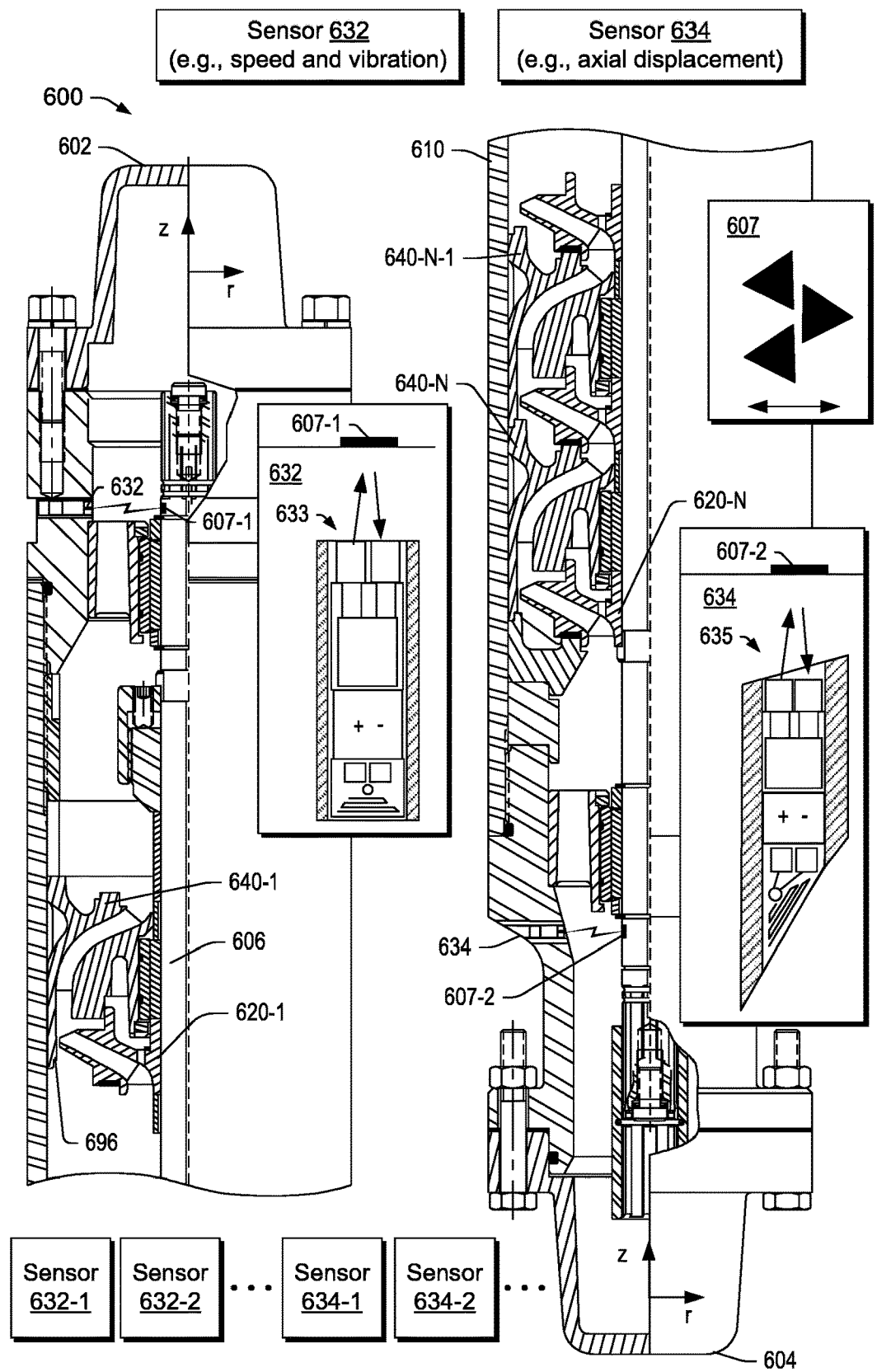
FIG. 6 illustrates an example of a mechanism.

FIG. 6 shows cutaway views of a system 600 that includes at least one of the sensor 632 and/or at least one of the sensor 634. As shown the system 600 includes an end cap 602 and an end cap 604 that are fit to ends of a housing 610 that houses various components of a pump such as a shaft 606, impellers 620-1 to 620-N and diffusers 640-1 to 640-N. The end caps 602 and 604 may be employed to protect the system 600, for example, during storage, transport, etc.

In the example of FIG. 6, rotation of the shaft 606 (e.g., about a z-axis) can rotate the impellers 620-1 to 620-N to move fluid upwardly where such fluid is guided by the diffusers 640-1 to 640-N. As an example, a pump stage may be defined as an impeller and a diffuser, for example, the impeller 620-1 and the diffuser 640-1 may form a pump stage. In the example of FIG. 6, flow in each stage may be characterized as being mixed in that flow is both radially and axially directed by each of the impellers 620-1 to 620-N and each of the diffusers 640-1 to 640-N (see, e.g., the r, z coordinate system).

As an example, the sensor 632 may be mounted in an opening of the housing 610 and include an end directed toward the shaft 606. As shown, the sensor 632 includes circuitry 633 such as, for example, emitter/detector circuitry, power circuitry and communication circuitry. As an example, power circuitry may include power reception circuitry, a battery or batteries, power generation circuitry (e.g., via shaft movement, fluid movement, etc.), etc. As an example, communication circuitry may include an antenna or antennas, wires, etc. As an example, communication circuitry may be configured to communication information (e.g., receive and/or transmit) via wire (e.g., conductor or conductors) or wirelessly.

As an example, the shaft 606 may include a marker 607-1 that can reflect energy emitted by an emitter of the sensor 632 where such reflected energy may be detected by a detector of the sensor 632. For example, an emitter may be an electromagnetic energy emitter that can emit energy at one or more wavelengths (e.g., IR, VIS, UV, etc.). As an example, an emitter may be an LED, a laser or other emitter. As an example, a detector may be an electromagnetic energy detector that can detect energy at one or more wavelengths (e.g., IR, VIS, UV, etc.). As an example, the shaft 606 may be fit with a reflector strip as the marker 607-1 such that rotation of the shaft 506 may allow the sensor 632 to sense rotation of the shaft 606 by passage of the reflector strip in front of an emitter/detector of the shaft sensor 612. For example, where the shaft 606 of the system 600 (e.g., without the end caps 602 and 604) is operatively coupled to a motor, rotational speed of the shaft 606 may be sensed via the sensor 632, deviations indicative of vibrations of the shaft 606 may be sensed via the sensor 632, etc.

As an example, the circuitry 633 of the sensor 632 may include vibration sensing circuitry. For example, the circuitry 633 may include a detector array that can sense spatial deviations in reflected energy over time while the shaft 606 is rotating. Such a detector array may be a linear array or a matrix array and may interact with one or more markers 607-2 of the shaft 606. As an example, in absence of vibration, reflected energy may be detected as having a peak with respect to one or more detector elements of the array; whereas, in presence of vibration, reflected energy may be detected as having a peak or peaks that move with respect to the detector elements. In such an example, greater movement of peak reflected energy with respect to time may indicate larger amplitude vibrations. Further, a frequency analysis of detected energy with respect to time with respect to one or more detector elements may indicate one or more vibration frequencies.

As to control, where shaft vibration is detected at a particular rotational speed of the shaft 606, power to a motor operatively coupled to the shaft 606 may be adjusted to alter the rotational speed, for example, in an effort to reduce the shaft vibration. In such an example, the sensor 632 may be part of a feedback control loop. In such an example, vibration reduction may improve pump performance, pump longevity, etc.

As an example, one or more mechanisms may act to reduce or damp vibrations of a shaft during operation, as driven by an electric motor. Such one or more mechanisms may operate independent of sensed information (e.g., vibration measurement) and/or may operate based at least in part on sensed information (e.g., vibration measurement and optionally other information, etc.).

As to the sensor 634, it can include circuitry 635 such as, for example, emitter/detector circuitry, power circuitry and communication circuitry. As an example, the shaft 606 may include a marker that can be tracked by the shaft sensor 634 to sense axial movement of the shaft 606 (e.g., along the z-axis). Such information may be germane to positions of one or more of the impellers 620-1 to 620-N with respect to positions of one or more of the diffusers 640-1 to 640-N.

As an example, where a shaft is supported by one or more bearings, walking, shifting, etc. of the shaft with respect to the one or more bearings may be related to rotational speed, load, etc. For example, a shaft may "walk up" (e.g., ride up, ride down, etc.) with respect to a bearing in a manner dependent on shaft rotational speed. As an example, a shaft may seat in a bearing in a manner that depends on one or more operational conditions (e.g., shaft rotational speed, fluid properties, load, etc.). In such an example, a shaft may change in its radial position, axial position or radial and axial position with respect to a bearing. As an example, a shaft displacement sensor may be configured to sense one or more of axial and radial position of a shaft. In such an example, where a change in shaft speed occurs, a change in axial and/or radial position of the shaft (e.g., optionally with respect to a bearing, etc.) may be used to determine axial and/or radial displacement of the shaft.

As to control, where shaft axial movement is detected at a particular rotational speed of the shaft 606, power to a motor operatively coupled to the shaft 606 may be adjusted to alter the rotational speed, for example, in an effort to reduce the axial shaft movement. In such an example, the sensor 634 may be part of a feedback control loop. In such an example, reduction of axial movement of the shaft 506 may improve pump performance, pump longevity, etc.

As shown in FIG. 6, the system 600 may include one or more sensors such as one or more of the sensors 632 (e.g., 632-1, 632-2, etc.) and/or one or more of the sensors 634 (e.g., 634-1, 634-2, etc.).

As an example, a marker or markers may be characterized by shape, orientation, material of construction, etc. As an example, consider the marker 607 which includes a plurality of marker elements arranged in a pattern that has a different profile for clockwise and counter-clockwise rotations. As an example, a marker may be constructed from a magnetic material, for example, to interact with a proximity sensor that can detect movement of a magnetic field, presence of a magnetic field, proximity of a magnetic field, etc. As an example, a magnet moving in space may induce a current in a detector of a sensor. In such an example, a sensor may act as a detector without emitting energy. As an example, where a fluid may carry ferromagnetic particles, a magnetic marker may be configured with a relatively weak magnetic field, for example, where gravity, force of fluid flow, etc. may overcome magnetic attraction between such particles and the magnetic marker such that the particles do not collect on the magnetic marker.

As an example, a sensor may emit energy that is affected by presence of a marker, proximity of a marker, movement of a marker, etc. As an example, a marker may be made of or include a conductive material, a non-conductive material or a combination of conductive and non-conductive material.

As an example, a marker may be part of a shaft or other rotating component where the mass of the marker is negligible, where markers are positioned to balance the shaft or component, etc. For example, consider a shaft with three markers positioned at 120 degree intervals, which may act to balance a shaft where the markers are approximate equal in mass.

As an example, a proximity sensor may be configured to detect presence of an object without direct contact with the object (e.g., a non-contact sensor). In such an example, an object may be a component, a marker or other object. As an example, a proximity sensor may detect a clearance (e.g., a gap) between objects or, for example, adjacent to an object. As an example, a sensor may employ a contact mechanism to determine proximity or, for example, lack thereof, with respect to an object. For example, consider a strain gauge that can measure strain with respect to two components where the strain depends on proximity of one of the components with respect to the other one of the components.

As another example, an electrical contact strip may break where proximity is lost. For example, an electrical contact strip may be mounted to two components with or without slack such that loss of proximity (e.g., gap formation, etc.) between the components causes the electrical contact strip to break (e.g., where the gap exceeds strain tolerated by the strip, slack of the strip, etc.). As an example, a series of electrical contact strips may be employed, optionally with different values of resistance (e.g., ohms). In such an example, a current that passes through the strips may change as one or more of the strips breaks (e.g., consider resistors in parallel). For example, a circuit may be formed using electrical contact strips of different lengths and resistances (e.g., resistance per unit length, etc.) where the circuit is coupled to or across two components. In such an example, as the two components move away from each other individual strips may break successively to alter resistance in the circuit where one or more measurements using the circuit may infer or determine how large of a gap exists between the two components.

Figure 7:
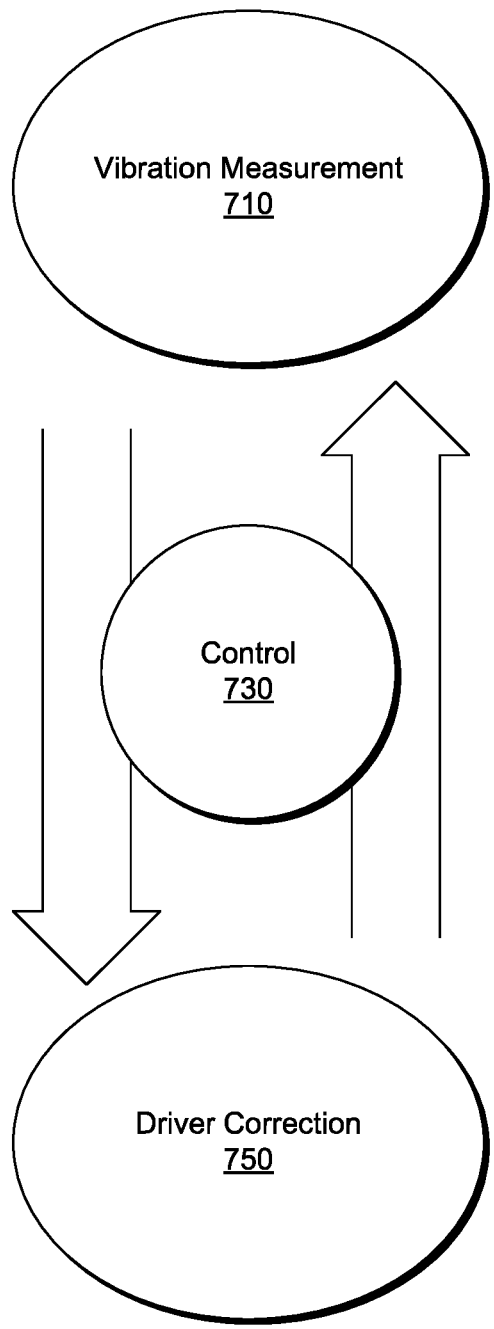
FIG. 7 illustrates an example of a mechanism.

FIG. 7 shows an example of a method 700 that includes a vibration measurement block 710, a control block 730 and a driver correction block 750. As an example, the method 700 may be implemented to achieve at least some amount of active vibration control (e.g., damping of vibration of one or more ESP components).

As an example, the driver correction block 750 may act to adjust a driver of one or more electric motors of an ESP and/or may act to adjust one or more actively driven elements that can damp or otherwise alter vibration of one or more components of an ESP. For example, the driver correction block 750 may provide output to the controller 230, the ESP motor controller 250 and/or the VSD unit 270 of the ESP system 200 of FIG. 2 and/or the driver correction block 750 may provide output to one or more mechanisms. As an example, a mechanism may include one or more active drivers. As an example, an active driver may be driven electrically, hydraulically, pneumatically, piezo-electrically, etc. As an example, a driver may be driven fluidically, for example, via fluid pumped by an ESP. As an example, a driver may be driven electrically, for example, via a power cable that supplies power to an electric motor of an ESP. As an example, a driver may be driven via power generated downhole, for example, via fluid flow, heat energy, electromagnetic energy (e.g., rotation of one or more magnets with respect to a coil or coils), etc.

As an example, the control block 730 may implement an adaptive control algorithm. For example, if vibration is periodic, the control block 730 may include analyzing signals from the vibration measurement block 710 as to the periodic vibration such that the driver correction block 750 can tailor output to one or more active elements to avoid, damp, etc., the periodic vibration.

As an example, a method can include acquiring vibration measurements from an ESP and transmitting measurement data to control logic (e.g., surface and/or downhole) for processing which may aim to process the measurement data to provide a signal that includes opposing vibration characteristics. In such an example, the method may include feeding the signal to drive circuitry that can drive an electric motor of an ESP, for example, to modify the power transmitted to an electric motor of an ESP. In such an example, the detected vibration (e.g., per the vibration measurements) may be "balanced" (e.g., counter-acted) by vibration generated via the fed signal. For example, a drive signal to an electric motor of an ESP may be summed with a signal that aims to reduce vibration that may be occurring for the drive signal by itself. Such an approach may result in reduced ESP vibration. As an example, a method may include implementing closed-loop control in real-time to reduce vibration of one or more components of an ESP.

As an example, a controller may process vibration measurements and decide whether adjustments are to be made to a motor controller and/or to one or more mechanism controllers that may, for example, control one or more elements (e.g., active elements). In such an example, the controller may receive further information as to movement (e.g., vibration) and determine whether the control strategy may be adjusted. For example, a controller may effectively damp vibration at an axial location of an electric motor of an ESP while vibration may still exist at an axial location of a stack of impellers/diffusers of the ESP. In such an example, one or more elements may be in place adjacent to a housing that houses the stack of impellers/diffuser and controllable to damp vibrations of the housing.

As an example, a method can include adjusting an ESP electric motor controller output (e.g., power input to the ESP electric motor) to affect a vibration signature of the electric motor. In such an example, the method can include gathering vibration data and processing at least a portion of such data to modify the ESP electric motor controller output in such a way that the electric motor generates vibration in a controlled, relatively opposite direction, which may act to effectively cancel out operational vibration (e.g., to reduce vibration). As an example, a vibration measurement and adjustment method may operate in a closed-loop manner and, for example, in real-time.

As an example, the method 700 of FIG. 7 may help to reduce risk of failure of one or more individual components, for example, based at least in part on identification of one or more associated "characteristic" vibrations and outputting signals that aim to reduce such one or more vibrations. As an example, the method 700 of FIG. 7 may be implemented to make an ESP more vibration tolerant, which may, for example, enhance ESP run life.

As mentioned, the method 700 of FIG. 7 may operate via control of power supplied to an electric motor of an ESP and/or via control of one or more mechanisms of an ESP. Once an ESP is positioned downhole, various noise factors may or may not be controllable. For example, consider as examples of factors that may affect vibration, shape of a bore (e.g., consider a dogleg, etc.) (e.g., cave-in, fracturing, etc.), an amount of particulate matter in pumped fluid (e.g., sand, etc.), and/or temperature, pressure, gas, etc.

An ESP system may operate in a more robust manner when it includes one or more mechanisms that can allow an ESP to tolerate or "deal" with vibrations. An ESP system may be configured to include components that may act to reduce vibration (e.g., self-centering bearings, etc.) and/or to include one or more mechanisms that act to reduce vibration.

Figure 8:
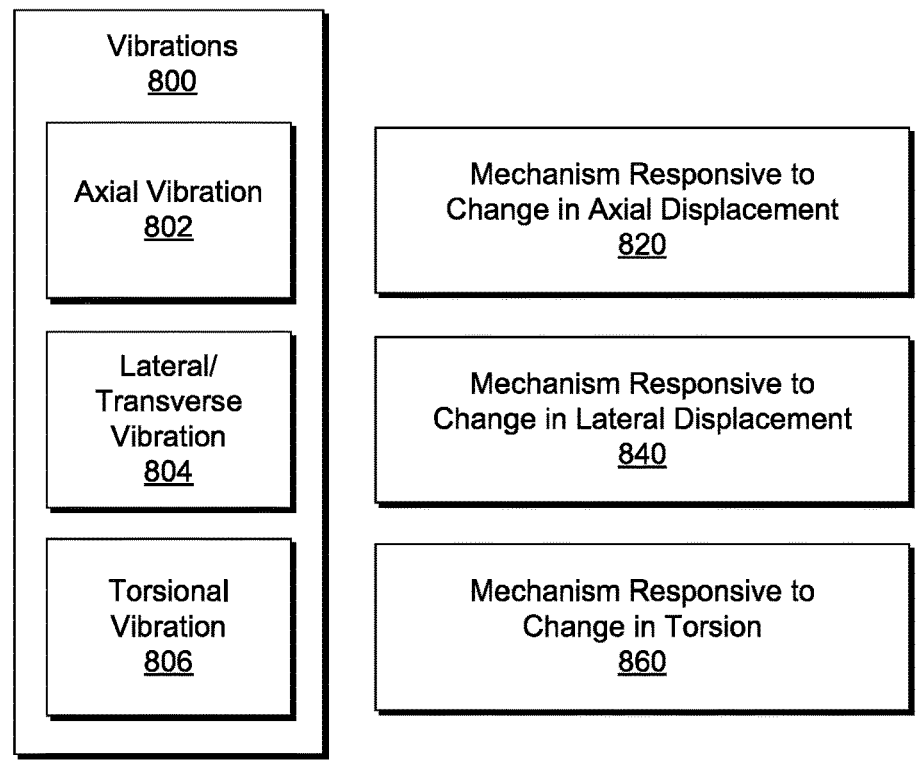
FIG. 8 illustrates examples of vibration information and examples of mechanisms.

FIG. 8 shows examples of various types of vibration 800, which include axial vibration 802, lateral or transverse vibration 806 and torsional vibration 806. As an example, a mechanism may respond to a type or types of vibration. For example, FIG. 8 shows a mechanism 820 that can respond to a change in axial displacement of a component or components (e.g., as associated with axial vibration), a mechanism 840 that can respond to a change in lateral displacement of a component or components (e.g., as associated with lateral vibration) and a mechanism 860 that can respond to a change in torsion of a component or components (e.g., as associated with torsional vibration). As an example, a mechanism may respond to a change in shaft speed of a shaft of an ESP, which may experience torsional vibration when undergoing the change in shaft speed. In such an example, a mechanism may adjust to damp torsional vibration, for example, automatically or in response to a control signal and/or a sensor signal (e.g., as may be associated with an increase in shaft speed).

FIG. 8 also shows a table 880 that includes vibration information from ISO 2732, 1974. The table 880 includes velocity information and displacement information as well as qualitative indicators as to vibration at about 3,600 rpm. As an example, an electric motor of an ESP may rotate a shaft at speeds of about tens of rpm to thousands of rpms (e.g., 3,600 rpm or more). As an example, an electric motor of a reciprocating submersible pump may reciprocate a shaft, for example, along a longitudinal axis of the shaft (e.g., from a few cycles per minute to a cycle per second or more). As an example, one or more mechanisms may be dimensioned with respect to a vibration type, vibration displacement, vibration velocity, vibration frequency, vibration acceleration, etc.

As an example, a diameter of a pump housing may be less than about 30 cm (e.g., about one foot). As an example, a diameter of an ESP housing may be less than about 15 cm (e.g., about 6 inches). As an example, a casing inner diameter may provide a clearance for an outer diameter of an ESP housing (e.g., a casing inner diameter larger than an outer diameter of an ESP housing). As an example, consider an ESP housing outer diameter of about 10 cm and a casing inner diameter of about 14 cm (e.g., or more). In such an example, a mechanism may be disposed at least in part between the outer diameter of the ESP housing and the inner diameter of the casing.

As an example, a housing of an ESP may be made of carbon steel, an alloy, etc. As an example, consider a housing made of a chrome alloy (e.g., 9 Cr:1 Mo). As an example, a shaft of an ESP may be a single piece shaft or a multiple piece shaft. As an example, a shaft may be made of a material such as MONEL™, INCONEL™ (e.g., INCONEL™ 718, etc.), etc. As an example, a shaft may be of a diameter of the order of centimeters. For example, consider a shaft with a diameter of about 2 cm (e.g., less than about an inch). As an example, a shaft may be rated with respect to power (e.g., HP of an electric motor). As mentioned, a shaft may include magnets such that the shaft can reciprocate in response to a field generated by one or more coils (e.g., within an ESP housing).

As an example, a rotating shaft can exhibit runout as an inaccuracy where the rotating shaft does not rotate exactly in line with a longitudinal axis. For example, when drilling, runout can result in a larger hole than a drill bits nominal diameter due to the drill bit being rotated eccentrically (e.g., somewhat off axis instead of in line). As an example, for bearings, runout can cause vibration and increased loads on the bearings.

As an example, runout can be dynamic and may or may not be amenable to being diminish, for example, depending on driving factors. For example, where runout is due to resonance in a system, a change in operational conditions that reduces resonance may act to diminish runout.

As an example, runout can be radial runout caused by rotation off center or axial runout caused by being at an angle to an axis. As an example, runout can be irregular, for example, as a result of worn or rough bearings which can manifest itself as axial and/or radial runout.

As an example, runout can include one or more measures of lateral position of a shaft. As an example, consider two components of a coordinate system (e.g. x, y or r, $\Theta$) or, as an example, a radial position (r) or, for example, a time-averaged radial position (e.g., average runout, etc.).

Figure 9:
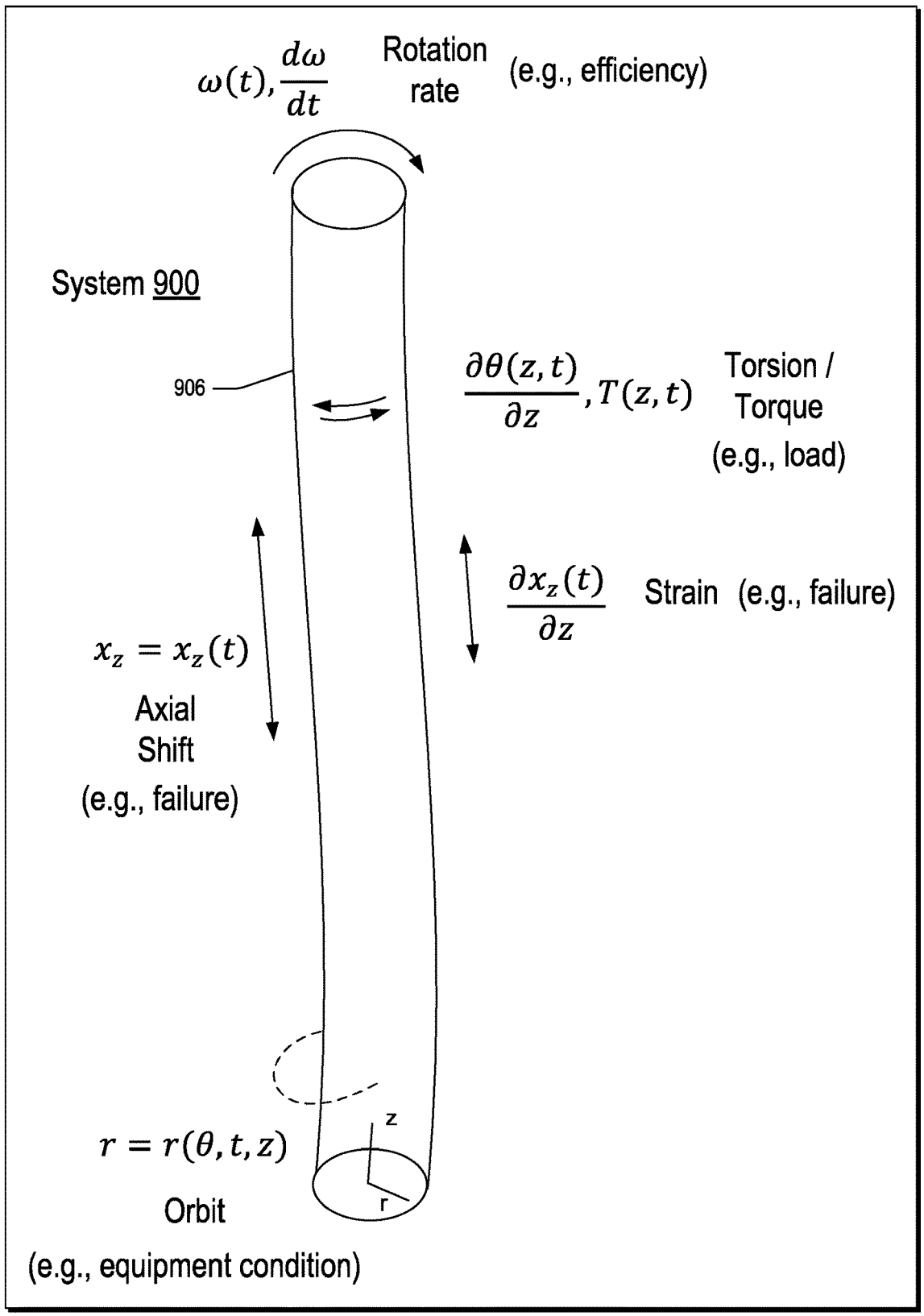
FIG. 9 illustrates an example of a system.

FIG. 9 shows an example of a system 900 with respect to various parameters or characteristics of the system 900 associated with movement. In the example of FIG. 9, the system 900 includes a shaft 906.

In the example of FIG. 9, the shaft 906 can orbit at a given axial location where the orbit may be represented as a time series, for example, with two degrees of freedom (2 DOF). As an example, a method can include determining runout or total indicated runout (TIR) based at least in part on orbit. In such an example, errors can include measurement errors as to the radius of the smallest circle that encompasses the orbit.

As an example, a parameter can be indicative of the health of a shaft or one or more portions of an assembly, a system, etc. that includes the shaft. For example, a TIR parameter may be determined and analyzed to assess health of one or more components.

As shown in the example system 900 of FIG. 9, various quantities may exist during operation of the shaft 906. As an example, such quantities may be determined using a cylindrical coordinate system where a longitudinal axis is z, a radial axis is r and an azimuthal direction is theta, $\Theta$. In such an example, x can represent an axial position of a material point on the shaft and, for example, t can represent time.

As an example, a system can include a shaft 906 that may operate in a range of rotational speeds from about 1 Hz to about 1,000 Hz (e.g., to perform a function such as pumping, etc.) or, for example, in a range of speeds from about 10 Hz to about 100 Hz (e.g., to perform a function such as pumping, etc.). As an example, a system can include one or more sensors and circuitry that can be utilized to acquire information over a range of rotational speeds (e.g., from about 1 Hz to about 1,000 Hz, from about 10 Hz to about 100 Hz, etc.).

As an example, one or more types of sensors may be utilized to acquire information as to movement of a shaft such as the shaft 906 as part of the system 900. As an example, one or more proximity sensors can produce output that depends monotonically on distance from a sensor (e.g., a probe) to a target object (e.g., a portion of a shaft, a component connected to a shaft, etc.). As an example, a sensor can be a shaft motion sensor that can acquire information for monitoring shaft motions.

In the example of FIG. 9, the system 900 can be an ESP system where the shaft 906 is a shaft that moves, for example, as driven by an electric motor. As an example, such a shaft may be a rotary shaft or a reciprocating shaft that is operatively coupled to one or more fluid pumps. As an example, the system 900 can include one or more sensors that can acquire information where such information can be analyzed to assess motions of at least a portion of the shaft 906. As an example, such information may be analyzed as to one or more of the quantities illustrated in the example of FIG. 9. As an example, such information may be analyzed as to orbit. As an example, such information may be analyzed as to runout, for example, total indicated runout (TIR), which may be based at least in part on orbit (e.g., time series information with respect to one or more dimensions of a coordinate system, etc.).

While an ESP system and shaft as part of the ESP system are mentioned, a shaft may be included one or more other types of systems, which may include, for example, one or more types of systems suitable for, at least in part, downhole use.

Downhole equipment may be disposed a substantial distance from a surface site, which may pose some challenges as to monitoring of such equipment. For example, where space is constrained in a downhole environment, addition of one or more sensors, sensor units, etc. may decrease clearances between downhole equipment and, for example, an earthen bore wall, a completion, etc. Further, downhole equipment may be intended for long-term use in a downhole environment, which may be, for example, of the order of months or years. In such circumstances, tripping equipment in and out of a bore can be costly. As an example, a method may aim to trip equipment out of a bore prior to failure of the equipment. As an example, a method that can include downhole sensing of shaft and/or shaft-related motions may facilitate determining when to trip equipment out of a bore. As an example, where one or more actions may be taken in response to information sensed downhole, such one or more actions may extend a downhole operational period for downhole equipment.

Figure 10:
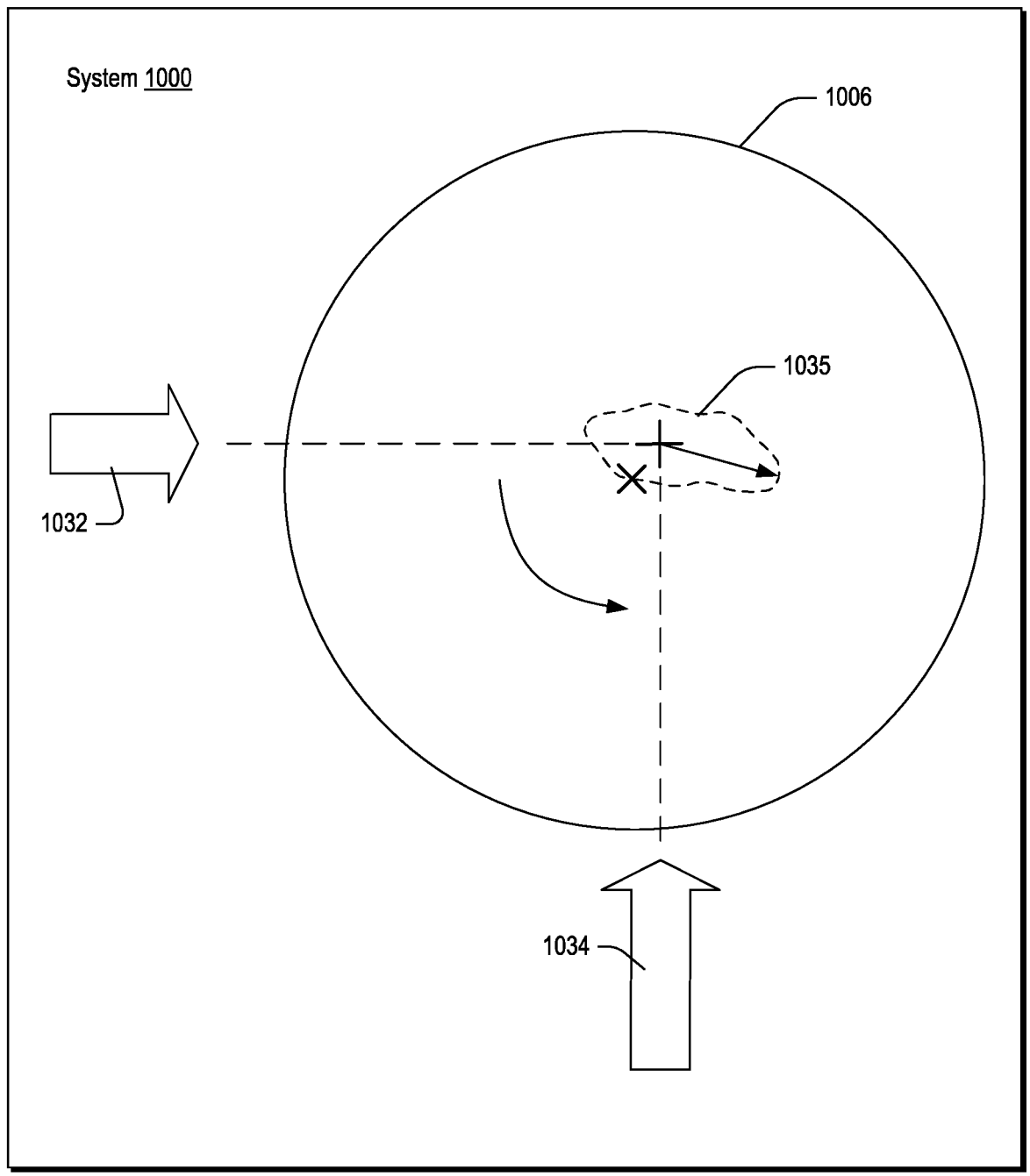
FIG. 10 illustrates an example of a system.

FIG. 10 shows an example of a system 1000 that includes a shaft 1006 and a plurality of sensors 1032 and 1034 where sensed information can be analyzed to determine an orbit 1035, for example, an orbit of a physical center of the shaft 1006 as defined in a plane.

As an example, one or more proximity sensors can be used to measure the radial position of a shaft. In the case of two or more sensors, as illustrated in the example of FIG. 10, combined measurements (e.g., in X and Y Cartesian coordinate directions) can be utilized to determine a shaft orbit, for example, in a plane perpendicular to the shaft's longitudinal axis. As an example, such measurements may be made at one or more locations along a shaft, along a piece of equipment, along an ESP string, etc. As an example, downhole equipment can include sensors that are fixed in known locations, for example, with a known orientation. In such an example, one or more sensors may be included at least in part within a housing of downhole equipment and/or one or more sensors may be included in a sensor unit, which may be operatively coupled to downhole equipment. For example, consider a sensor unit that includes opposing flanges that allow the sensor unit to be operatively coupled to two pieces of downhole equipment where a shaft can be disposed at least in part within the sensor unit and/or adjacent to the sensor unit. In such an example, one of the two pieces of downhole equipment can include the shaft and/or a coupling for the shaft. For example, a sensor unit can include a specialized shaft segment that can be coupled to one or more other shafts. As an example, motions of the specialized shaft segment may infer and/or be dependent upon motions of one or more other shafts to which the specialized shaft segment is operatively coupled.

As an example, a sensor unit can include a shaft and at least one coupling that can couple the shaft to another shaft. As an example, a sensor unit can include a shaft and two couplings that can couple the shaft to two other shafts. As an example, a sensor unit can include a clutch that can engage a shaft of the sensor unit to another shaft and/or other shafts. As an example, a sensor unit can be shaft-less and can receive at least a portion of a shaft rotatably supported by another piece of downhole equipment. As an example, a sensor unit can be shaft-less and can receive portions of two shafts where the two shafts may be rotatably coupled via a coupling or couplings, which may be part of the sensor unit. As an example, a system may include one or more sensor units.

As an example, a shaft and/or a sensor or sensors may be shaped and/or positioned to help ensure minimum interference between a sensor (e.g., a probe) and one or more parts other than a shaft (e.g., including other probes). As an example, a system or a sensor unit can include an increased shaft diameter locally where a surface of the shaft at the locally increased shaft diameter may be treated such that measurements associated therewith exhibit reduced error, for example, as may be due to geometrical intolerances, shaft material properties (e.g., surface properties), etc.

As an example, sensors may be used separately or in ensemble, for example, using common processing electronics and/or separate electronics. As an example, a system or a sensor unit can include redundant electronics, which may provide for redundancy, calibration or one or more other functions.

Referring again to the system 1000 of FIG. 10, processing shaft orbit information and interpreting it for monitoring purposes can include, for example, frequency decomposition. Such an approach may act to isolate different mechanical effects, such as synchronous and non-synchronous motion, whirl, rubbing, etc.

Figure 11:
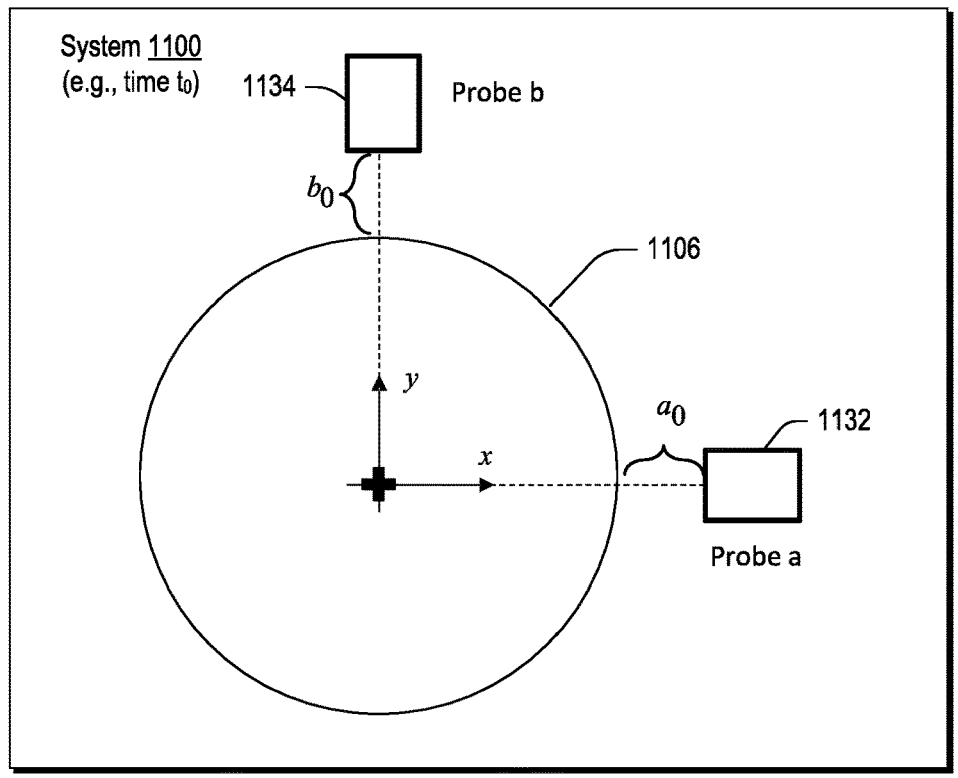
FIG. 11 illustrates examples of systems.
Figure 11:
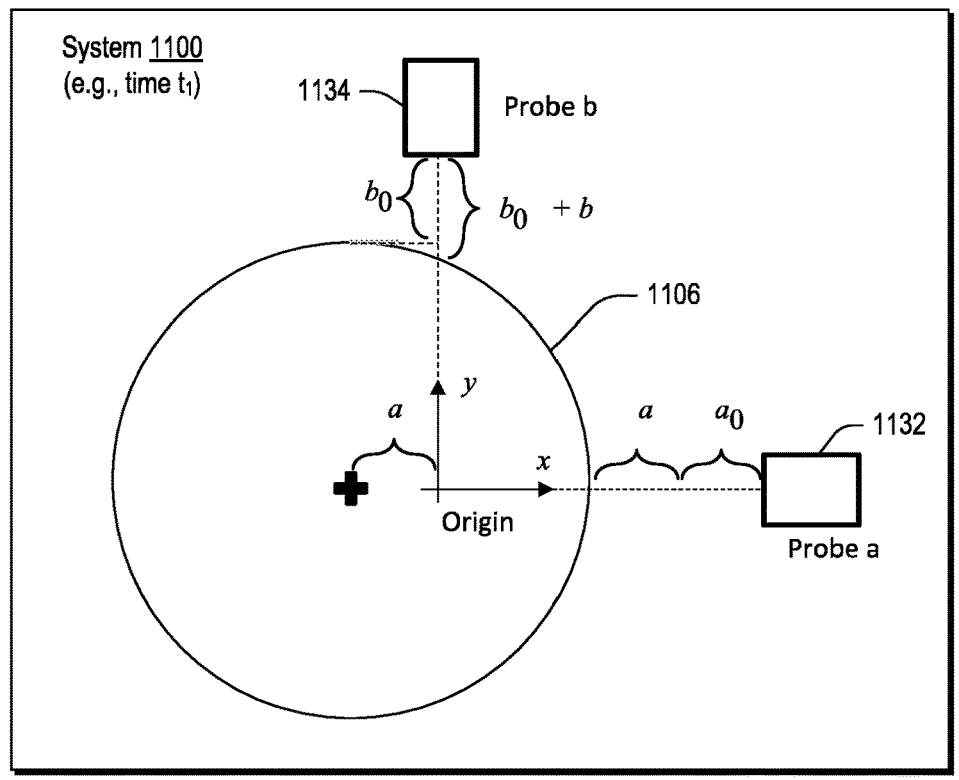

FIG. 11 shows an example system 1100 at two different times where an origin (e.g., shaft center) is displaced in space, for example, with respect to a coordinate system. In such an example, one coordinate system may be fixed and another coordinate system may be movable. As an example, a system can utilize two coordinate systems where relative displacement can occur for one of the coordinate systems with respect to another one of the coordinate systems. As an example, where information is acquired over a length of downhole equipment, a plurality of sets of coordinate systems may be utilized to characterize behavior of the downhole equipment. In such an example, relative motions from such sets may be analyzed, optionally with respect to a master coordinate system. For example, a master coordinate system may consider a length of downhole equipment to be relatively straight, which may correspond to a surface condition (e.g., before tripping the equipment downhole). Once downhole, depending on forces, bore conditions, bore trajectory, presence of other equipment, etc., the length of equipment may deviate from being "straight". As an example, downhole equipment can include one or more orientation sensors that can be utilized to acquire information that can indicate whether a length of downhole equipment deviates from being straight, untwisted, etc.

Referring again to FIG. 11, the system 1100 includes a shaft 1106 and sensors 1132 and 1134, which may be referred to as probes a and b, respectively. As shown, at a first time, clearances exist between the sensors 1132 and 1134 and a surface of the shaft 1106; whereas, at a second time, these clearances have changed due to a shift in the center of the shaft 1106 to the left. In such an example, some measurement error may be introduced, which may be accounted for via one or more techniques.

Figure 12:
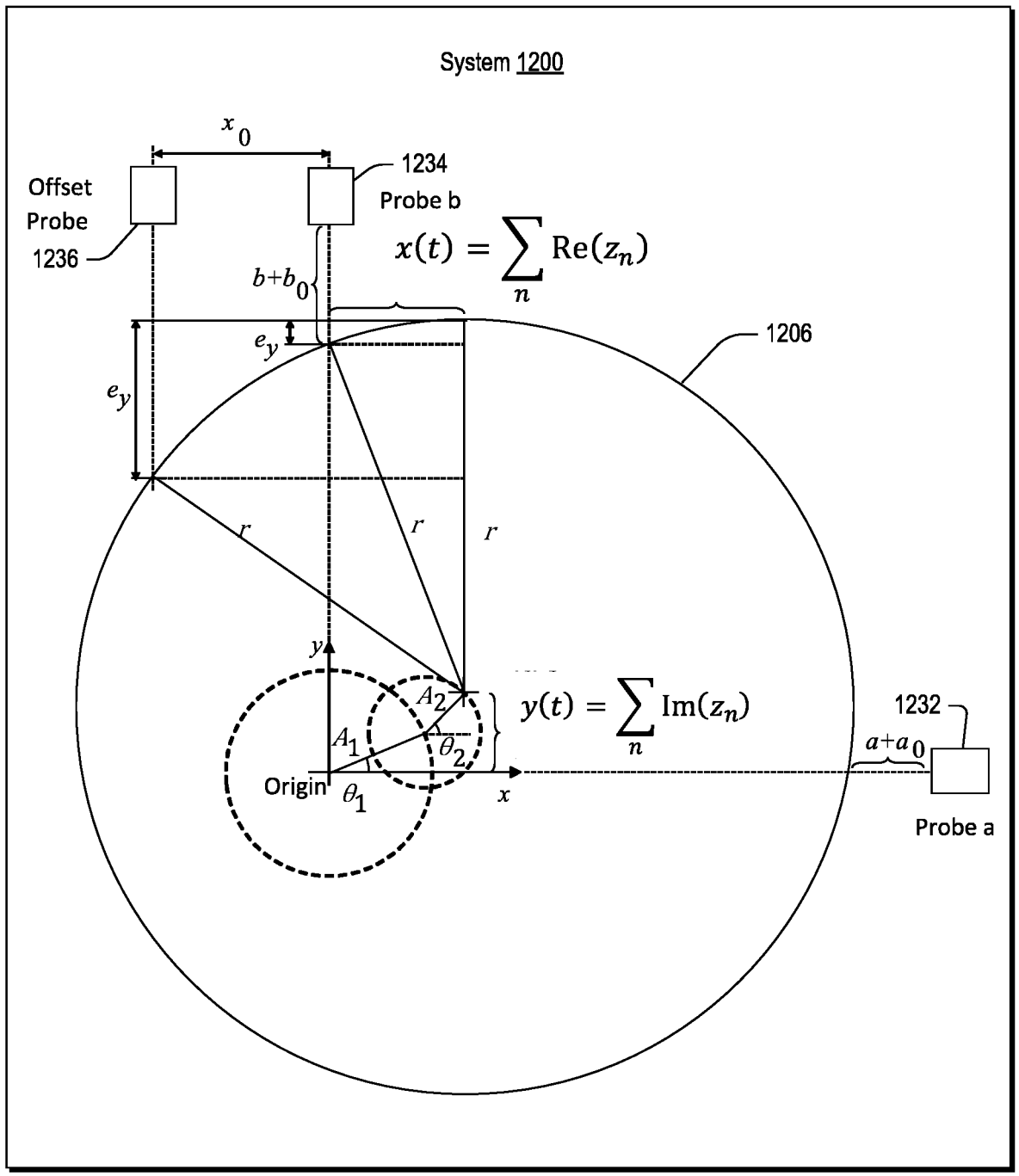
FIG. 12 illustrates an example of a system.

FIG. 12 shows an example of a system 1200 that includes a shaft 1206 and three sensors 1232, 1234 and 1236, which may be referred to as probe a, probe b and offset probe, respectively. In the example of FIG. 12, various measurement error parameters are illustrated. In such an example, the magnitude of the error depends on the ratio of the lateral motion of the shaft 1206 to the radius of the shaft 1206. In the example of FIG. 12, the sensor 1236, as an offset probe, illustrates a magnitude of error. As an example, a Taylor series expansion may be utilized for one or more error parameters, for example, as to approximating relative error. As an example, equations can be defined that apply to sensors 1232 and 1234 (probe a and probe b) where such equations define the measurement obtained when the shaft 1206 moves in position (x, y). In such an example, an inversion technique may be employed to recover an actual shaft position (x, y) as a function of measurements made (a, b). In such an example, origin position may be assumed to be known. As an example, a correction term can be defined and utilized to process measurements, for example, in real-time or near real-time to provided error reduced values of shaft position (e.g., at various times).

As an example, in an ESP system, relative error may be greater than a few percent (e.g., consider relative error of about 5 percent).

As an example, orbital motion of a shaft may be expressed via the following time dependent equation:

$$z(t) = \sum_{k}^{n} A_k \exp(2\theta_k \pi i t)$$

As an example, an adjustment term may be applied to such an equation. For example, consider an adjustment that accounts for a shape of a surface of a shaft with respect to a shape or dimension of a sensor, which may be associated with a sensor aperture. As an example, an adjustment term may adjust for curvature of a shaft with respect to an aperture of a sensor where the adjustment terms adjusts for error that may arise where an aperture is directed initially to a line of a longitudinal axis of a shaft and where the shaft may shift such that the longitudinal axis of the shaft is offset from the line. In such an example, an aperture of a sensor may be "focused" or centered on a line that corresponds to an initial position of a longitudinal axis of a shaft prior to operation and/or wear of one or more components associated with the shaft (e.g., bearings, etc.).

As an example, consider a system that includes two proximity sensors where each sensor can acquire measurement information sufficient to determine a respective distance, which may be a distance x and a distance y. In such an example, these may be raw measurement distances that can indicate an approximate position of a shaft, which can be defined as a vector quantity (e.g., two components, namely x and y). In such an example, the vector quantity can be processed to indicate runout, which can be a scalar value at a particular time. For example, consider an instantaneous runout value defined by the equation $(x^2+y^2)^{0.5}$; as an example, a runout may optionally be determined to be a maximum value over a given time period.

As an example, an orbit can be the shaft centerline movement as traced over time. As an example, an orbit can be a cycle. As an example, an orbit can be visualized as a plot of x versus y for time series data. As an example, position values with respect to time can be utilized to determine shaft orbit.

As an example, a method can include determining shaft vibration based at least in part on position values with respect to time. As an example, a method can include determining shaft orbit based at least in part on position values with respect to time. As an example, a method can include determining axial shift of a shaft based at least in part on position values with respect to time. As an example, a method can include determining lateral position of a shaft based at least in part on position values with respect to time. As an example, a method can include determining shaft rotation speed based at least in part on position values with respect to time. As an example, a method can include determining shaft rotation direction based at least in part on position values with respect to time. As an example, a method can include taking a time derivative of position values with respect to time.

As an example, a proximity sensor can sense a position value and can sense position values with respect to time. As an example, proximity sensors can sense one or more position values and can sense one or more position values with respect to time. As an example, two or more proximity sensors may be multiplexed with circuitry that can include an analog-to-digital converter. In such an example, analog signals received from the two or more proximity sensors can be converted to digital signals and processed via digital circuitry (e.g., consider a digital signal processor (DSP)) to output one or more position values. As an example, a single position value may be runout, which may be a radial distance of a centerline of a shaft. As an example, position values may be output as values of a Cartesian coordinate system (e.g., x or y or x, y or x, y, z) and/or as values of a cylindrical coordinate system (e.g., r or Θ, or r, Θ, or r, Θ, z).

As an example, a shaft and/or a component connected to a shaft may include one or more targets where a sensor or sensors operate based at least in part on proximity of the one or more targets to the sensor or sensors.

As an example, error may be expressed for a distance x via an equation such as:

x-adjusted=f(x-measured)

where x is a position vector and f is a function.

As an example, a function may be specified via values in a data structure such as, for example, a lookup table (LUT). As an example, a function may be expressed via one or more analytical equations, one or more numerical models, a combination of equations, models, etc. As an example, an adjustment may be made via an adjustment term or terms, which may be, for example, function based, data structure based, etc.

Figure 13:
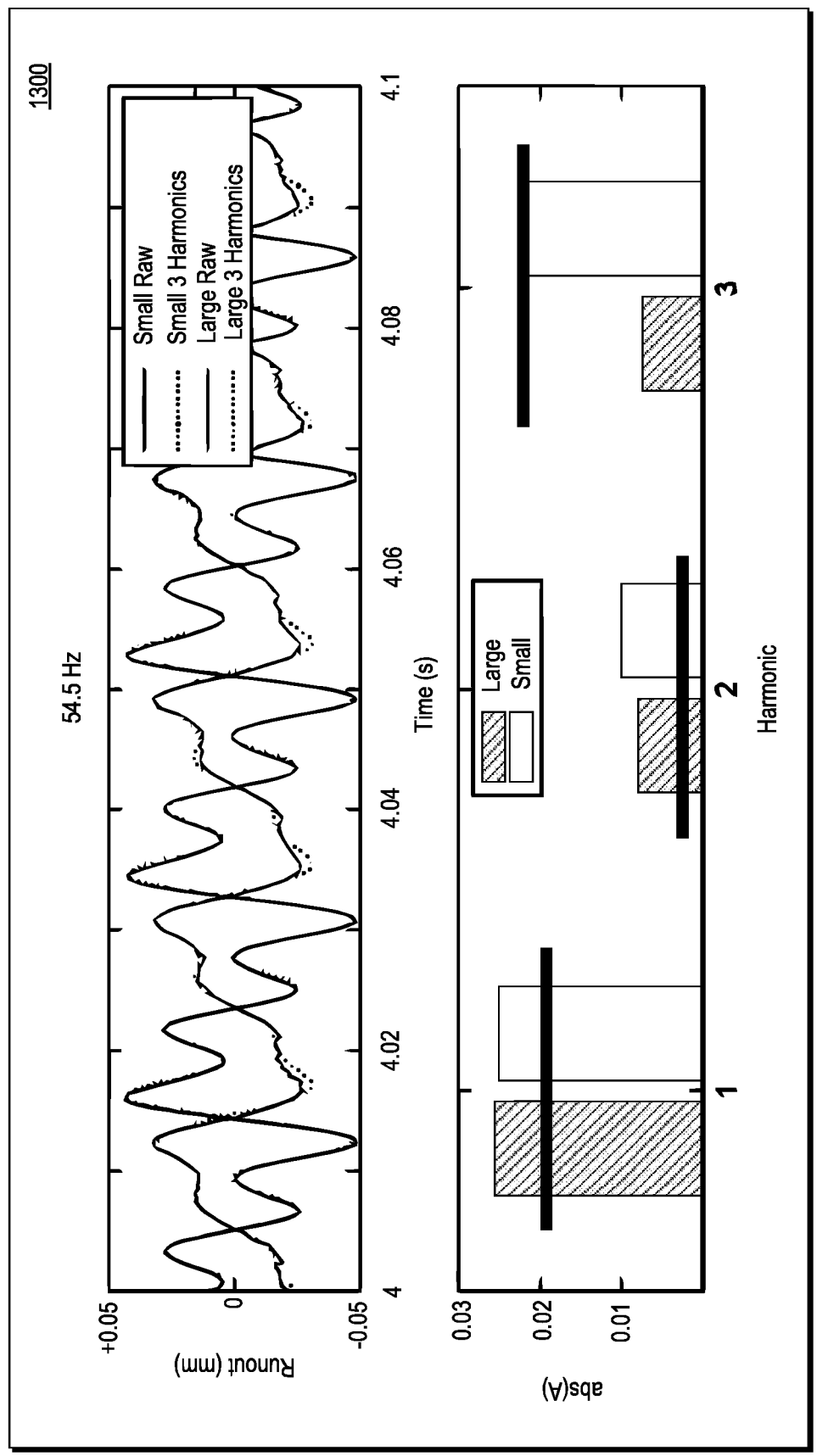
FIG. 13 illustrates an example of a plot.

FIG. 13 shows examples of plots 1300 as associated with example scenarios, which may be associated with equipment such as ESP equipment. For example, in ESPs, shafts tend to have relatively small radii. In such scenarios, a sensor may be selected that includes an aperture (e.g., coil size, etc.) that is a substantial size compared to shaft radius. In such a scenario, the sensor will be insensitive to geometric imperfections up to a scale similar to that of the aperture size. The plots 1300 in FIG. 13 show data where shaft geometry was first measured and then the shaft was spun and allowed to vibrate while proximity measurements were made. Both a small and a large aperture sensor were used. As indicated, the large aperture removes most of the third harmonic of the geometry.

In FIG. 13, the plots 1300 show in particular measurements of runout on a vibrating shaft using a large aperture sensor and a small aperture sensor where the upper plot is a time series, showing raw signals and fitted signals using three harmonics and where the lower plot shows the magnitudes of the three harmonics. Black horizontal lines show data obtained when the shaft is not free to vibrate. As indicated, the first harmonic is dominated by geometric intolerances, which may be, for example, calibrated out using the black line values; noting that the third harmonic is geometrical (e.g., not dynamic), and is filtered by the larger aperture but not the small one.

As an example, a method can include selecting one or more sensors based at least in part on aperture size with respect to a shaft size (e.g., shaft radius or shaft diameter).

Figure 14:
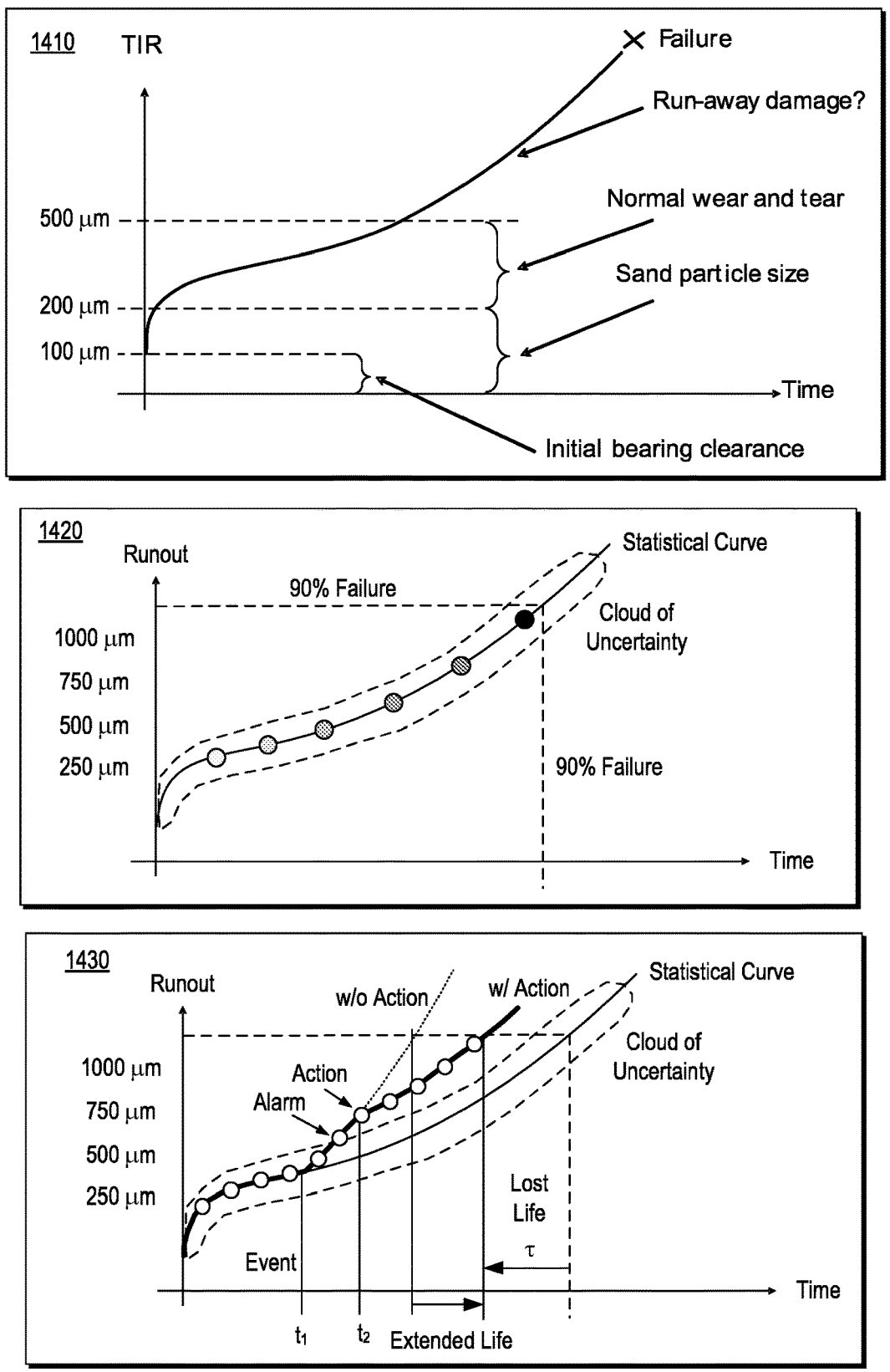
FIG. 14 illustrates examples of plots and methods.

FIG. 14 shows example plots 1410, 1420 and 1430. Such plots provide information associated with interpretation of orbit measurements, for example, as to lifetime estimates, processes for alarms, corrective action, etc.

In FIG. 14, the plot 1410 shows TIR versus time and approximate dimensions as to various types of phenomena. For example, the plot 1410 includes a clearance dimension for a bearing supporting a shaft, a sand particle size dimension, a normal wear and tear dimension, and an indication of possible run-away damage with respect to time that can result in failure.

As an example, an indicator derived from orbit measurements can be runout, for example, defined as the maximum distance of the shaft center from its nominal position during operation. The plot 1420 and the plot 1430 show examples of runout that may be tracked with respect to time, for example, to issue alarms, trigger control action, determine a time to tripping out equipment, etc.

As an example, a method can include analyzing data for a number of systems and providing a statistically derived curve, optionally in part model based. As an example, uncertainty may exist as to such a curve. As an example, uncertainty information may be represented as a cone of uncertainty and/or as an uncertainty cloud. As an example, one or more alarms, control actions, etc. may be based at least in part on uncertainty.

As an example, an indicator can be a maximum radial acceleration of a shaft, for example, based on kinematics from orbit or, in particular, maximum acceleration toward a center, which may be associated with force on one or more bearings.

As an example, a method can include monitoring runout and relating runout, directly and/or indirectly, to wear of a system that includes a shaft (e.g., a rotary shaft, etc.).

As an example, runout can be an indication of bearing wear (e.g., bearing clearance growth, optionally as a percentage).

As an example, ESPs may be utilized in fleets that can experience similar lives where gradual growth can occur in runout in individual ESPs of a fleet. In such an example, runout can correspond to bearing wear and can be associated with increasing damage to an ESP, which, in turn, can be an indicator of declining remaining useful life (RUL) of the ESP (e.g., regarding this particular type of failure mechanism). As an example, an operator can be given such an indicator in one or more of various forms (e.g., via a dashboard, a mobile app, etc.).

As an example, runout can increase in time and a "type-curve" can be created as illustrated in the plots of FIG. 14, which may, for example, correspond to pumps or other types of downhole equipment. As an example, a method can include displaying a curve and locating an ESP in question on the curve. In such an example, an operator can ascertain via such feedback information about remaining life of the ESP (e.g., optionally in individual terms and/or relative terms to other ESPs).

In FIG. 14, the plot 1420 shows six different running ESP systems on a master curve identified by six circles with grayscale shading corresponding to risk of failure. In the example of the plot 1420, the pumps tend to be close to the average performance. In such an example, RUL may be suitably defined by the operator on the understanding that it is probabilistic, for example, 90 percent failure/survival rate (e.g., non-parametric survivability). Such an approach can provide for in-situ health measurements for downhole equipment such as, for example, ESPs.

As an example, one or more ESPs may not follow a mean curve (e.g., or other statistically derived curve) closely. In the case where runout grows more quickly or slowly than is expected, this may be noticeable, for example, as shown in the plot 1430 of FIG. 14 because a circle for that ESP would not be on the master curve. In such an example, a method can include issuing an alarm that can alert an operator to such a condition, for example, if $r_i(t)$ is the in-situ runout, and $r_m(t)$ is the mean runout at that point in life for a given ESP population, then the following quantity can be a measure of abnormal behavior:

$$(r_i - r_m)/r_m$$

where the time for the measurements is assumed to be approximately the same.

As an example, an operator can define a value of such a quantity, which may raise an alarm, for example, if it is outside of two standard deviations of the population.

As an example, one or more other features of a population or populations can be characterized and used as references for alarms, actions, etc., for example, consider rate of wear:

$$(dr_i/dt - dr_m/dt)/(dr_m/dt),$$

and, for example, the rate at which the above quantity changes; and also, as an example:

$$(d^2 r_i/dt^2 - d^2 r_m/dt^2)/(d^2 r_m/dt^2).$$

As an example, various quantities may be calculated at different points in time; as an example, a method can include calculating one or more quantities for a common absolute value of r.

As an example, if a pump has a runout of approximately 500 µm, then the value of $dr_i/dt$ can be compared with the value of $dr_m/dt$ when $r_m = 500$ µm, regardless of the time at which $r_m$ had that value. Such a technique can be indifferent to accelerated wear that has happened in the past, but can show how the current wear compares to other cases. Such an approach can provide a useful indicator for an operator. As an example, one or more thresholds can be set and/or one or more alarms issued (e.g., an action taken, etc.), based at least in part on the one or more thresholds, etc.

As an example, correction of an ESP's expected runout curve can be made in-situ, for example, to account for a different aging rate. For example, in a more benevolent, or aggressive, well than average, the runout curve can be stretched in time. This can be performed, for example, by applying a suitable fit (e.g., least-squares) of a transform of the master curve to the in-situ data. Such an approach can take the following form:

$$r_i = T \cdot r_m + r_0 \quad \quad 5$$

where it is implicit that r is a function of time such that it is a vector.

In the foregoing example equation, T is an unknown scalar factor and $r_0$ is an offset value, e.g., an initial bearing clearance that may be different from a factory standard (e.g., and/or can be measured in-situ when the pump starts). As method of finding T can be, for example, achieved via minimizing the value:

$$|r_i - T \cdot r_m - r_0|^2.$$

As an example, a method can include fitting to re-cast a master curve and therefore re-estimate the RUL of an ESP based on in-situ information. For example, as information about an ESP is available via downhole sensors, an approach may not expect the ESP to behave as a random ESP from a population because more detailed information is available. As an example, an approach may expect it to follow the same type of curve, for the same physical reasons, but with adjusted parameters, for example, a non-linear wear rate.

As an example, a method may be applied as to one or more derived parameters, e.g., one or more rates of change and/or cumulative values of r, including those mentioned above or elsewhere herein.

As an example, where one or more other ESP parameters are measured and characterized, then they too may be vectors (e.g., different values at different times). As an example, such parameters may be incorporated into arrays, for example, along with values of r. In such an example, a method may include defining a transform T and increasing dimension to arrive at a transformation matrix of data. As an example, different scalar values within T can apply to different ESP parameters, respectively.

As an example, in addition to correction of T to a runout curve, r(t), one or more ESPs can experience discrete events which can affect the runout from that point onwards. For example, consider one or more of temporary gas lock, mechanical resonance, operator misuse, etc., which may cause the wear rate to rise temporarily or permanently.

As to an ESP's history, where an event or events occur, it can deviate from the mean $r_m$ and, for example, may be adequately adjusted by T. In such an example, the vector r can be dissected and treated as separate parts. As an example, consider using derived quantities. As an example, an effect can be that if wear was accelerated from the time $t_1$ onwards, then during that time the pump effectively lost some of its useful lifetime, τ, due to accelerated wear, and at time t the relevant values of $r_m$ for comparison will be $r_m(t+\tau)$. One possible objective function when optimizing pump operation will be to minimize T.

Referring again to the plot 1430 of FIG. 14, in the example illustrated, consider an electric submersible pump (ESP) where data indicating abnormality is lacking and where data indicate that the ESP is following the statistical curve, which may be an expected progression curve for the ESP such as, for example, a master curve" for expected operational life. In the plot 1430, following a discrete event at t=$t_1$, data indicate that the rate of wear is deviating from the master curve and deviating by increasing runout. In such an example, a method can include fitting a new curve based at least in part on the data (see, e.g., dotted curve). As shown in the example plot 1430 of FIG. 14, the dotted curve predicts a shorter life for the ESP. As an example, time periods may be defined as follows:

$$T=1 \text{ for } t<t_1, \text{ and}$$

$$T>1 \text{ for } t \geq t_1.$$

In such an example, a re-estimate exists for the RUL due to T>1. In the example plot 1430, further to that event, an alarm can be issued, for example, to alert an operator, trigger action, etc. As an example, an alarm may be a visual alarm, an audio alarm, a haptic alarm, etc. as may be generated by a device such as a computing device, a controller, etc.

In the example plot 1430, action is taken (e.g., automatically, manually, etc.) at t=$t_2$ and subsequently the wear rate reduces, for example, in a manner akin to an expected dr/dt for that value of r, albeit at an earlier time than an ESP of the master curve due to the accelerated wear between $t_1 < t < t_2$. In such an example, the following conditions may be stated:

$$T=1 \text{ and } \tau>0 \text{ for } t \geq t_2.$$

In such an example, a new, third, adjusted RUL can be generated and a lost lifetime, can be determined, for example, as the difference between $t_2$, and the time, t, at which $r_m(t) = r_i(t_2)$).

The example plot 1430 exhibits how in-situ RUL can be utilized in combination with a population model and how such an indicator may be utilized to trigger one or more actions. As an example, a method can include updating a metric such as RUL. In such an example, updating can be based on changing situations including interference (e.g., using feedback control). Further, where action or actions are taken, the effect of such an action or actions may be quantified.

As an example, a method can include recalculating a curve where one or more signal processing techniques may be implemented (e.g., consider one or more of filtering, averaging, removing anomalous points, using prior-statistical postulates to estimate the probability that the gradient has indeed changed when it appears to have changed, etc.).

As an example, a discrete (e.g., discontinuous) change in a runout indicator may occur, for example, due to sudden damage, sensor re-calibration, etc.

As an example, a method can be used with subsets of runout data, for example, consider particular frequencies such as the synchronous frequency, or most likely a particular subsynchronous frequency that may become evident in a frequency spectrum as damage occurs.

As an example, inductive proximity sensors may be utilized, for example, where a coil forms part of an oscillatory circuit and a target interacts with the coil and alters one or more parameters of the circuit (e.g., inductance) which can be measured. As an example, one or more types of proximity sensors may be utilized, for example, consider one or more of capacitive, ultrasonic, mechanical, etc.

As an example, a method can include transmitting sensed information via a cable connector of an assembly. For example, consider the cable connector 352 of the motor 350 of FIG. 3. In such an example, sensed information can pertain to runout, for example, as illustrated in one or more of the plots 1410, 1420 and 1430 of FIG. 14. As an example, sensed information transmitted via a cable connector to a cable may be received at a surface unit. For example, consider a method that includes receiving sensed information at the controller 230 of the ESP system 200 of FIG. 2. As an example, sensed information pertaining to runout may be utilized via one or more of the ESP motor controller 250 and the drive unit 270 to adjust one or more operational parameters of the ESP 210. For example, a mean time between failures (MTBF) analysis and/or other type health analysis may be performed using sensed information of one or more proximity sensors as received via a cable operatively coupled to a cable connector of equipment downhole in a geologic environment. In response to one or more of such analyses, an alarm may be issued and/or an action may be taken.

As an example, an action may aim to reduce a slope of runout associated with a shaft with respect to time, for example, to extend operational life of equipment that includes the shaft. As an example, one or more alarm parameters may be adjusted based on an action or actions. For example, in the plots 1420 and 1430 of FIG. 14, the cloud of uncertainty may correspond to an alarm region, particularly as to increasing runout. Where an action or actions are taken, a curve may be adjusted along with a corresponding cloud of uncertainty for purposes of issuing an alarm, taking action, etc.

Figure 15:
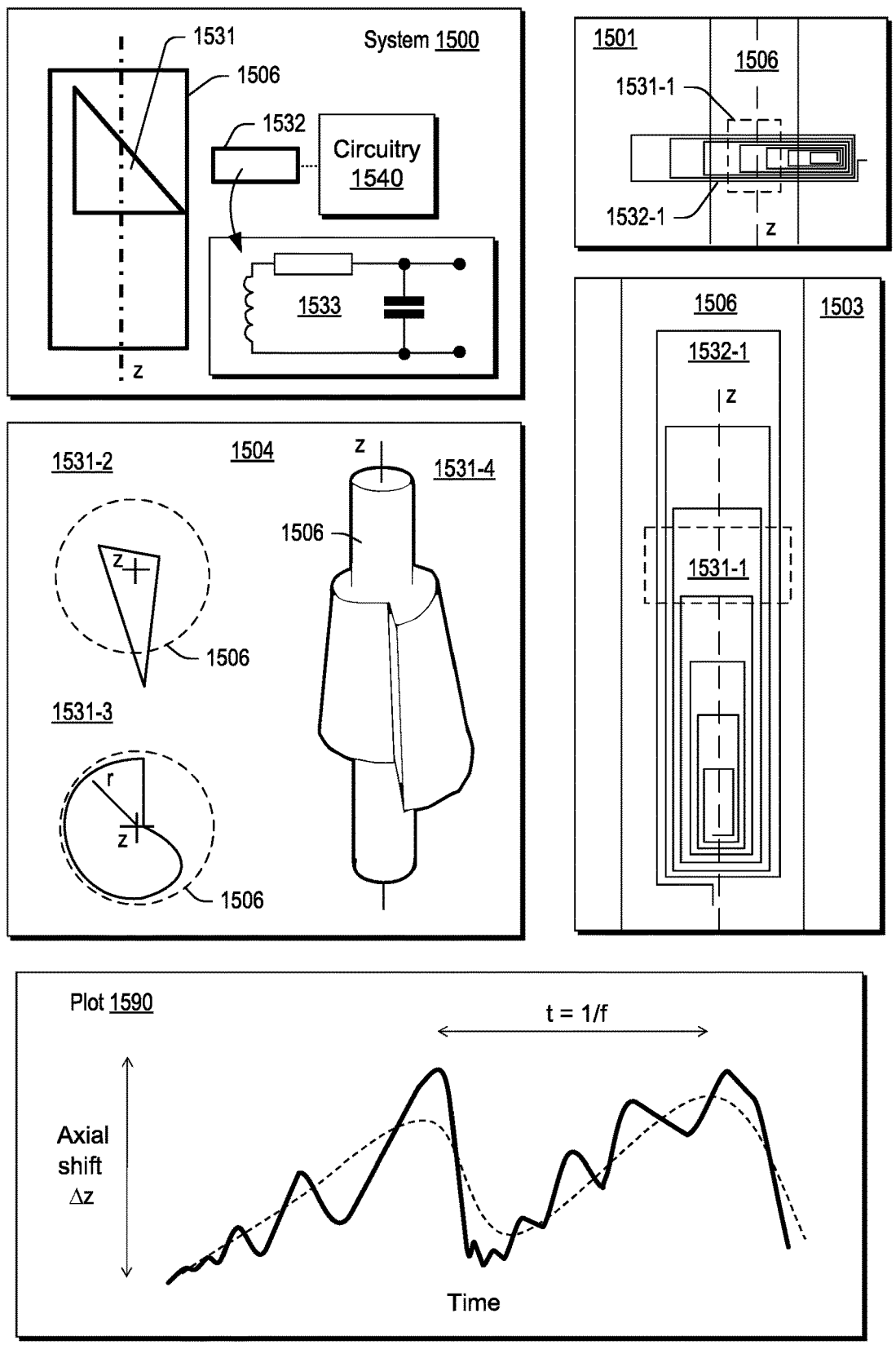
FIG. 15 illustrates an example of a system and an example of a plot.

FIG. 15 shows an example of a system 1500, examples of assemblies 1501 and 1503, examples of targets 1504 and an example of a plot 1590 of axial shift versus time. As shown, the system 1500 can include a shaft 1506, a target 1531, a sensor 1532 and circuitry 1540. In such an example, the sensor 1532 can sense the target 1531 as the shaft 1506 moves where the circuitry 1540 may receive information from the sensor 1532 and process such information, for example, to output information such as, for example, axial shift versus time as illustrated in the plot 1590.

The assembly 1501 includes the shaft 1506 with a target 1531-1 and includes a sensor 1532-1. The assembly 1503 includes the shaft 1506 with the target 1531-1 and the sensor 1532-1, however, in an orientation that differs from that of the assembly 1501. In the assembly 1501, a length of the sensor 1532-1 is oriented substantially orthogonally to a longitudinal axis of the shaft 1506. As an example, in the assemblies 1501 and 1503 the sensor 1532-1 may be straight and/or curved. For example, in the assembly 1501, the sensor 1532-1 may be curved along its length such that a clearance exists between a circumference of the shaft 1506 and a surface of the sensor 1532-1 where such a clearance may be a radial distance that is approximately constant where the shaft 1506 is stationary and, for example, in a "new" condition (e.g., without substantial wear as to one or more bearings that support the shaft). In the assembly 1503, the sensor 1532-1 may be curved about its width, for example, to provide a clearance exists between a circumference of the shaft 1506 and a surface of the sensor 1532-1 where such a clearance may be a radial distance that is approximately constant where the shaft 1506 is stationary and, for example, in a "new" condition (e.g., without substantial wear as to one or more bearings that support the shaft).

As an example, the sensor 1532-1 can include a straight, planar portion or the entire length and/or width of the sensor 1532-1 may be straight and planar.

In the example assemblies 1501 and 1503, the target 1531-1 is illustrated by a dashed border. Such a target may be made of a material or materials that can interact with the sensor 1532-1 and may include one or more of a variety of shapes.

As an example, a coil may be mounted to a shaft. For example, in the assemblies 1501 and 1503, the coil portion of the sensor 1532-1 may be mounted to the shaft 1506. As an example, a sensor can include a coil and a target can include a coil. In such an example, the coils may be receiver and/or transmitter coils that can receive and/or transmit energy. For example, two coils may be a receiver and transmitter pair.

As an example, the assemblies 1501 and 1503 can include circuitry such as, for example, the circuitry 1540 of the system 1500. As an example, such circuitry may be operative coupled to a connector of equipment that is suitable for use in a fluid environment such that the equipment is at least in part submersible. As an example, such equipment may be electrically connected to a cable via the connector (e.g., a cable connector). In such an example, information may be transmitted from the circuitry 1540 to the cable via the connector where the cable may be connected to surface equipment for processing, decision making, taking one or more actions, issuing one or more alarms, etc. As an example, a system can include a submersible portion suitable for submersion in a bore in a geologic environment where the submersible portion includes one or more sensors and/or targets and can include a surface portion where a cable or cables may operatively couple the submersible portion and the surface portion.

As to the example targets 1504, these can include a target 1531-2, a target 1531-3 and a target 1531-4, each of which is shown with respect to the shaft 1506. As an example, a target can be defined at least in part by a cross-sectional profile. For example, the target 1531-2 includes a triangular cross-sectional profile (e.g., a transverse profile) and the target 1531-3 includes a lobed cross-sectional profile (e.g., a transverse profile). As to the target 1531-4, it includes a series of cross-sectional profiles that differ with respect to axial position along the shaft 1506. In such an example, a sensor may detect axial shift based at least in part on cross-sectional profile of a target. For example, consider the sensor 1532-1 oriented as in the assembly 1501 or the assembly 1503 where an axial shift in the target 1531-4 would result in a change in sensed signal. As an example, such a change in sensed signal may be detected where a sensor is symmetric, considering the sensor 1532-1 as having an asymmetry as to its ends, one end having a smaller effective diameter coil size than another end.

In the plot 1590, the x-axis corresponds to time and the y-axis corresponds to proximity as measured by a sensor for a target such as, for example, a target 1531-4, which lacks symmetry in the transverse plane of the shaft 1506 and that differs in shape along the z-axis of the shaft 1506.

In the plot 1590, a solid line represents a measured signal with respect to time. As an example, a method can include low-pass filtering of a measured signal with respect to time, which can result in, for example, the smoothed dashed line of the plot 1590. As an example, a sensor, a target and/or circuitry operatively coupled to circuitry may include one or more filters, one or more amplifiers, one or more analog and/or digital signal processing circuits, etc. In such an example, a filtered, amplified and/or processed signal may be generated and, for example, transmitted via a cable connector of an assembly, a unit, etc., to a cable that is operatively coupled to a surface system such as, for example, a surface controller (see, e.g., the controller 230 of FIG. 2).

As an example, where size of a target (e.g., the target 1531-4) increases with respect to its position relative to a sensor (e.g., the target optionally being larger in diameter than the shaft 1506), a measured signal of the sensor can be saw wave in shape where, for example, height of the saw wave can be interpreted to give the axial position of the shaft (e.g., as noted in 1590). In such an example, the period of the saw wave corresponds to the shaft rotational frequency, and the forwards/backwards polarity of the saw wave can provide direction. The difference between the measured (solid) and filtered (dashed) lines, divided by the filtered (dashed) line, can provide information as to lateral vibrations of the shaft. Hence, as an example, axial shift, rotational speed, direction, and lateral vibration, can be measured simultaneously with a single sensor.

As an example, a method can include receiving information sensed by a sensor where the information corresponds to position of a shaft. In such an example, the information can include raw information and filtered information. Such a method can include determining difference or differences between the raw information and the filtered information for a particular time or time window and dividing the difference or differences by at least a portion of the filtered information for the particular time or time window where the result thereof provides information pertaining to lateral vibration of the shaft.

As an example, a method can include receiving information from a single sensor directed at a shaft and processing the information to determine one or more of axial shift, rotational speed, direction and lateral vibration of the shaft. As an example, a system can include circuitry that can receive information from a single sensor directed at a shaft where the circuitry can process the information to determine one or more of axial shift, rotational speed, direction and lateral vibration of the shaft. For example, such circuitry can be configured to determine axial shift, rotational speed, direction and lateral vibration based at least in part on two representations of a signal where at least one of the representations of the signal is a filtered signal that smooths variations in the signal with respect to time. As an example, a signal can be a signal of a proximity sensor that is directed at a shaft.

As an example, circuitry can include memory that can store information, which may include one or more of axial shift, rotational speed, direction and lateral vibration information for a shaft. As an example, circuitry can include an analog signal processor and/or a digital signal processor. As an example, circuitry can include an interface that can be utilized to transmit information. As an example, circuitry can include an interface that can be utilized to receive information. As an example, a circuitry can include an interface or interfaces that can receive and/or transmit information. As an example, circuitry can be disposed within a housing of a piece of equipment where the equipment is submersible and where the housing can protect the circuitry, for example, from fluid and/or surrounding rock. In such an example, the equipment can include a cable connector that include electrical connectors that are or can be electrically coupled to the circuitry such that the circuitry can communicate with equipment such as surface equipment that is also electrically coupled to the cable connector (e.g., via one or more cables).

As shown in FIG. 15, the sensor 1532 can include a coil and associated circuitry 1533 that can output one or more signals to other circuitry such as, for example, the circuitry 1540. As an example, the circuitry 1540 can include analog-to-digital conversion circuitry (ADC). As an example, the circuitry 1540 can include analog signal processing circuitry. As an example, the circuitry 1540 can output position values with respect to time where such position values pertain to position of the shaft 1506. As an example, the coil and associated circuitry 1533 may be referred to as a proximity transducer and, for example, the circuitry 1540 may be or may include signal conditioning circuitry. As an example, a cable may be present and operatively coupled to a proximity transducer and signal conditioning circuitry.

As an example, a tip of a proximity transducer can include a coil that forms part of an oscillating circuit. In such an example, when the coil is excited by a frequency signal provided by a signal conditioner, a magnetic field can be emitted by the coil. In such an example, if an electrically conducting material is moved into this field, the characteristics of the magnetic circuit change, which can cause amplitude of the frequency signal present in the coil to vary. As an example, amplitude can be proportional to a distance between a tip of a proximity transducer and a target.

As an example, a proximity sensor or proximity transducer may be characterized by an aperture. As an example, an aperture may be defined by a coil dimension. For example, for a circular coil, a coil diameter may define an aperture.

As an example, a sensor can be a microwave-based sensor. As an example, a proximity sensor can be an inductive sensor. As an example, a proximity sensor can be capacitive sensor. As an example, a proximity sensor can be a magnetic sensor. As an example, a proximity sensor can be an optical sensor. As an example, a proximity sensor can be an ultrasonic. As an example, a proximity sensor can be a multi-technology sensor (e.g., two or more of inductive, capacitive, microwave-based, magnetic, optical, etc.).

In FIG. 15, various examples of targets 1531, 1531-1, 1531-2, 1531-3 and 1531-4 are shown as well as the example of the sensor 1532-1 (e.g., sensor circuit or sensor coil) where the target 1531-1 can be mounted on the shaft 1506 and where the sensor 1532-1 can be mounted a distance from the shaft 1506 in, for example, one or more orientations. In one example, as the shaft 1506 moves axially (e.g., up and/or down), the target 1531-1 moves axial and the signal received via the sensor circuit 1532-1 changes due to the shape and size of a coil of the sensor circuit 1532-1. In another example, as the shaft 1506 moves laterally, the target 1531-1 moves laterally and the sensor circuit 1532-1 can receive a signal that changes due to the shape and size of the coil of the sensor circuit 1532-1.

As to the targets 1531-2, 1531-3 and 1531-4, these are shaped to lack some amount of symmetry, when compared to the symmetry of the shaft 1506, which may be represented as a circle in cross-section.

As an example, a target may be an impeller and/or a target may be part of an impeller and/or a target may be attached to an impeller (see, e.g., impellers of the pump 320 of FIG. 3 and/or the pump 600 of FIG. 6).

In the example of FIG. 15, the system 1500 can be an axial translation, axial lateral displacement, and/or axial strain sensing system. As an example, consider an ESP where during operation of the ESP a shaft can translate and/or compress/stretch (strain). In such an example, sensing strain or shift can be part of a method that includes monitoring behavior and/or health of an ESP.

Referring again to the sensor 1531-1, the coil thereof can provide for linear position detection in combination with a shaft geometry and/or shaft target that allows measurement of axial shift of a point on the shaft. As an example, one or more coils may be included in one or more orientations and one or more targets may be included as part of a shaft and/or as mounted to a shaft.

As shown in FIG. 15, a coil can be longer than the target. In the example of FIG. 15, the coil of the sensor 1531-1 is more sensitive toward the dense end than toward the sparse end (e.g., as to turn density) and the strength of the signal gathered from the coil can therefore indicate the linear position of the target.

As an example, a feature and/or a target on the shaft can be formed in a manner that produces a stronger measurement in a coil than the shaft itself. As an example, a coil may be constructed to operate with a target to generate a signal that is monotonically sensitive to axial position.

As an example, a system can include a combination of axial and proximity measurements for error correction and/or for one or more other purposes.

As an example, to remove errors in axial measurements that are caused by a changing radial position of the shaft, a coil with substantially uniform sensitivity to axial position can be positioned near the shaft, for example, at a different azimuth and/or axial position. In such an example, a corrected axial position may be determined from a difference between a non-uniform coil and a substantially uniform coil.

As an example, a system can provide for measurement of shaft speed using one or more proximity measurements. Such an approach may be implemented with or without a shaft feature and/or a shaft target.

As an example, measurement of radial proximity of a shaft can provide information about shaft vibrations in one plane. As an example, a frequency of vibration that includes a larger amount of energy (e.g., maximum energy) can be assumed to be equal to a shaft speed. In such an example, that frequency can be a proxy for shaft speed.

As an example, a method can include determining a frequency as a proxy for shaft speed, for example, by identifying a peak of a Fourier transform of a signal. As an example, for an ESP, even if larger frequency peaks exist elsewhere in the spectrum (e.g., due to whirl), the shaft speed is likely to be the peak in the vicinity of the electrical drive frequency (e.g. 0.9<shaft speed/drive speed<1).

As an example, frequency resolution of a discrete Fourier transform can be limited to the reciprocal of the sample length. However, where high accuracy and fast reaction time and/or low computational processing are desired, a peak frequency can be found more accurately, even for short sample times, using a Zoom FFT technique. In particular, given a small range of frequencies within which a peak is sought, such an approach can reduce computations and increases robustness of calculation of a frequency that can be a proxy for shaft speed.

Figure 16:
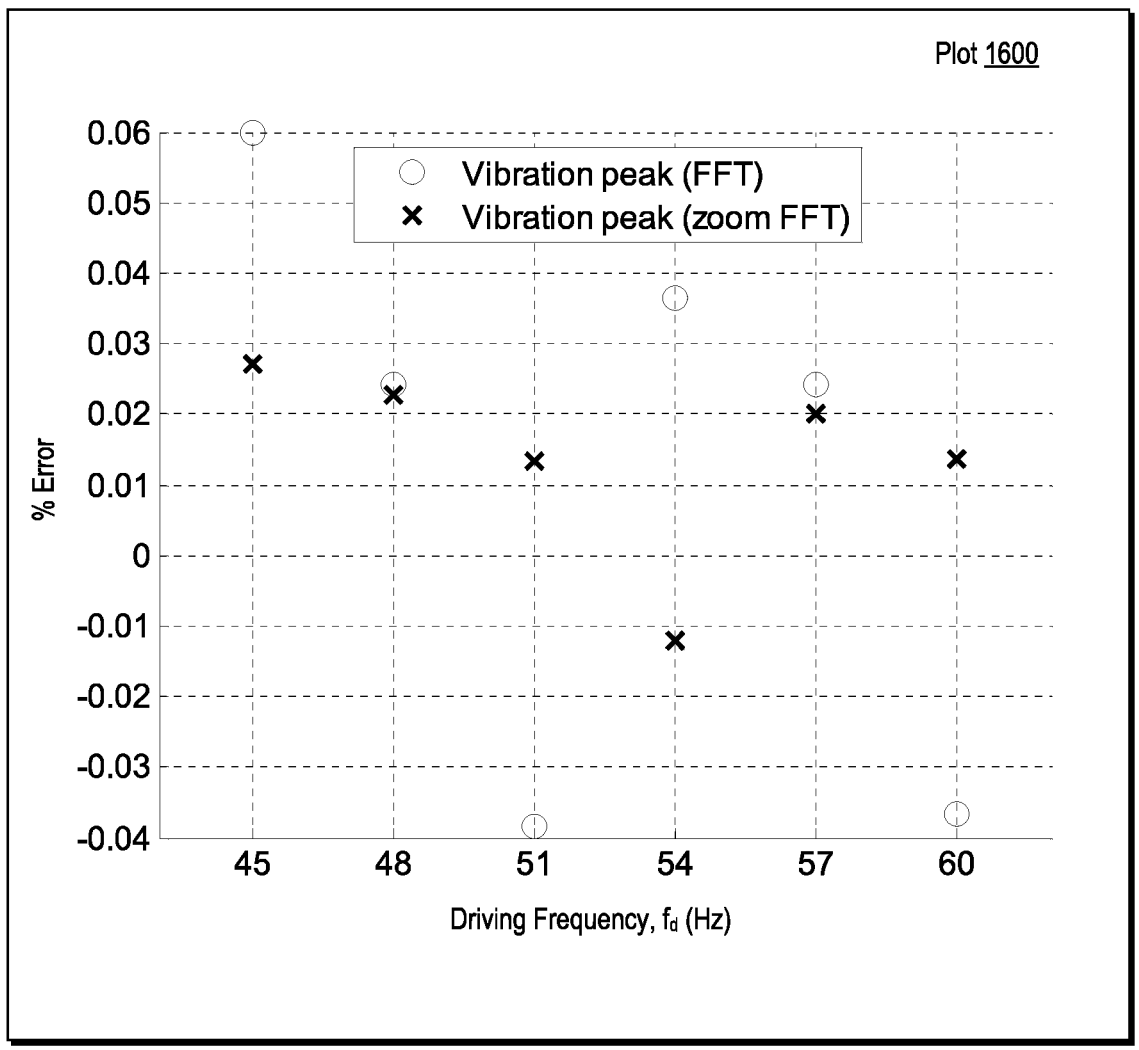
FIG. 16 illustrates an example of a plot.

FIG. 16 shows an example of a plot 1600 of percent error versus driving frequency for a shaft where a FFT approach and a Zoom FFT approach are implemented.

The plot 1600 shows results from an ESP for particular operating conditions. The shaft speed of the ESP was measured independently to within 150 ppm as a reference. The peak of a discrete Fourier transform of a 30 s sample was identified algorithmically and is represented by the circles in the plot 1600. The peak provides an estimation of shaft speed within approximately 0.06 percent (e.g., about 600 ppm). The data in the plot 1600 validates the assumption that the frequency peak in proximity measurements correspond to the shaft rotational frequency. The maximum error of about 0.06 percent corresponds to a limit due to a limited sampling time (e.g., at 50 Hz, 1/30/50=0.06 percent). The plot 1600 also shows that a Zoom FFT algorithm produces a consistently lower error (e.g., less than about 0.03 percent).

As to direction of rotation, if a target on the shaft has a non-uniform radius around its circumference (optionally with a magnitude larger than radial vibrations) then its periodic passing can be observed in a proximity measurement and can be used to infer rotational speed (e.g., consider phasor measurement).

As an example, direction of rotation can be sensed using multiple probes. Some examples can include two proximity probes where the phase difference of the vibrations implies the direction of rotation; or two probes where the non-uniform target passes one probe before the other or vice-versa (i.e. the phase indicates the direction).

As an example, direction of rotation can be sensed using multiple lobes, markers, targets, etc., spaced around the circumference of a shaft. Non-uniform spacing can enhance the ability to infer direction, for example, consider three lobes with unequal spacings plus one probe.

Figure 17:
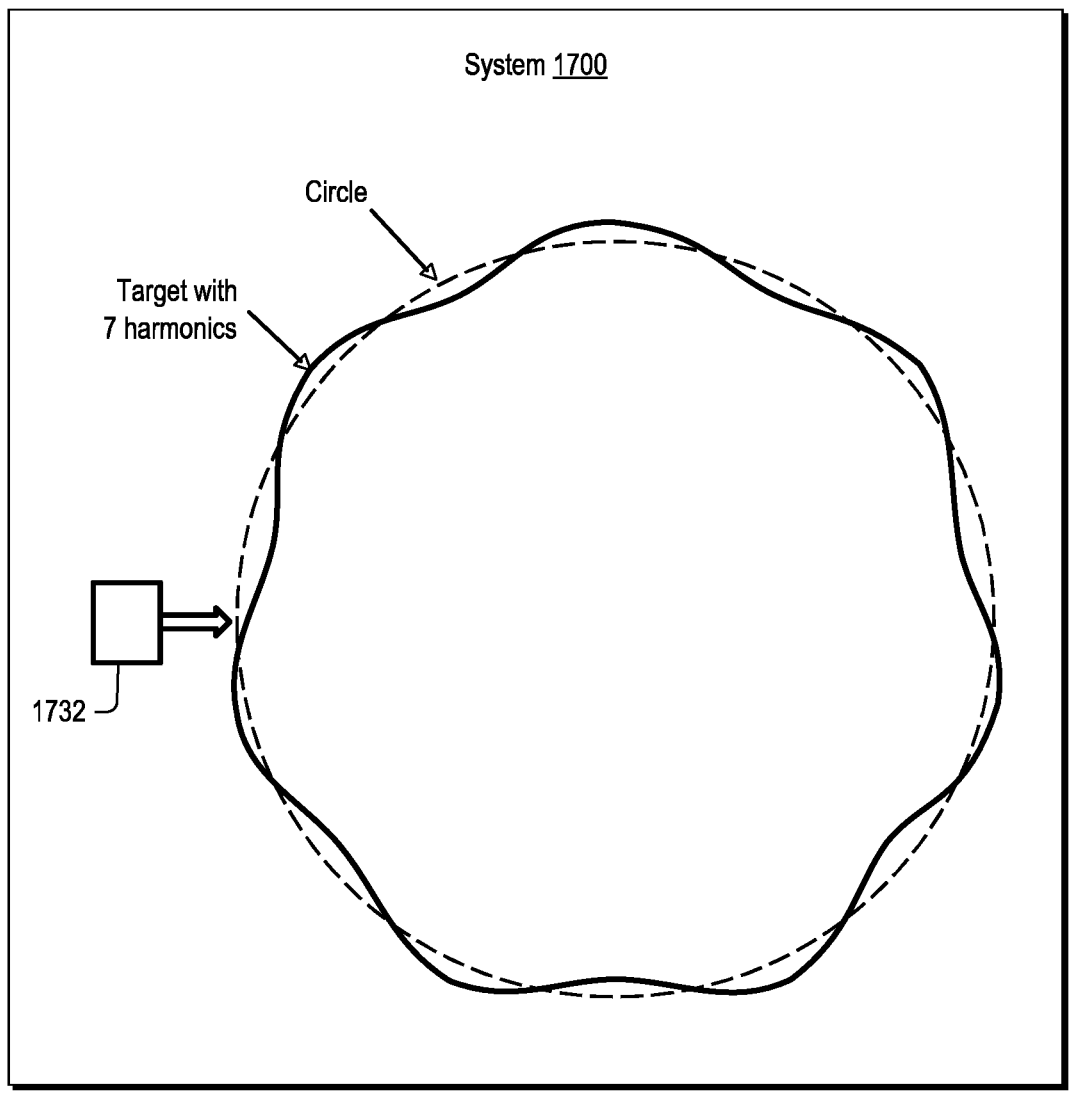
FIG. 17 illustrates an example of a system.

FIG. 17 shows an example of a system 1700 that includes a sensor 1732, a dashed line that represents a shaft (e.g., a circumference of a circle) and a solid line represents a target that can generate a plurality of harmonics (e.g., 7 harmonics). In such an example, the sensor 1732 can output information as to speed of the shaft.

As mentioned, direction of rotation can be sensed using multiple lobes, markers, targets, etc., spaced around a circumference of a shaft. As an example, distinct radial heights of the markers can enhance the ability to infer direction (e.g. three targets of different heights h1, h2, h2 respectively can pass in two different orders depending on direction).

As an example, where minimal complexity is desired, a system may sense direction using a minimum of one probe and one target. In such an example, the target can be non-uniform and non-symmetric circumferentially such that its passing is sensed by a proximity sensor as an asymmetric signal, for example, consider a saw wave that can have one of two orientations corresponding to counter-/clockwise rotation.

As an example, electrical properties of a shaft can be altered so that a signal from a proximity probe is altered. In such an example, consider a method that includes treating a shaft and/or attaching targets to a shaft such that the treatment and/or the targets provide different properties, for example, as may be achieved by nitriding or other surface treatment (e.g., oxides, etc.) or using different materials for the targets with different conductivities.

As an example, a system can provide for a combination of axial position, shaft speed, and direction of rotation measurements. For example, consider the target 1531-4 of FIG. 15, which may be utilized to infer axial position, shaft speed and/or direction of rotation when used with one or more coils (e.g., sensor circuits, etc.).

As to the plot 1590 of FIG. 15, it corresponds to a target such as the target 1531-4. Specifically, the plot 1590 shows a time series (horizontal axis) of the output (vertical axis) of a coil when combining multiple phenomena. In the plot 1590, the solid line is raw signal and the dashed line is low-pass filtered result of the raw signal. The time between peaks, t, is the reciprocal of the shaft frequency (e.g., or some multiple if multiple lobes are used). The magnitude of the peaks indicates the axial shift and the orientation of the asymmetry indicates direction of rotation and further frequency information is evident due to vibrations.

As an example, magnitude of a signal can be calculated, for example, using a root mean square (RMS) calculation of the raw and/or filtered signals and can correspond to axial shift. The frequency of rotation can be the peak in the frequency spectrum (e.g., using a discrete Fourier transform). The direction of asymmetry (e.g., uphill or downhill) can be determined by one or more of various methods, for example, assuming quarter wave symmetry with an odd function where odd coefficients of sinusoids will have substantial magnitude and their sign will indicate orientation of the wave; or, for example, to differentiate the signal and dividing the result by its absolute magnitude and integrating. Such an approach can yield either a positive or negative value depending on the orientation of the wave.

As an example, a system can provide for axial shift measurements with a relatively small probe or probes. As an example, for larger axial shifts or smaller probes, a single probe approximating a point proximity measurement can be used and the target itself can have a changing profile in the axial direction, hence the proximity measurement varying as the shaft moves axially. For example, consider the target 1531 of FIG. 15 and the sensor 1532. In such an example, the system 1500 can yield shaft speed and azimuth information. As an example, multiple targets can permit higher resolution azimuth measurements. As an example, a system can include at least one sensor (e.g., probe) or may include multiple sensors (e.g., probes), optionally for increased accuracy and reliability.

As an example, a system can provide for measurement of axial position, direction of rotation, azimuth, and speed of rotation with a small probe or probes.

While the target 1531 of FIG. 15 implies a uniform height (radially) to the target, it could be non-uniform and this can be used to generate an output akin to the plot 1590. As an example, a direction of rotation can be inferred in a similar manner; however, the amplitude will imply azimuth. Additionally, between each cycle that can be a period of time where the signal is substantially a uniform minimum where the length of this minimum can imply the axial position. As an example, axial position can be calculated algorithmically by, for example, by integrating the signal.

As an example, a system can include multiple targets with varying profiles axially, as per the target 1531, where circumferential spacing is non-uniform, so direction and azimuth can be inferred.

As an example, a system can include multiple targets with varying profile axially (see, e.g., the target 1531, etc.) where height of the targets varies so that direction is evident (e.g. three targets of different heights h1, h2, h2 respectively). As an example, a system can include targets that can provide two different orders in which heights will pass a sensor.

As an example, a system can provide for in-situ calibration of proximity measurements, which may be indicative of measurement drift. As an example, such a system may be an ESP system, which may be downhole for extending periods of time up to, for example, an entire service life. Such an in-situ calibration approach can help to mitigate issues associated with drift in proximity sensors.

As an example, in addition to two sensors to measure shaft orbit, an additional sensor may be included that can point at a fixed target in the vicinity of the shaft. Such a sensor may be a reference sensor where if that reference sensor drifts in a similar manner as other sensors, then corrections can be made to one or more of the sensors. As an example, multiple reference sensors can be used with different calibration distances, to allow nonlinear calibration.

As an example, additionally or alternatively, a system can include sensors placed at about 180 degrees around a shaft. In such an example, a method or algorithm may include the following assumptions: sensor positions are known; shaft diameter is known; and sensor drifts are substantially identical (e.g., same or similar circuitry, mechanics, etc.). In such an example, corrections can be made. For example, the sum of the measurements from two opposing sensors, plus the shaft diameter, can be expected to be equal to the known distance between the two opposing sensors. In such an example, a difference in that measurement can indicate error (e.g., calibration information). As an example, sensor measurements can be corrected using such updates, for example, by updating one or more of calibration coefficients, calibration curves, calibration surfaces, etc., as used for the sensors.

As an example, errors may be present in one or more corrections, for example, due to one or more assumptions made. Such effects can also be mitigated. For example, if a shaft is not central laterally then an adjustment to the effective shaft diameter can be made by using a third sensor at about 90 degrees to the first two (e.g., which may be present for orbit measurements).

As an example, adjustments to assumed sensor positions and shaft diameter can be made based on a combination of models and measurements for how these quantities change. For example temperature measurement(s) plus thermal expansion model(s), or shaft erosion models combined with a known life-time and solids content in the working fluid.

As an example, one or more other sensors can be added (e.g., where space is available) for additional accuracy and/or redundancy. As an example, sensors can be paired (or larger groups) according to their drift characteristics when tested in a factory, to improve the accuracy of the assumption of substantially identical drift.

As an example, shafts tend to deviate from being perfectly circular and, for example, if magnitude of a shaft's radial motion is of substantially the same order as non-circularity of the shaft, then these two signals may possibly be confused by a proximity sensor.

As an example, a method can include measuring, observing, recording, etc., shaft geometry prior to installation. In such an example, phantom runout due to this geometry can be removed from proximity measurements using the calibration data taken beforehand. As an example, consider a method that includes using the harmonic content of the proximity measurement, based on an accurate shaft speed measurement. The harmonic content due to the geometry can be measured beforehand and can be removed from the vibration signal in the frequency domain.

As an example, additionally or alternatively, shaft geometry can be detected during operations. For example, consider a method that includes rotating a shaft very slowly in-situ, whereby vibrations are assumed to be minimal and the geometry of the shaft will be evident in the proximity measurements.

As an example, additionally or alternatively, to in-situ calibration, a system can include multiple sensors at various specific angles and can use phase information to distinguish motion from geometry. For example, consider additional radial proximity sensors placed at intervals of about 60, 90, and 180 degrees from a first sensor, making 4 sensors in total which can be numbered 1-4 clockwise from the top. In such an example, motion in the north east direction will decrease the proximity in probes 1, 2, 3 and increase in probe 4. However, the passing of one of three lobes on the shaft would cause a sequential wave in the proximity sensors in order, 1, 2, 3. As such a lobe spans about 120 degrees, the passing lobe cannot cause a simultaneous change in proximity in both probes 1 and 2. Therefore, rotation of the shaft with its lobe can be distinguished from its bulk motion. Such an example, can be for a shaft with three lobes; noting that a shaft with two lobes can be sensed using sensors 1 and 4; with three lobes using 1 and 2; with four lobes using 1 and 3; etc.

As an example, a system can include a target on a shaft that can be unbalanced and induce undesirable vibration on the shaft. As an example, a plurality of targets may be utilized for the purpose of balancing. Such targets may or may not enhance measurements and they may or may not be metallic.

As an example, one or more targets may be utilized. As an example, a target may be one single cylindrical part, with spatially varying electrical properties due to non-uniform material properties (e.g. areas with different material, or with differently treated material) but with balanced mass distribution (uniform or otherwise).

As an example, a system can include sensors for sensing torque (e.g., twist). For example, two sensors arrangement at different axial positions can have an azimuthal phase difference that corresponds to twist in a shaft. As an example, if phase can be derived from proximity measurements (e.g., with or without a special feature/target(s)), then the shaft twist can be known. With appropriate assumptions about the torque distribution on the shaft and the mechanical properties of the shaft, twist can be used to infer torque.

As an example, a sensor or sensors may provide information as to housing proximity to a well casing. For example, a system can include one or more sensors pointing outwardly from an ESP housing such that the sensors can measure the proximity to the well casing. In such an example, a method can include identifying a position of the ESP in the well and/or measuring vibrations of the ESP housing within the well.

As an example, a coil or sensor may be embedded in a material such as a potting material. As an example, a coil or sensor may be embedded in a material such as a ceramic.

As an example, a sensor package may be utilized in an ESP system, in a completion system (e.g. flow control valves, etc.), in a wireline system, in a drilling system, in subsea equipment (e.g., boosters, valves/actuators, etc.).

As an example, a system can include circuitry for monitoring one or more aspects of a shaft and one or more conditions germane to operation of the system such as, for example, pressure, temperature, fluid flow, etc. As an example, one or more proximity sensors can measure operating parameters associated with a shaft. As an example, a method can include correlating one or more of such parameters to system health, running conditions, etc.

Figure 18:
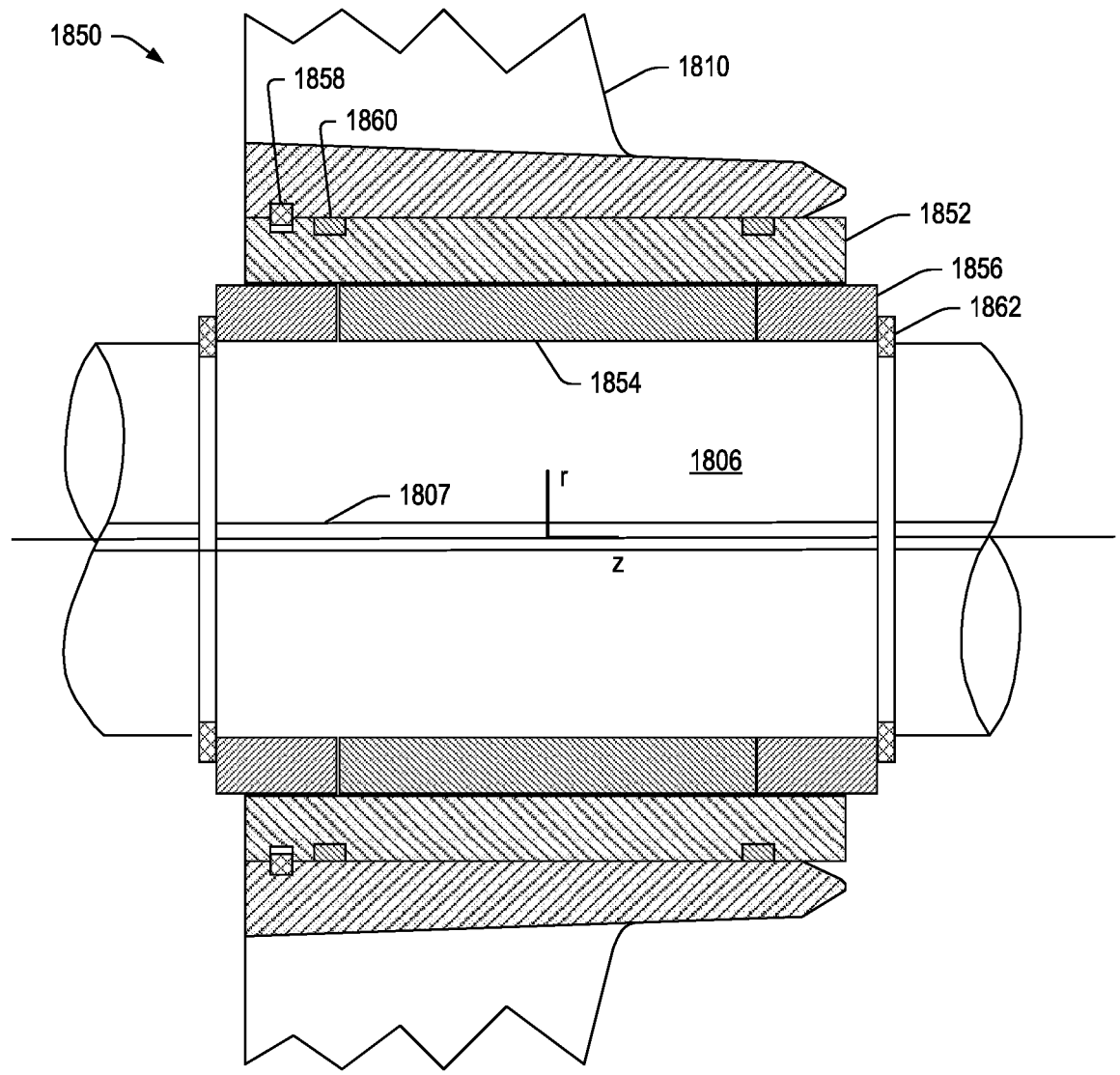
FIG. 18 illustrates an example of a system.

As mentioned, a shaft can be supported by one or more bearings. FIG. 18 shows an example of a system 1800 that includes a bearing assembly 1850 that supports a shaft 1806, which may include a key and/or a keyway 1807 (e.g., to operatively coupled the shaft 1806 to one or more components). As shown, the system 1800 includes a bearing support or diffuser 1810, a bearing 1852, a sleeve 1854, spacers 1856, a retaining ring 1858, O-rings 1860, and an optional snap ring 1862, which may be utilized, for example, for heads, bases, etc. As an example, the support 1810 may be a nickel-based material. As an example, the bearing 1852 and/or the sleeve 1854 may be ceramic (e.g., zirconia, etc.). As an example, the spacers 1856 may be a nickel-based material. As an example, the snap ring 1862 may be made of an alloy such as, for example, MONEL alloy.

As illustrated in FIG. 18, a bearing assembly can include various components where clearances, contacts, etc. can exist between such components. Over time, one or more of the components of a bearing assembly can wear, fail, etc. For example, surfaces between the bearing 1852 and the sleeve 1854 can wear in a manner that increases clearance therebetween. In such an example, the shaft 1806 may move within that clearance to a greater extent, which may act to transmit force to the bearing 1852 and/or the sleeve 1854 that can generate further wear, etc. As an example, a system can include one or more sensors that can acquire information germane to state of one or more components of a bearing assembly, which can impact operational characteristics of a shaft and/or one or more other components.

As an example, a proximity sensor can include circuity that can project a magnetic field toward a target. In such an example, medium and surroundings between the sensor and the target can cause some amount of interference. As an example, a system can be constructed in a manner that acts to reduce such interference. As an example, one or more non-magnetic materials may be utilized to construct one or more components.

As an example, a sensor may operate at least in part on the basis of eddy current generation in a material via emission of a magnetic field. In such an example, the eddy current generation can depend on the conductivity of the material. As an example, various supporting components of a sensor may be constructed from materials that are not amenable to eddy current generation and/or that are constructed to reduce effects of eddy currents generated (e.g., compartmentalized boundaries that limit eddy current size, etc.).

Some examples of suitable materials for a window plug between a sensor and a target can include, for example, non-magnetic metals (e.g., aluminum, zinc, nickel, titanium, etc.), ceramics (e.g., sapphire, silicon carbide, tungsten carbide, zirconia, diamond, etc.), polymers (e.g., plastics, rubbers, epoxies, etc.), and composites (e.g., fiber, particle, coating, layer reinforced, etc.).

Figure 19:
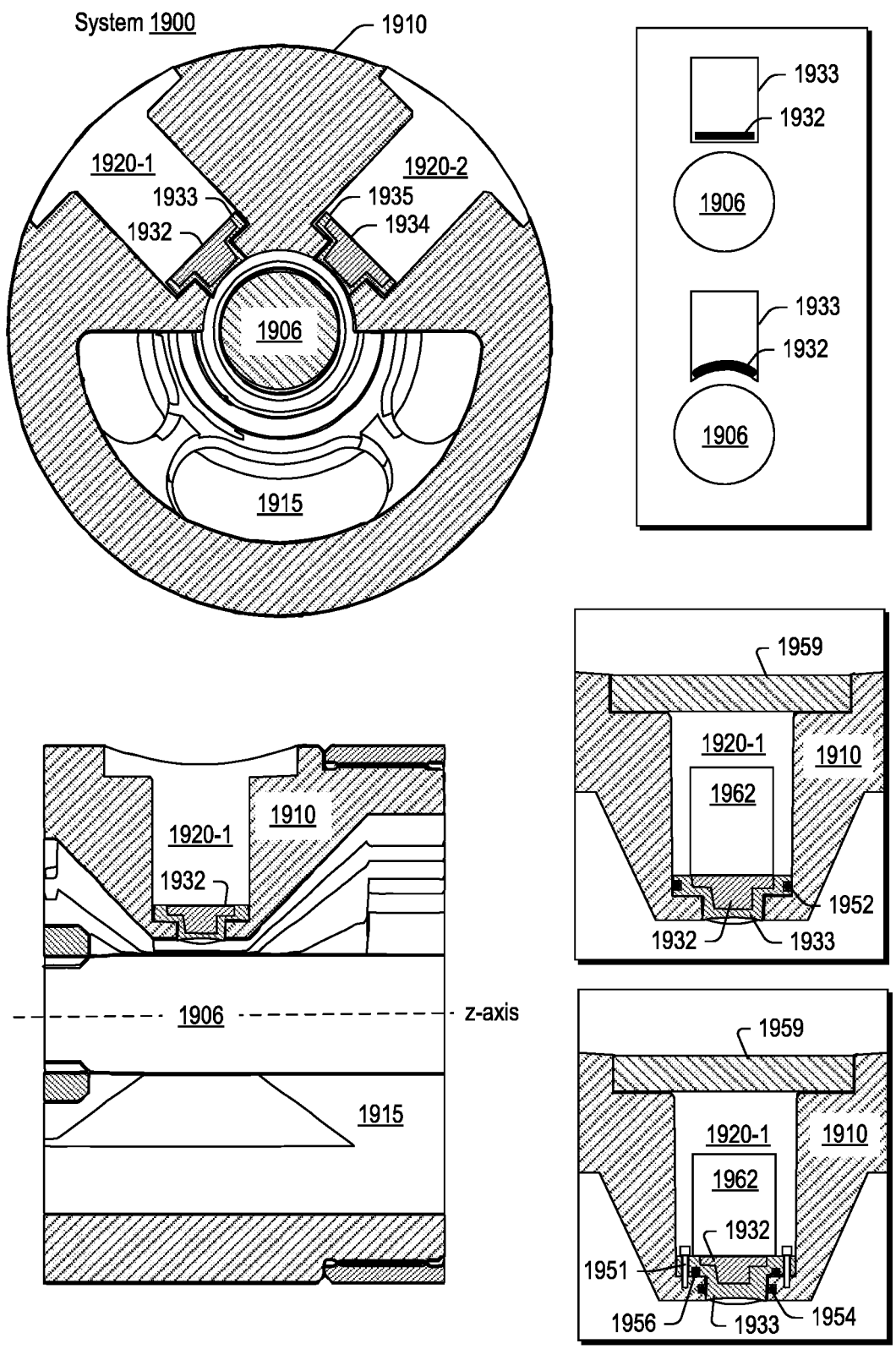
FIG. 19 illustrates an example of a system.

FIG. 19 shows an example of a system 1900 via two cutaway views, one in a r, Θ plane and another in a r,z plane of a cylindrical coordinate system. As shown, the system 1900 includes a shaft 1906, a housing 1910 that defines a flow area 1915 and sensor recesses 1920-1 and 1920-2. As shown, a sensor 1932 is disposed at least in part in the sensor recess 1920-1 and a sensor 1934 is disposed at least in part in the sensor recess 1920-2. In such an example, the sensors 1932 and 1934 may be about 90 degrees apart and may be directed toward a central, longitudinal axis (e.g., z-axis). As an example, where the shaft 1906 is stationary, a rotational axis of the shaft 1906 can be substantially aligned with the central, longitudinal axis (e.g., z-axis).

As an example, the sensors 1932 and 1934 can be proximity sensors. As an example, a proximity sensor can be encased in a chamber located in proximity to a target and inside an enclosure, which may be a housing of an ESP, etc.

As shown in the example of FIG. 19, window plugs 1933 and 1935 may be fashioned as plugs that can be seated in an end of a respective recess 1920-1 and 1920-2, respectively. In such an example, the window plugs 1933 and 1935 can be made of material that is durable to resist wear and that is substantially non-interfering with operation of a proximity sensor (e.g., as to eddy currents, magnetic field generation, etc.). As shown, the window plug 1933 can be shaped at its end to conform more closely to a surface of the shaft 1960 and/or the sensor 1932 can be shaped to conform more closely to a surface of the shaft 1960. For example, shape of a window plug and/or a sensor may be arcuate and defined by a radius of curvature that is greater than a radius of a shaft.

FIG. 19 also shows some examples of sealing mechanisms and/or securing mechanisms. For example, screws or bolts 1951 may be utilized to secure the window plug 1933 to the housing 1910 and/or one or more O-rings 1952, 1954 and 1956 may be utilized to seal the sensor 1932 and/or the window plug 1933 and/or electronics 1962 that may be disposed at least in part in the recess 1920-1.

As an example, a cap 1959 may be positioned with respect to the recess 1920-1 to seal it from an external environment (e.g., external to the housing 1910). As an example, one or more seal mechanisms may be provided (e.g., O-rings, etc.) to seal the cap 1959 with respect to the housing 1910. As an example, a cap may include an opening, for example, for passage of one or more wires, fiber optics, etc. As an example, the electronics 1962 can include wireless transmission circuitry that can transmit and/or receive information wirelesses. In such an example, the recess 1920-1 may be sealed without one or more openings for passage of a wire, a fiber, etc. As an example, the cap 1959 can include an embedded antenna, for example, operatively coupled to the electronics 1962, which may include wireless circuitry operatively coupled to the embedded antenna. As an example, a battery may be included in a recess to provide power to one or more circuits, etc.

As an example, an ESP enclosure can provide one or more chambers (e.g., recesses, receptacles, etc.) for one or more sensors and, for example, associated electronics. As an example, a sensor can be located in a chamber and separated from well fluids, for example, via a window plug that is dimensioned to allow the sensor to be in close proximity to a target (e.g., a shaft, a target or targets on and/or in a shaft, etc.).

As an example, a system can include an annular groove in a housing, in a window, a window plug, etc., where the annular groove can accept at least a portion of an O-ring and/or other seal mechanism. As an example, sensor may include an annular groove that can seat an O-ring and/or other seal mechanism.

As an example, an O-ring seal can be a face seal (e.g., rather than piston seal). For example, consider an O-ring seal implemented under a flange of a window (e.g., a window plug), a sensor, etc. As an example, a seal element may be metal, alloy and/or elastomeric.

As an example, a system may include one or more seal mechanisms based at least in part on pressure difference expected to be experienced in a system. For example, where there is substantially little pressure difference across a window, the sealing demands may be less than where there is a substantial pressure difference across the window (e.g., a window plug).

Figure 20:
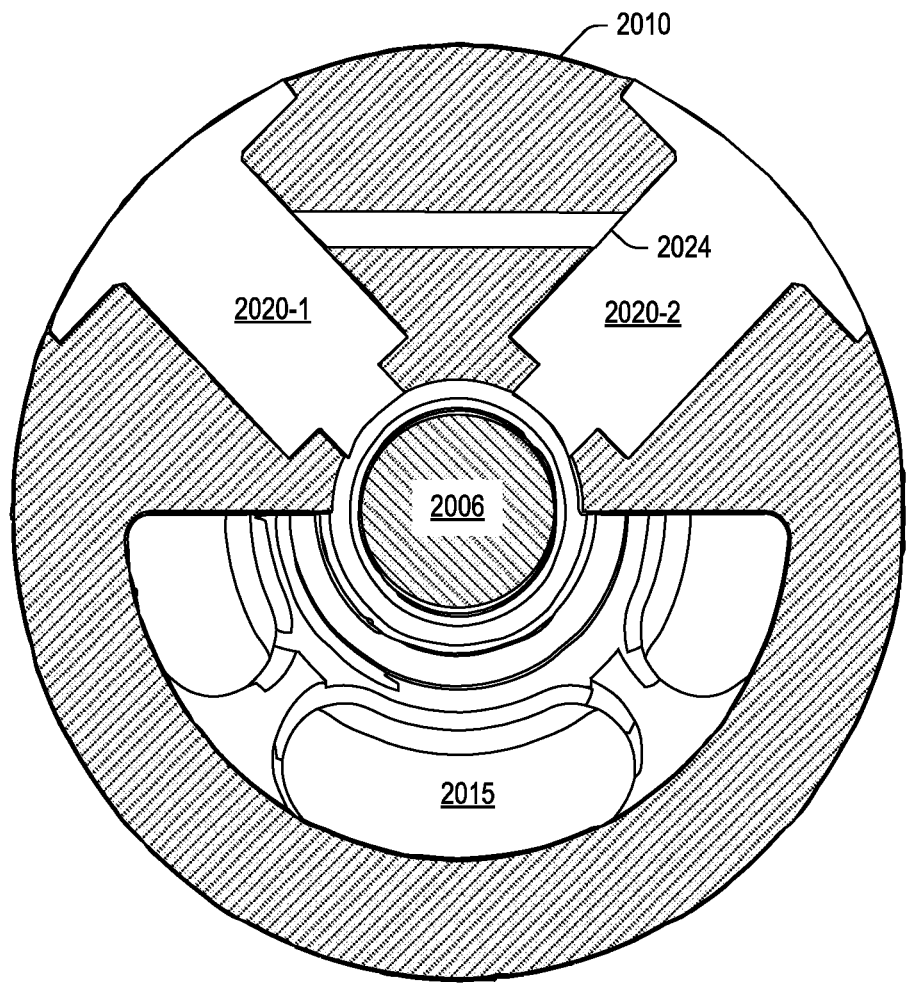
FIG. 20 illustrates an example of a system.

FIG. 20 shows an example of a system 2000 that includes a shaft 2006 and a housing 2010 that defines a flow passage 2015, recesses 2020-1 and 2020-2 and a passage 2024 between the recesses 2020-1 and 2020-2. In such an example, one or more wires, optical fibers, etc. may be disposed in the passage 2024. As an example, one or more batteries may be disposed in the passage 2024 where circuitry in the recess 2020-1 and circuitry in the recess 2020-2 may be operatively coupled to at least one of the one or more batteries.

As an example, a proximity sensor can be encased in a chamber located in close proximity to a target and, for example, at least in part outside an enclosure (e.g., outside of a housing of an ESP, etc.). In such an example, a system can include one or more sensors with minimal interference as to internal components. As an example, a sensor arrangement could be at an enclosure including a housing portion or at a tandem connection portion (e.g., a tandem joint location).

Figure 21:
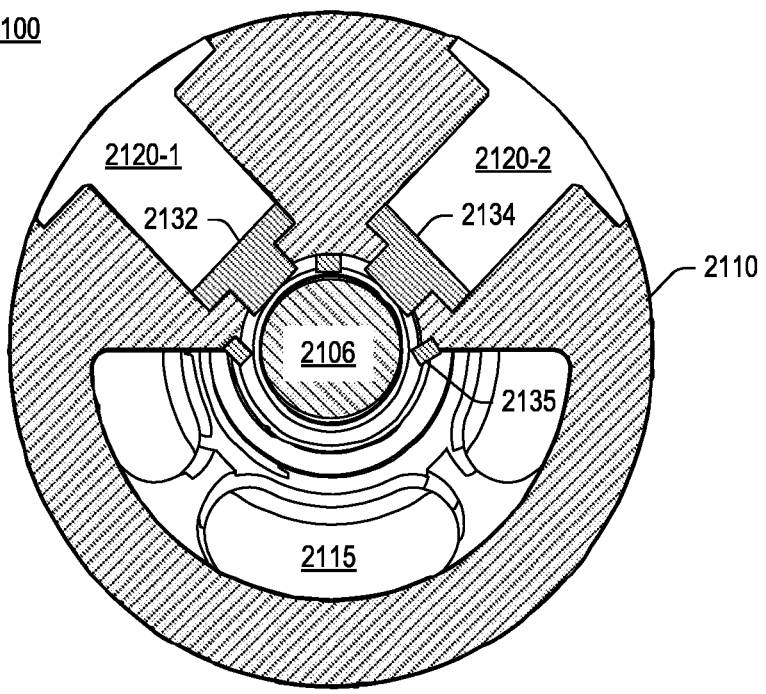
FIG. 21 illustrates an example of a system.
Figure 21:
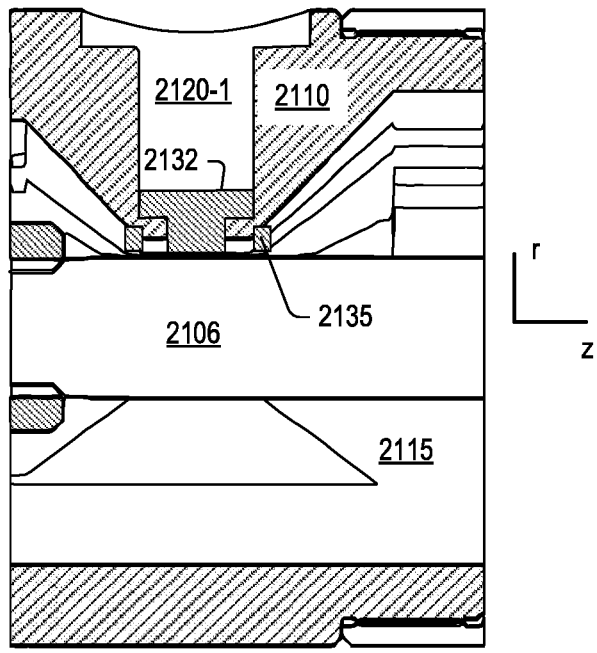

FIG. 21 shows an example of a system 2100 that includes a shaft 2106 and a housing 2110 that defines flow passage(s) 2115 and recesses 2120-2 and 2120-2. In the example of FIG. 21, one or more flow protection components 2135 can be included to protect one or more sensors 2132 and 2134 (e.g., optionally set in windows, etc.) from fluid flow, which may include particulate matter (e.g., sand, etc.).

As an example, a proximity sensor can have features that protect it from the effects of internal ESP flow (e.g., flow in the flow passage(s) 2115). Such features may modify the flow pattern around a proximity sensor to reduce wear while minimizing measurement interference. As an example, such features can be one or more of downstream, upstream or in a common radial plane of one or more sensors. As an example, features can completely or partially surround a sensor. As an example, features can be built-in to an enclosure or be separate attachments. As an example, material or materials of construction of one or more flow protection components may be metallic where compatible with a sensor or sensors. As an example, material or materials may be ceramic with suitable wear resistance characteristics.

As an example, a window may be surrounded closely by a metallic material, for example, as long as there is no metal or other conductor between a sensing face and a shaft.

As an example, a shaft can be protected by a non-conducting material, for example, consider a ceramic bearing sleeve so that the shaft diameter itself does not change over the lifetime of the pump and measurements are not subject to drift in the mechanical distances being measured.

As an example, a system can include a composite sensor casing. For example, consider a sensor face that is unobstructed by conductors and protected from an environment within a housing (e.g., an ESP housing) via one or more components that can withstand pressure differences. As mentioned, a thickness of a window portion of a plug (e.g., a window plug) can be relatively small, particularly where a sensor has a limited range.

Figure 22:
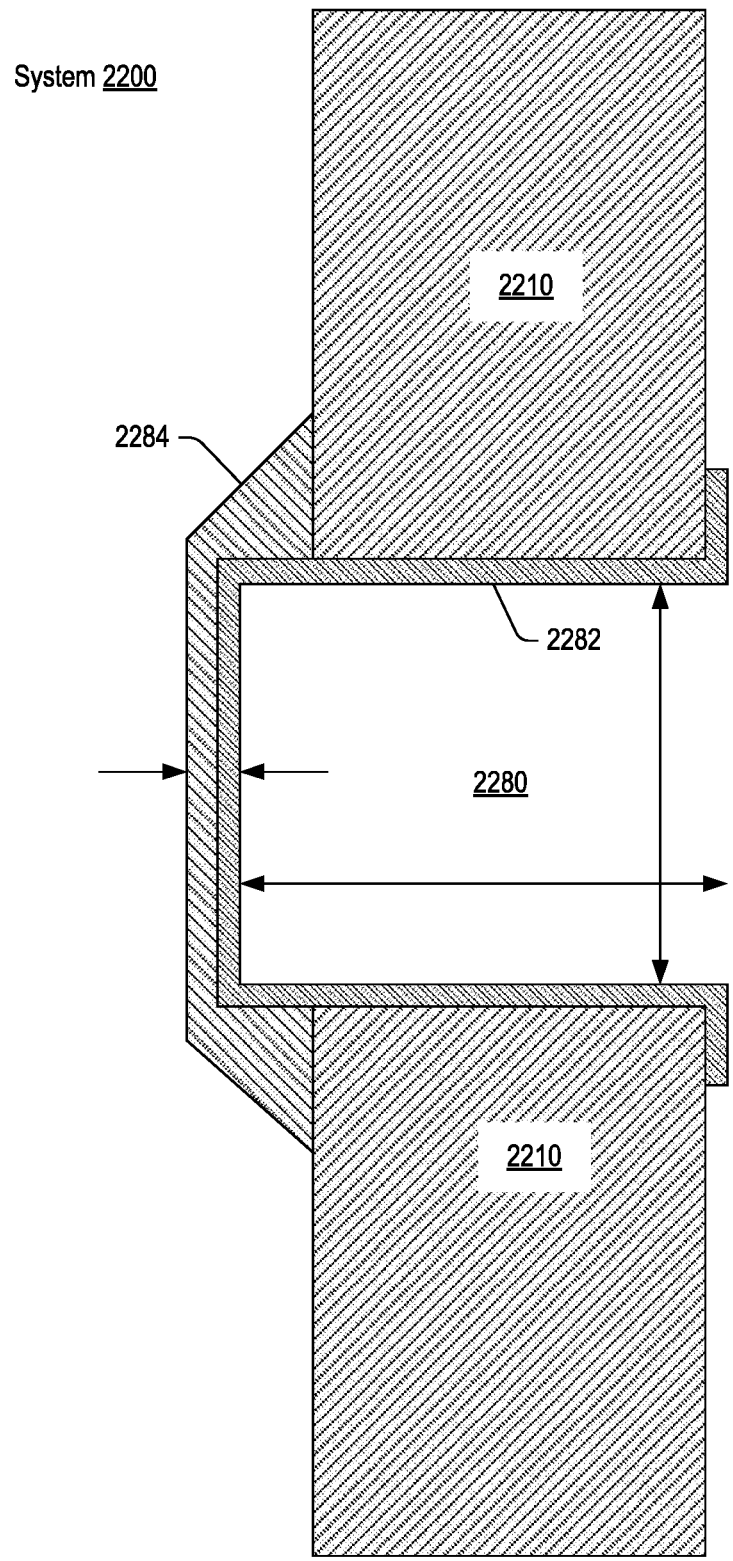
FIG. 22 illustrates an example of a system.

FIG. 22 shows an example of a system 2200 that includes a housing 2210, a cavity 2280, a cavity liner 2282 and a cap 2284. In such an example, the functions as to pressure and environmental protection can be distributed. For example, a pressure vessel can be effectively created from a non-conductor with adequate strength, for example, consider one or more of carbon-fiber epoxy resin composite, glass fiber reinforced plastic (GFRP) and an engineering plastic such as, for example, PEEK.

In the example of FIG. 22, the cavity liner 2282 can be a structural casing that defines a pressure vessel and the cap 2284 can be a hardened protective coating or component that can protect a portion of the cavity liner 2282 that extends past a surface of the housing 2210, which may be exposed, for example, to fluid, which may include particulate matter.

As an example, the hardness and toughness of material of the cavity liner 2282 can be selected as to pressure demands while material of the cap 2284, which may be under compression but not tension or bending, may be selected from a different material. For example, the cap 2284 may be selected as to hardness and anti-corrosive properties. As an example, consider one or more of the following types of materials for construction of the cap 2284: ceramics (e.g., tungsten carbide, boron carbide, silicon carbide, zirconia, etc.) and synthetic sapphire.

As an example, the cavity 2280 can be a pressure vessel that can include one or more sensors. As an example, the cavity liner 2282 may be reinforced by a sensor itself (e.g., which can include a coil), optionally set via potting compound (e.g., used to fill a cavity that includes a sensor coil therein).

In the example of FIG. 22, a sensor can be located at least in part in the cavity 2280, which may be a lower pressure area when compared to the space exterior to the housing 2210 (e.g., to the left). As an example, a structural casing can provide a pressure vessel function while a hardened protective coat can protect against erosion, abrasion, and corrosion.

Figure 23:
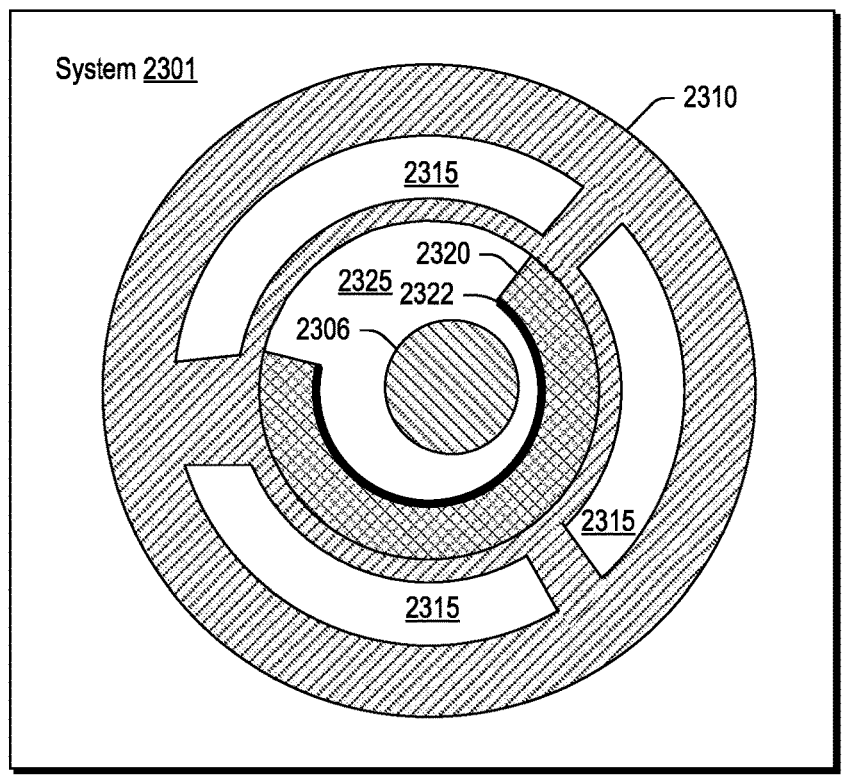
FIG. 23 illustrates an example of a system.
Figure 23:
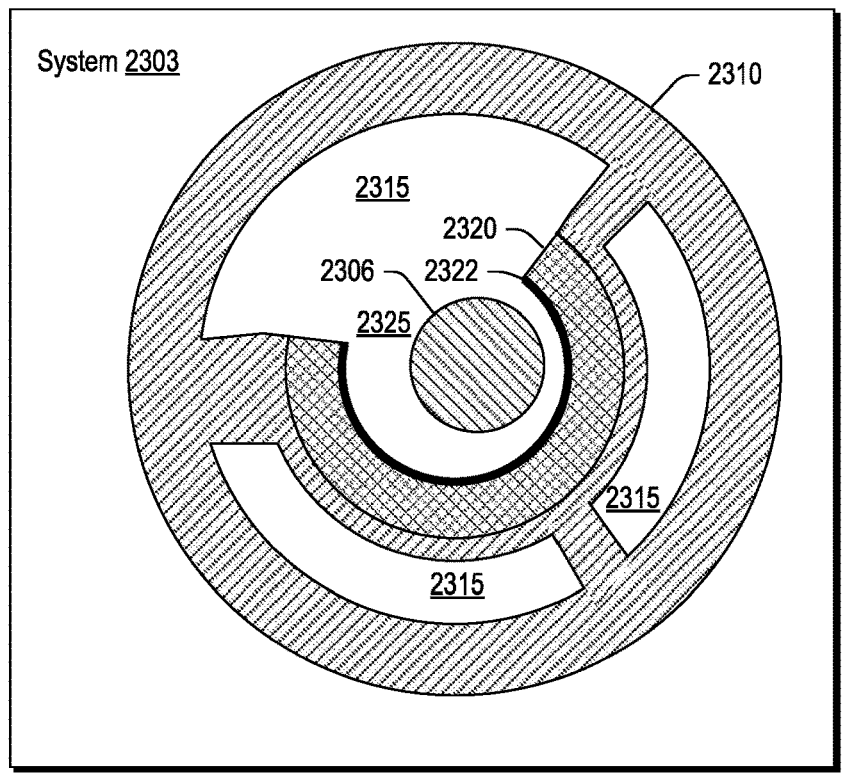

FIG. 23 shows an example of a system 2300 that includes a shaft 2306 and a housing 2310 that defines flow regions 2315 and a region for an integrated sensor package 2320. As shown, the integrated sensor package 2320 can include an inner wall 2322 that is disposed about the shaft 2306 where sensors 2332, 2334 and 2336 can be directed at the shaft 2306. As an example, the integrated sensor package 2320 can include circuitry 2362 that is operatively coupled to the sensors 2332, 2334 and 2336. As shown, a lead 2352 may be a wire or wires that pass through a passage in the housing 2310 to access the integrated sensor package 2320.

As an example, a sensor package can be created as a standalone, sealed package with feedthrough. As an example, an integrated sensor package can be dimensioned to slot into a portion of a system such as, for example, a pump head or housing (e.g., akin to a bearing assembly or a pump diffuser stage).

As an example, an integrated sensor package can be a ring, which may provide structural rigidity and slots into a pump head and/or housing and be secured in place. As an example, fluid can flow around a portion of such a sensor package and through a portion of the sensor package. As an example, one or more parts exposed to fluid flow can be protected by a hardened case, for example, consider a ceramic that is hard and not conductive (see, e.g., the wall 2322). As an example, shape of one or more portions can be conditioned to suit flow.

Figure 24:
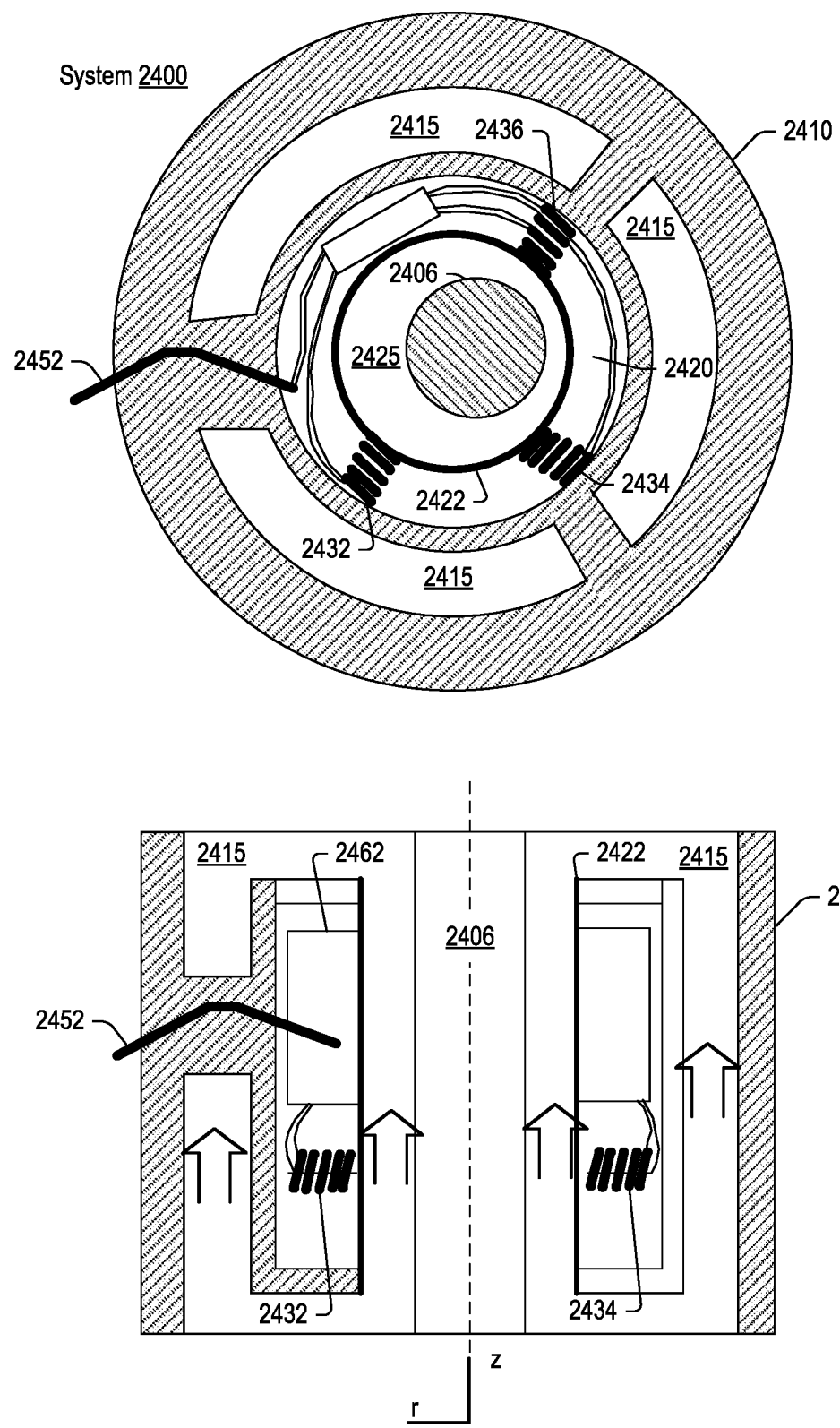
FIG. 24 illustrates an example of a system.

FIG. 24 shows examples of systems 2401 and 2403 that include a shaft 2406, a housing 2410 and a sensor package 2420. In these examples, the sensor package 2420 is less than a full 360 degrees. As shown, the housing 2410 defines flow regions 2415 and 2425 where, in the example system 2401, the flow region 2425 is separated by a wall from the flow region 2415 and where, in the example system 2403, the flow region 2425 is open to one of the flow regions 2415. In the examples of FIG. 24, the sensor package 2420 includes a wall 2422, which may, for example, extend over ends of the sensor package 2420.

Figure 25:
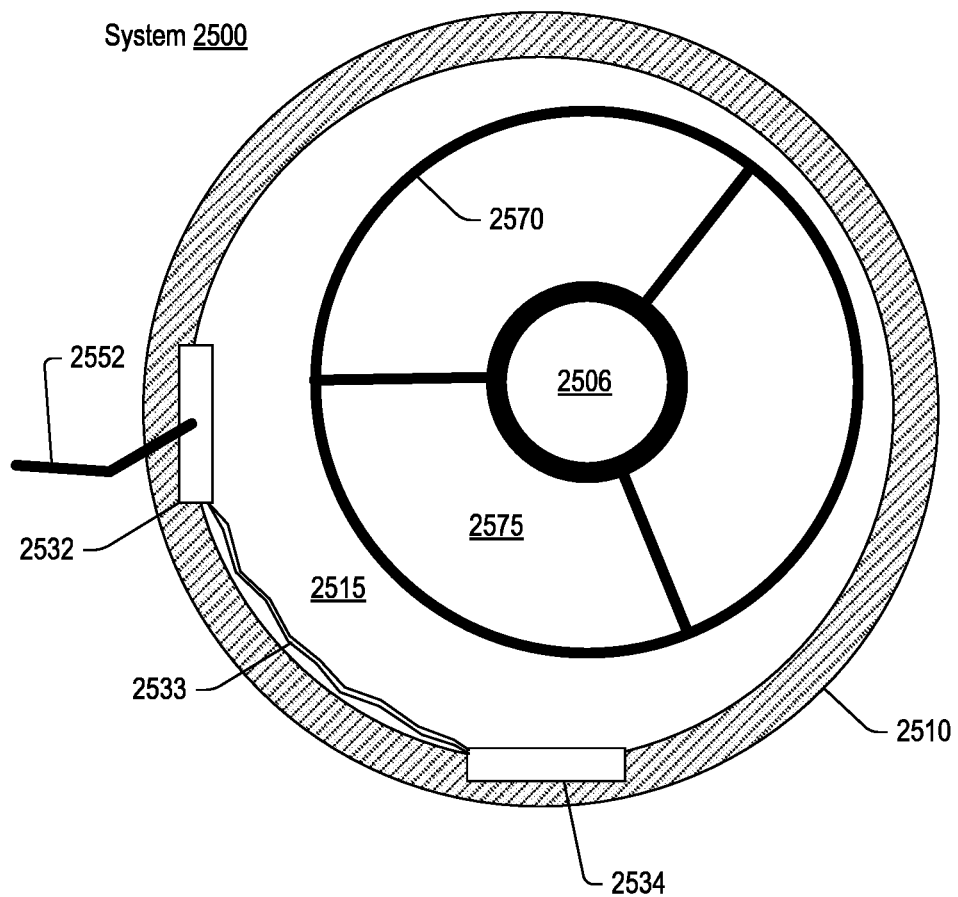
FIG. 25 illustrates an example of a system.
Figure 25:
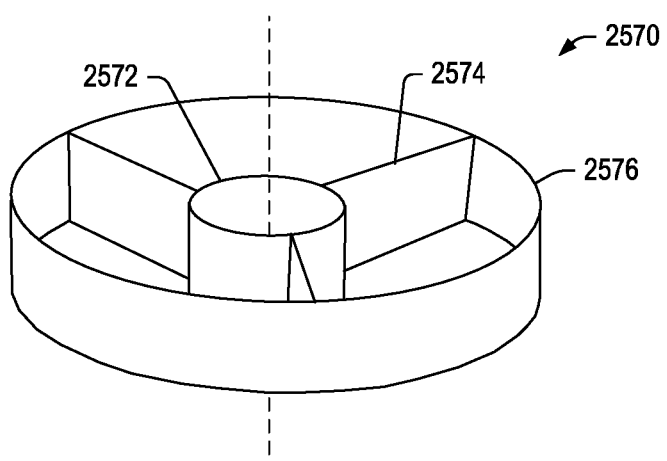

FIG. 25 shows an example of a system 2500 that includes a shaft 2506, a housing 2510, sensors 2532 and 2534, wire 2533, a lead 2552 and a wheel 2570. As shown, the wheel 2570 can be coupled to the shaft 2506 and can include a hub 2572, spokes 2574 and a rim 2576. In such an example, flow spaces 2575 may be defined between the spokes 2574 and the rim 2576 can define a boundary with a flow space 2515. In the example of FIG. 25, the sensors 2532 and 2534 can sense one or more aspects of the rim 2576 such as, for example, proximity of the rim 2576 to the sensors 2532 and 2534.

Figure 26:
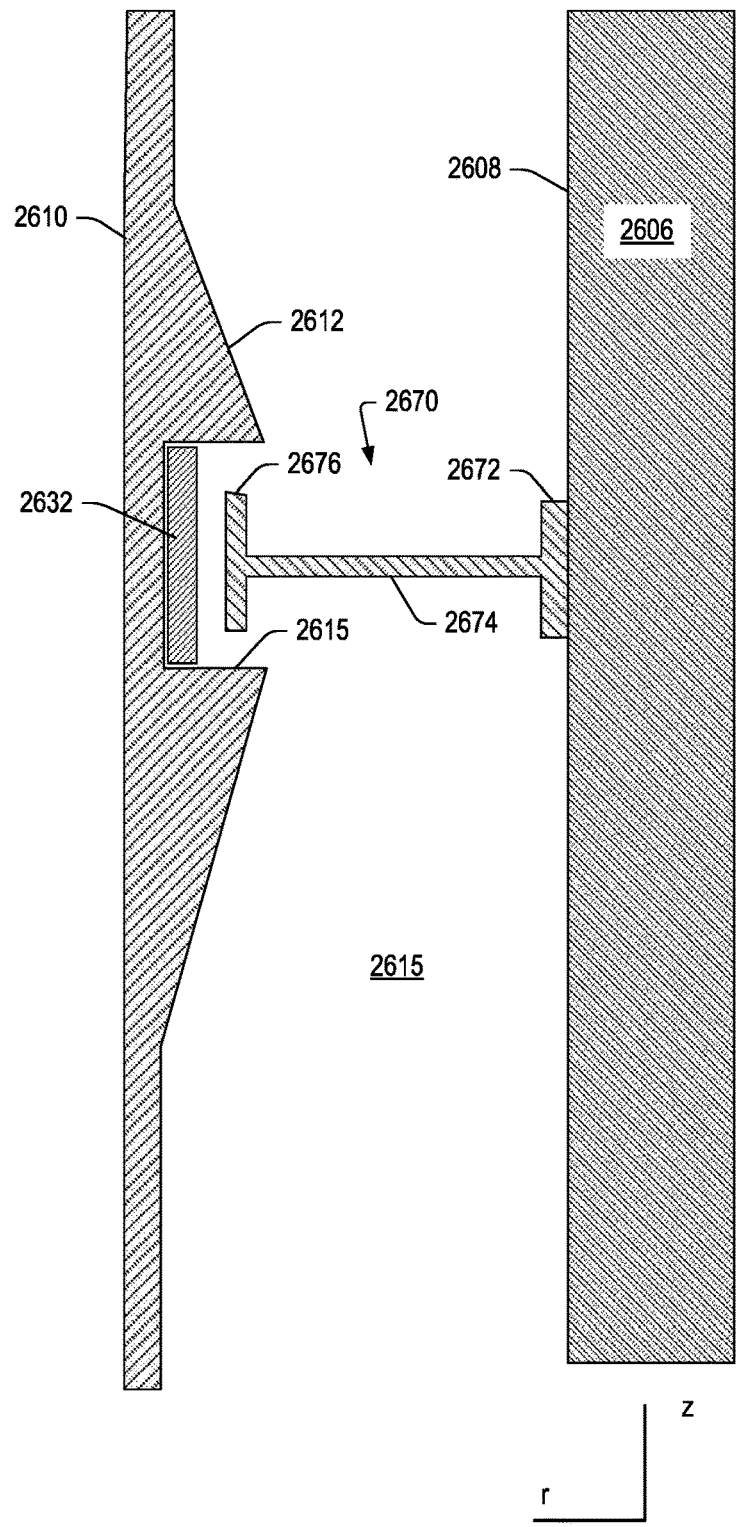
FIG. 26 illustrates an example of a system.

FIG. 26 shows an example of a system 2600 that includes a shaft 2606, a housing 2610 that includes an inner surface 2612 that defines a recess 2615 where a sensor 2632 is seated in the recess 2615 and where a flow space is defined between the housing 2610 and the shaft 2606. In the example of FIG. 26, a wheel 2670 is coupled to the shaft 2606 (e.g., fixed to the shaft 2606). As shown, the wheel 2670 includes a hub 2672, a bridge 2674 (e.g., a spoke) and a rim 2676. In the example of FIG. 26, the inner surface 2612 of the housing 2610 can decrease in diameter to a particular diameter to one axial side of the recess 2615 and can decrease in diameter to a particular diameter to the other axial side of the recess 2615 such that the recess 2615 is protected from flow in the flow space 2615.

Figure 27:
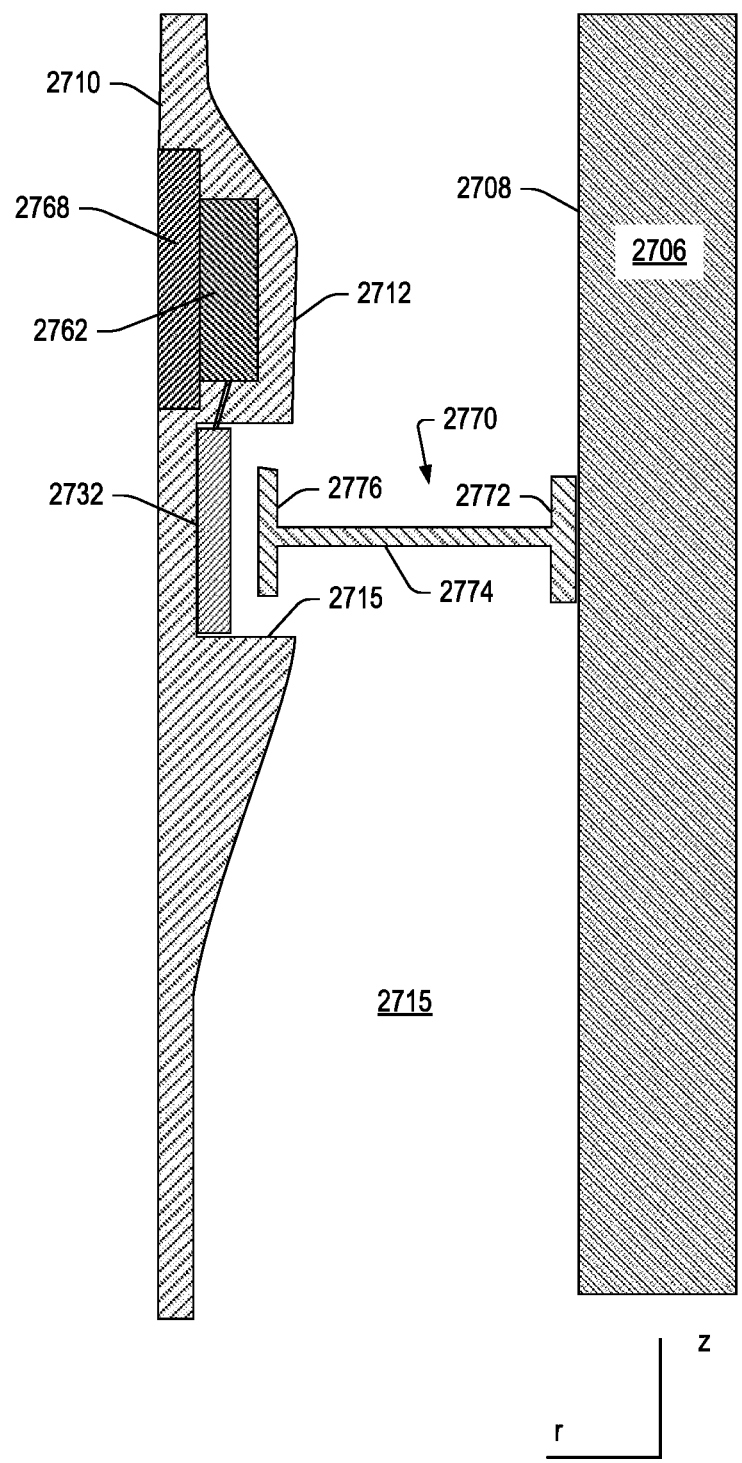
FIG. 27 illustrates an example of a system.

FIG. 27 shows an example of a system 2700 that includes a shaft 2706, a housing 2710 that includes an inner surface 2712 that defines a recess 2715 where a sensor 2732 is seated in the recess 2715 and where a flow space is defined between the housing 2710 and the shaft 2706.

In the example of FIG. 27, a wheel 2770 is coupled to the shaft 2706 (e.g., fixed to the shaft 2706). As shown, the wheel 2770 includes a hub 2772, a bridge 2774 (e.g., a spoke) and a rim 2776. In the example of FIG. 27, the inner surface 2712 of the housing 2710 can decrease in diameter to a particular diameter to one axial side of the recess 2715 and can decrease in diameter to a particular diameter to the other axial side of the recess 2715 such that the recess 2715 is protected from flow in the flow space 2715.

In the example of FIG. 27, the housing 2710 can include a circuitry recess that can seat circuitry 2762 and a cap 2768. In such an example, the cap 2768 may be removable to access the circuitry 2762. As shown in FIG. 27, the circuitry 2762 is electronically coupled to the sensor 2732.

In the example of FIG. 27, the recess 2715 may be of a desired axial length. For example, a length may be selected based on a sensor dimension, a rim dimension, an expected amount of axial movement of a rim, etc.

Figure 28:
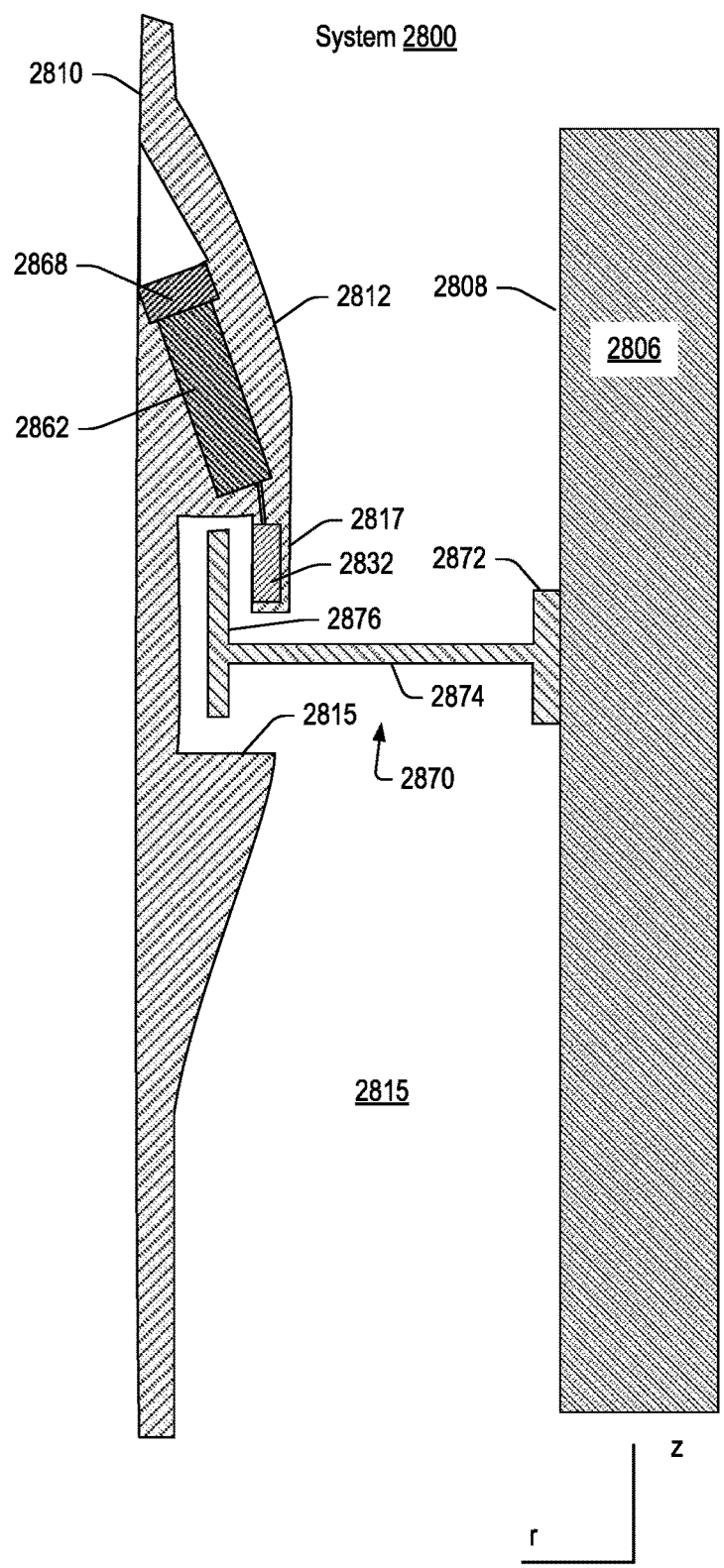
FIG. 28 illustrates an example of a system.

FIG. 28 shows an example of a system 2800 that includes a shaft 2806, a housing 2810 that includes an inner surface 2812 that defines a recess 2815 where a sensor 2832 is seated in the recess 2815 and where a flow space is defined between the housing 2810 and the shaft 2806.

In the example of FIG. 28, the inner surface 2812 of the housing 2810 can decrease in diameter to a particular diameter to one axial side of the recess 2815 and can decrease in diameter to a particular diameter to the other axial side of the recess 2815 such that the recess 2815 is protected from flow in the flow space 2815.

In the example of FIG. 28, the sensor 2832 is seated in a wall that defines the recess 2815, which may be an overhanging wall 2817. In such an example, the sensor 2832 is facing outwardly, away from the shaft 2806. As an example, a sensor may be positioned to reduce erosion that may occur due to particles in fluid. For example, the overhanging wall 2817 may help to reduce flow of particles to a region such as a window region where a sensor may be positioned.

In the example of FIG. 28, a wheel 2870 is coupled to the shaft 2806 (e.g., fixed to the shaft 2806). As shown, the wheel 2870 includes a hub 2872, a bridge 2874 (e.g., a spoke) and a rim 2876. As an example, the rim 2876 may be slotted and the overhanging wall 2817 may be of an arcwise span such that the rim 2876 can positioned with respect to the housing 2810. Once positioned, the shaft 2806 may be inserted into the hub 2872 of the wheel 2870. As an example, a housing can include a joint that allows for insertion of a shaft and a wheel as an assembly. For example, the recess 2815 may be defined by two components of a housing that can be joined.

In the example of FIG. 28, the housing 2810 can include a recess that can seat circuitry 2862 and a cap 2868. In such an example, the cap 2868 may be removable to access the circuitry 2862. As shown in FIG. 28, the circuitry 2862 is electronically coupled to the sensor 2832. As an example, the recess that seats the circuitry 2862 may be drilled into the housing 2810, for example, to define a cylindrical recess.

As an example, a wheel may include a radius or diameter that acts to increase speed with respect to a sensor or sensors. For example, a circumference of a shaft may be at a first diameter and a circumference of a rim of a wheel may be at a second diameter where the second diameter is larger than the first diameter. In such an arrangement the linear velocity of the circumference of the rim is greater than the linear velocity of the circumference of the shaft. As an example, a linear velocity of a circumference of a rim may be of the order of meters per second during operation of an electric motor driven shaft, for example, consider an operational range from about 0.5 meters per second to about 30 meters per second; noting that the linear velocity can be dependent on the size of wheel (e.g., wheel diameter, etc.).

Figure 29:
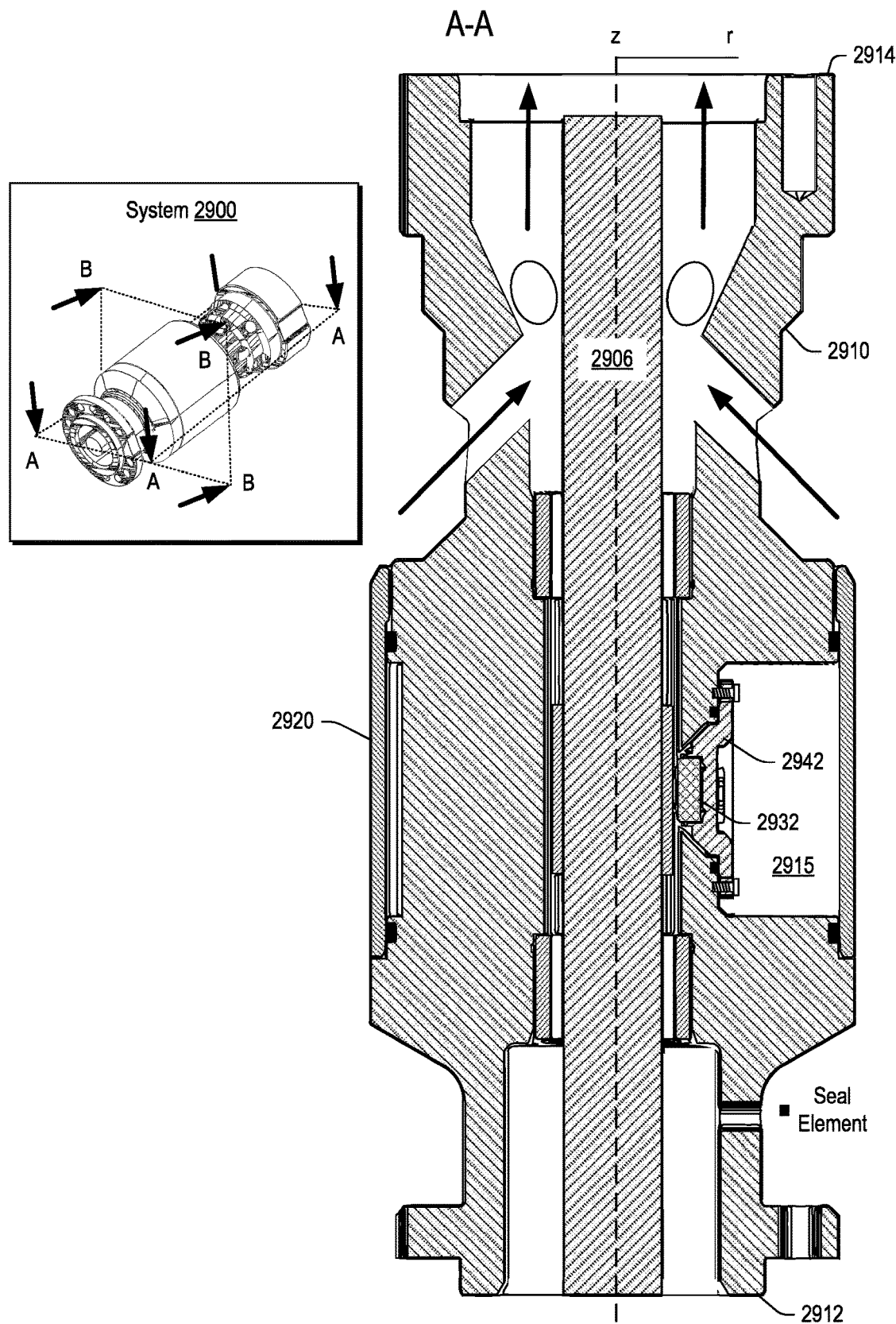
FIG. 29 illustrates an example of a system.

FIG. 29 show an example of a system 2900 that includes a shaft 2906 and a housing 2910 with opposing ends 2912 and 2914 that can include one or more coupling features (e.g., flange features, etc.).

As shown in a cutaway view along a plane A-A, the system 2900 includes a recess 2915 that can be covered by a cap 2920, which may be at least in part cylindrical (e.g., a cylindrical wall).

As shown in the example of FIG. 29, a sensor 2932 is coupled to a sensor housing 2942 to form a sensor assembly that can be accessed via the recess 2915.

Figure 30:
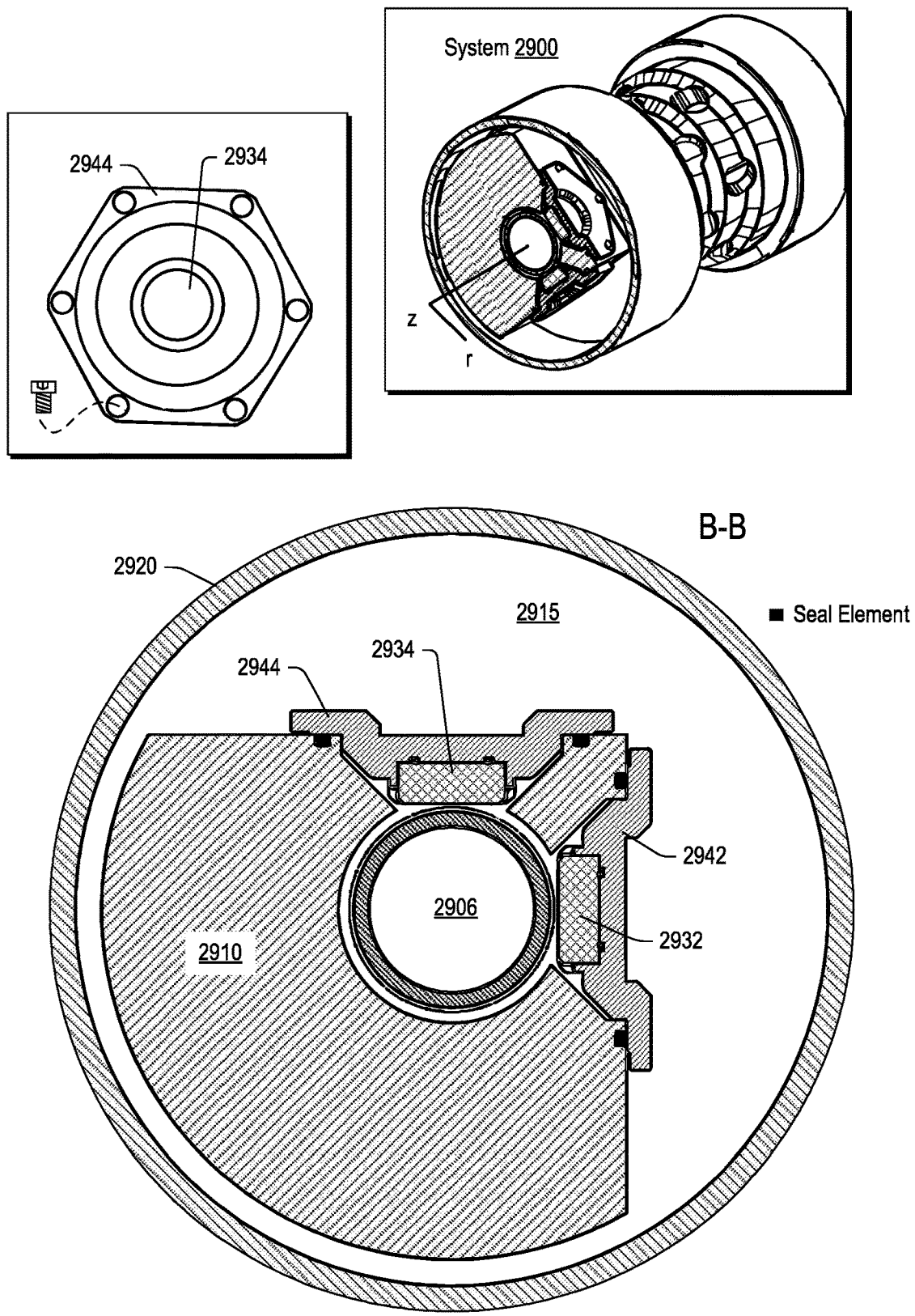
FIG. 30 illustrates an example of a system.

FIG. 30 shows cutaway views of the system 2900 across a plane B-B along with a plan view of the sensor assembly that includes the sensor 2932 and the sensor housing 2942. As shown in FIG. 30, the housing 2910 and the cap 2920 define a recess 2915 where two sensors 2932 and 2934 are mounted via respective sensor housings 2942 and 2944. As shown, the sensor assemblies are mounted to the housing 2910 and directed at the shaft 2906.

As an example, the system 2900 can be part of a pump inlet. As an example, the system 2900 may be disposed axially between an electric motor and a pump where the shaft 2906 can be driven by the electric motor to drive the pump. As an example, the system 2900 can include one or more shaft couplings that can couple the shaft 2906 to one or more other shafts.

Figure 31:
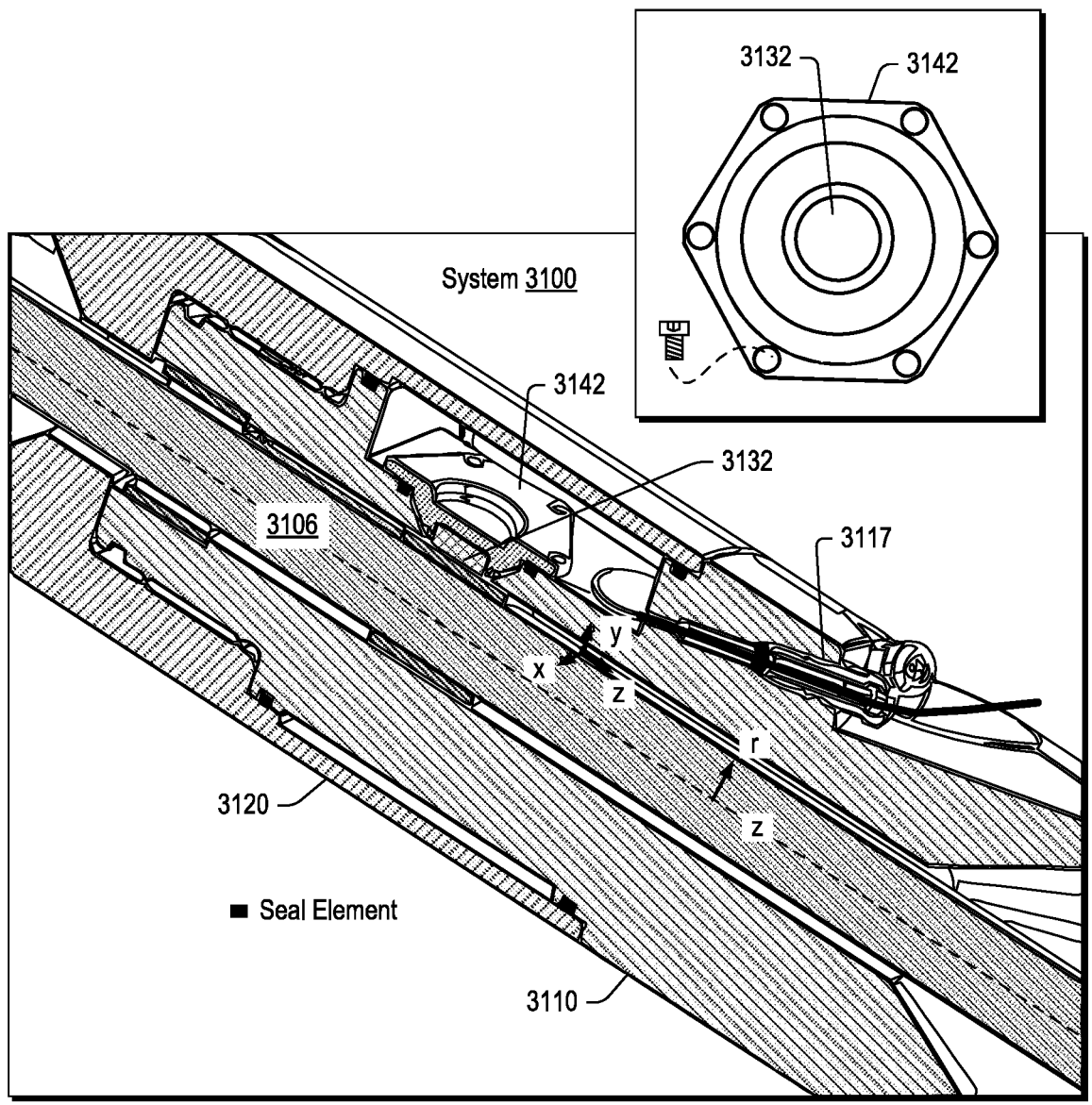
FIG. 31 illustrates an example of a system.

FIG. 31 shows an example of a system 3100 that includes a shaft 3106 and two components 3110 and 3120 that are joined. As shown, the component 3110 includes a sensor assembly that includes a sensor 3132 and a sensor housing 3142. As shown, the component 3110 includes an access port 3117 through which one or more of a wire, an optical fiber, etc. may pass and may be operatively coupled to the sensor 3132, directly and/or indirectly (e.g., via sensor circuitry, etc.).

Figure 32:
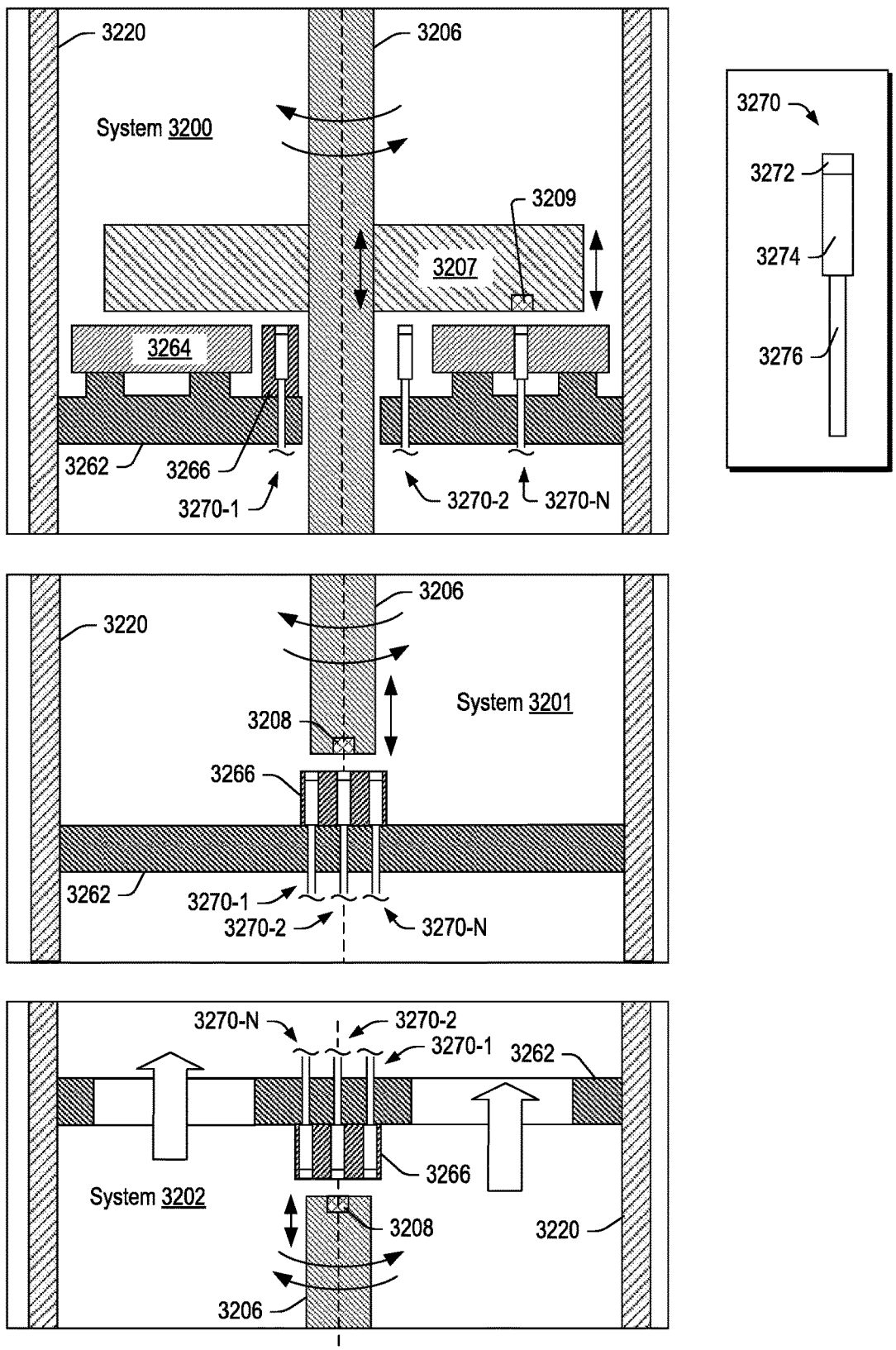
FIG. 32 illustrates examples of equipment.

FIG. 32 shows examples of systems 3200, 3201 and 3202 that include one or more axially directed sensors 3270. As an example, the sensor 3270 can include a proximity detection circuit or circuitry 3272, a body 3274 that may include one or more additional circuits or circuitry and optionally a cable 3276 that can include one or more conductors (e.g., electrical and/or optical). As an example, the sensor 3270 can be a proximity sensor.

As shown in FIG. 32, the system 3200 includes a shaft 3206, a housing 3220, a runner 3207 connected to the shaft 3206, a sensor support base 3262, one or more pads 3264, one or more sensor enclosures 3266 and one or more sensors 3270-1, 3270-2 and 3270-N. As an example, the runner 3207 may include one or more targets, markers, etc. 3209.

As an example, an end of a sensor may be disposed axially at a position and a pad and/or an enclosure may be disposed axially at a position where the pad and/or the enclosure is or are closer to a surface of a runner than the sensor. In such an example, the pad and/or the enclosure may help to protect the sensor. As an example, in a stationary state (e.g., a non-rotational state) of the shaft 3206, the runner 3207 may contact the pad or pads 3264. In such an example, a clearance can exist between a surface (e.g., lower surface) of the runner 3207 and one or more of the one or more sensors 3270-1, 3270-2 and 3270-N.

As an example, the system 3200 can include a thrust bearing where, for example, the one or more pads 3264 are thrust pads. In such an example, the housing 3220 may be a housing of a protector (see, e.g., the protector 370 of FIG. 3).

While the system 3200 is shown as including three sensors (e.g., three probes), the number of sensors may differ from three, for example, being fewer (e.g., one or two) or more (e.g., more than three). As an example, one or more sensors may be mounted near thrust pads. As shown, the sensor 3270-1 is disposed at least in part in the protective sensor enclosure 3266, which may, for example, aim to substantially match thermal expansion of the one or more pads 3264 and/or aim to protect the sensor 3270-1 from vibration. As shown, the sensor 3270-2 is positioned an axial distance from the one or more pads 3264 and near the runner 3207. As shown, the sensor 3270-N is disposed within one of the one or more pads 3264.

As an example, a thrust pad can include a sensor or sensors that can include one or more proximity sensors. In such an example, the thrust pad may be included in a housing such as, for example, a protector housing of an electric submersible pump (ESP) system.

As shown in FIG. 32, the system 3201 and the system 3202 each include a shaft 3206, a housing 3220, a support 3262, a sensor enclosure 3266 and one or more sensors 3270-1, 3270-2 and 3270-N. In the example systems 3201 and 3202, the one or more sensors 3270-1, 3270-2 and 3270-N are positioned an axial distance from an end of the shaft 3206, which may include one or more targets, markers, etc., indicated by a label 3208.

As an example, a sensor may be positioned in a manner whereby an edge of the shaft 3206 is axially aligned with a sensor aperture. In such an example, a sensor signal may exhibit an amount of overlap between an end surface of the shaft and the sensor aperture. In such an example, the amount of overlap may be utilized to determine a shift of the shaft 3206 from a longitudinal axis such as, for example, a longitudinal axis of the housing 3220. As an example, two or more sensors may be arranged in such a manner (e.g., consider two sensors or more). As an example, the sensor 3270-2 may be aimed at the target 3208 where an amount of overlap may be sensed, for example, to determine a displacement of the target 3208, which may infer a displacement of the rotational axis of the shaft 3206.

As an example, a sensor may be an axial proximity sensor that senses proximity of an end of a shaft, which may be a rotating shaft or a stationary shaft. For example, consider the sensor 3270-2 generating a proximity signal for the shaft 3206 in a stationary state and generation a proximity signal for the shaft in a rotational state. In such an example, an amount of axial shift or axial shifting may be determined. As an example, an amount of axial shift of a shaft between a stationary state and a rotational state may indicate an amount of wear of one or more components. As an example, one or more such proximity signals may be acquired (e.g., proximity measurements) for one or more rotational speeds of the shaft 3206. In such an example, amounts of axial displacement of the shaft 3206 may be tracked with respect to rotational speed, optionally at one or more times (e.g., over an extended operational period). As an example, amounts of axial displacement of a shaft may be analyzed to determine wear and/or other information germane to health of a system (e.g., an ESP system, etc.).

As an example, a system can include one or more proximity sensors at an end or one or more proximity sensors at ends of a shaft. For example, at a top end of a shaft (see, e.g., the system 3202), as may be defined by orientation of a shaft with respect to gravity, an axial distance may be determined and/or at a bottom end of the shaft (see, e.g., the system 3201), a distance may be determined. As an example, one or more end measurements as to distance may provide for an indication of compression of a shaft. As an example, where a system includes a thrust bearing and a runner, one or more measurements as to distance can be utilized to assess risk of contact between the thrust bearing and the runner where, for example, touching may possible lead to failure.

Figure 33:
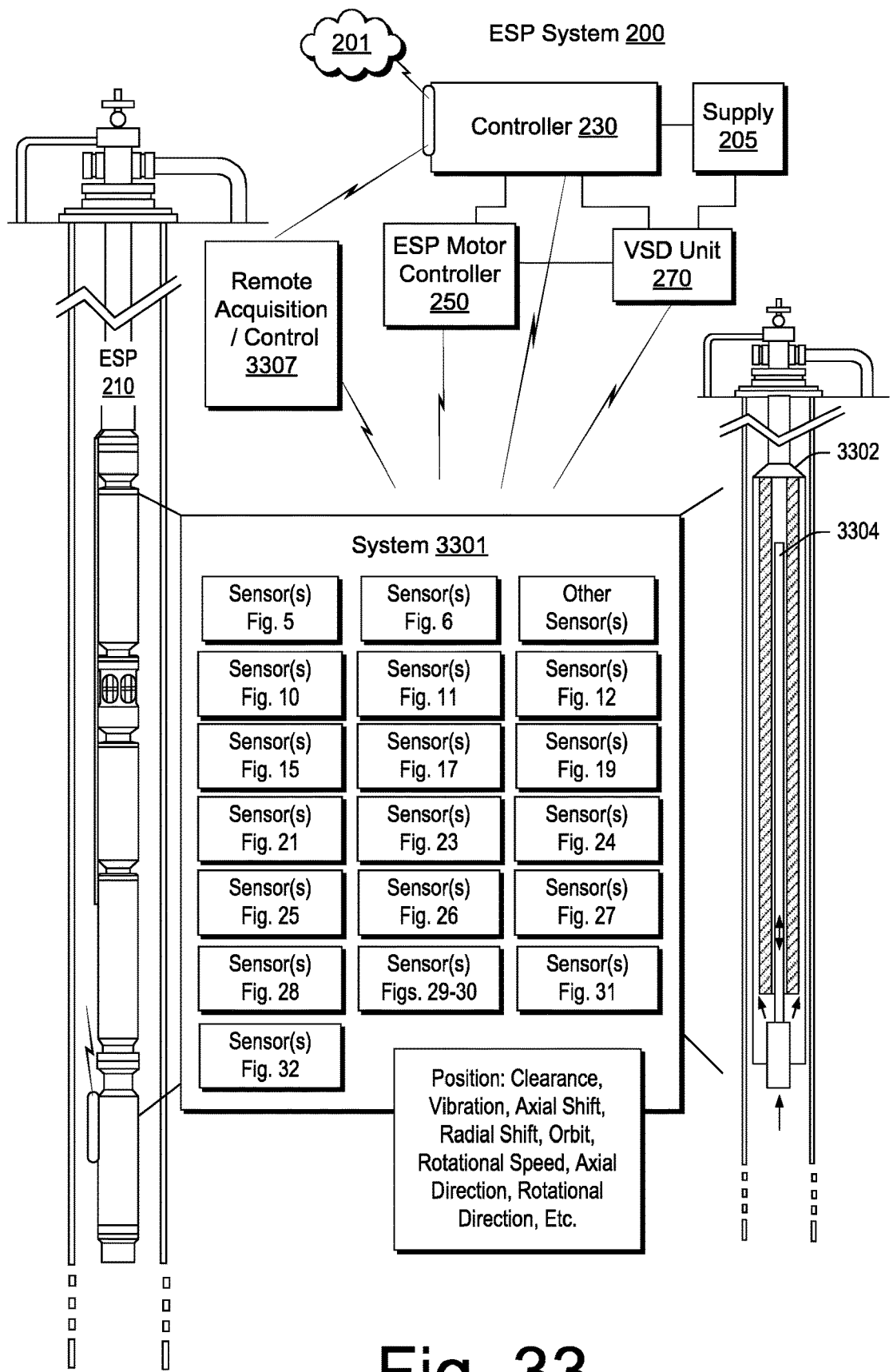
FIG. 33 illustrates examples of equipment.

FIG. 33 shows an example of the ESP system 200 as including one or more features of a system 3301. As shown, the ESP system 200 may include the ESP 201 with a rotating shaft driven by an electric motor or an ESP 3302 with a reciprocating shaft 3304 driven by an electric motor (e.g., linear permanent magnet motor, etc.); noting that the shaft 3304 may be part of the motor (e.g., include one or more permanent magnets). The ESP system 200 may include one or more of the sensors of FIGS. 5, 6, 10, 11, 12, 15, 17, 19, 21, 23, 24, 25, 26, 27, 28, 29, 30, 31 and 32 and/or optionally one or more other sensors. As an example, a sensor may be internal, external and/or internal and external to a housing of the ESP 201 or the ESP 3302.

As an example, a system can include a housing that defines an interior space where the housing includes a longitudinal axis; a shaft disposed at least in part in the interior space of the housing where the shaft includes a longitudinal axis, a curved surface and an end surface; a submersible electric motor operatively coupled to the shaft where the submersible electric motor includes a cable connector; two proximity sensors where each of the proximity sensors includes a sensor aperture disposed in the interior space of the housing; and circuitry operatively coupled to the proximity sensors that determines position values of the shaft with respect to time based at least in part on output of the proximity sensors. In such an example, the circuitry can be disposed in the interior space of the housing. As an example, a proximity sensor may be positioned with respect to a window where a window plug may be made of a material that does not substantially interfere with sensing by the proximity sensor. In such an example, the window plug may seal a portion of an interior space of a housing from another portion of an interior space of a housing. For example, one portion may be in a region where fluid may flow whereas another region may be sealed from such fluid and, for example, include circuitry (e.g., a proximity sensor, circuitry electrically coupled to a proximity sensor, etc.). As an example, a window may be an opening between a space for a proximity sensor and a shaft space where a window plug can be positioned in the window to form a seal between the two spaces. As an example, a window plug may be constructed of a material that does not interfere with electromagnetic energy, for example, when compared to a metallic material such as steel or other conductive material that may form eddy currents when exposed to a field (e.g., a moving field, a time varying field, etc.).

As an example, a system can include circuitry that determines position values based at least in part on curvature of a curved surface, which may be, for example, a curved surface of a shaft or a curved surface of another component. As an example, a system can include a shaft that includes a wheel where a curved surface corresponds to a surface of a rim of the wheel. In such an example, the wheel may be fixed to the shaft such that rotation of the shaft at a rotational speed rotates the wheel at the same rotational speed, noting that linear speed may differ.

As an example, a system can include two proximity sensors that are disposed in a transverse plane, directed toward an intersection point and separated by an arc distance. In such an example, the intersection point can be a point that is within a shaft such as, for example, an initial longitudinal axis point of the shaft prior to wear, etc., of one or more components that may cause the longitudinal axis of a shaft deviate, shift, etc., from an initial longitudinal axis. As an example, proximity sensors may be initially installed with a known amount of offset where such offset can be taken into account when determining position values of a shaft.

As an example, a sensor can include a sensor aperture that is defined at least in part by a coil where, for example, the coil includes a substantially circular coil or a substantially rectangular coil (see, e.g., the sensor 1532-1 of FIG. 15). As an example, a coil may be defined by a length and a width and may be oriented where its length is aligned in a direction of a longitudinal axis of a shaft or where its width is aligned in a direction of a longitudinal axis of a shaft. As an example, a system can include two coils where one is oriented in one manner and where the other is oriented in another manner. In such an example, the coils may be used to measure and/or generate signals associated with position of a shaft where the shaft may include one or more targets. As an example, a system can include an assembly such as the assembly 1501 of FIG. 15 and an assembly such as the assembly 1503 of FIG. 15 where two coils are included with different orientations, optionally associated with a common target or with different targets.

As an example, a system can include circuitry that determines runout based at least in part on position values. As an example, a system can include circuitry that determines an orbit of a longitudinal axis of a shaft based at least in part on position values. As an example, a system can include circuitry that determines direction of rotation of a shaft based at least in part on position values, rotation speed of a shaft based at least in part on position values or direction of rotation and rotation speed of a shaft based at least in part on position values. As an example, a system can include circuitry that determines an axial shift of a shaft based at least in part on position values. As an example, such circuitry may determine direction of axial shift. As an example, circuitry may determine lateral and/or axial vibration information for a shaft based at least in part on position values.

As an example, an orbit of a shaft may be a two-dimensional orbit or a three-dimensional orbit. For example, where a center point of a shaft along a longitudinal axis of the shaft moves in a plane, the orbit may be considered to be two-dimensional and where such a center point moves upwardly and/or downwardly from the plane, the orbit may be considered to be a three-dimensional orbit.

As an example, a system can include a shaft that includes at least one target. In such an example, a target may be an integral part of the shaft, mounted to the shaft or a treated surface of the shaft. As an example, as to the target 1531-4 of FIG. 15, such a target may result in some amount of unbalance due to asymmetry. As an example, such a target may be weighted such that the shape is asymmetric yet the center of mass (e.g., center of gravity) does not result in unbalance. For example, the extended radial portion may be hollow while a portion closer to the shaft is solid such that the overall center of mass is aligned with a centerline that is along a longitudinal axis of the shaft 1506. As an example, balance weights may be utilized to account for unbalance attributable to a target such that a shaft remains balanced for purposes of rotation about a longitudinal axis of the shaft.

As an example, a system can include circuitry that includes frequency domain conversion circuitry and/or time domain conversion circuitry. For example, consider Fourier transform and/or inverse Fourier transform circuitry.

As an example, a system can include circuitry that is electrically coupled to a cable connector of a submersible electric motor for transmission of information from the circuitry to the cable connector. In such an example, a cable can be connected to the cable connector where the cable may also be connected to, directly or indirectly, surface equipment (see, e.g., surface equipment of FIG. 2).

As an example, a system can include at least one redundant proximity sensor, at least one reference proximity sensor or at least one redundant proximity sensor and at least one reference proximity sensor (see, e.g., FIG. 12).

As an example, a method can include receiving parameter values for a shaft disposed at least in part in a housing and driven by a submersible electric motor where the parameter values are based at least in part on measurements acquired by proximity sensors disposed in the housing; and determining an operational state of the system based at least in part on the parameter values. In such an example, the parameter values can include at least one member selected from a group of runout values, orbit values, direction of rotation values, rotation speed values and axial shift values. As an example, one or more parameter values can be based at least in part on a frequency domain conversion and/or time domain conversion.

As an example, a method can include utilizing two proximity sensors positioned at a known azimuthal separation to define an intersection point where the intersection point corresponds to a longitudinal axis of a shaft in a stationary state and where parameter values correspond to distances between the intersection point and the longitudinal axis. In such an example, the stationary state may correspond to a "new" state where components of a system are unworn and where a longitudinal axis of a shaft may correspond to a position expected per tolerances, specifications, etc., as to components and assembly processes at a time of manufacture.

As an example, a method can include receiving parameter values via a cable electrically coupled to a submersible electric motor. For example, surface equipment may be electrically coupled to such a cable at one end of the cable where the other end of the cable is electrically coupled to the submersible electric motor (e.g., via one or more cable connectors). In such an example, the cable may include one or more motor lead extensions (MLEs).

As an example, a protector of an electric submersible pump system can include a shaft that includes a longitudinal axis; a thrust bearing; a runner; a proximity sensor; and circuitry that determines axial distance between a surface of the thrust bearing and a surface of the runner based at least in part on output of the proximity sensor.

As an example, a system can include a housing that defines an interior space where the housing includes a longitudinal axis; a shaft disposed at least in part in the interior space of the housing where the shaft includes a longitudinal axis, a curved surface and an end surface; a submersible electric motor operatively coupled to the shaft where the submersible electric motor includes a cable connector; a proximity sensor that includes a sensor aperture disposed in the interior space of the housing; and circuitry operatively coupled to the proximity sensor that determines position values of the shaft with respect to time based at least in part on output of the proximity sensor. In such an example, a target may be of a shape that varies in multiple dimensions. For example, consider the target 1531-4 of FIG. 15. In such an example, the target changes in its scale in an axial direction (e.g., z-axis), where the scale may optionally change linear (e.g., a linear dependence with respect to z distance). Such an approach may utilize a truncated conical shape, a pyramidal shape, etc.

As an example, a z position may be implicit in magnitude of a triangle wave (see, e.g., FIG. 15). As an example, a system may be configured such that lateral movements tend to be small compared to magnitude of a triangle wave, or at a much higher frequency than shaft rotation.

As an example, a single proximity sensor may be utilized to sense position information that is sufficient to determine one or more of a plurality of characteristics of a shaft. For example, consider circuitry that can determine one or more of rotational speed, direction of movement, lateral motion, and axial position based on position information acquired via a single proximity sensor.

As an example, a method can include receiving parameter values based on measurements acquired by proximity sensor(s) adjacent to a shaft driven by a submersible electric motor of a system; and determining an operational state of the system based at least in part on the parameter values. In such an example, the parameter values can be or include runout values.

As an example, a method can include receiving or determining position values as two components (e.g. x, y or r, $\Theta$), as a single component such as radial position (r) or, for example, a time-averaged radial position (e.g., average runout, etc.).

As an example, measurements may be acquired by one, two or more proximity sensor(s). As an example, consider two proximity sensors that are positioned orthogonally or at a known azimuthal separation, to define an intersection point. In such an example, the intersection point may correspond to a longitudinal axis of a shaft in a stationary state. As an example, parameter values may correspond to distances between the intersection point and the longitudinal axis.

As an example, a method can include acquiring measurements via a single analog to digital converter operatively coupled to a multiplexer where the multiplexer allows for receipt of signals from a plurality of sensors.

As an example, a method can include determining parameter values via circuitry operatively coupled to one or more proximity sensors and transmitting the parameter values via transmission circuitry.

As an example, an operational state of a system can be determined based at least in part on a trend in parameter values with respect to time. As an example, a linear increase in a parameter value with respect to time may correspond to an expected wear operational state. For example, wear may be classified as linearly progressive or be classified as non-linearly progressive where wear leading to failure may tend to occur as a form of non-linearly progressive wear. In such an example, linearly progressive may be ordinary or expected wear that can be tracked without calling for action, issuance of an alarm, etc.; whereas, non-linearly progressive wear may trigger a call for action (e.g., control action) and/or issuance of an alarm. As an example, a parameter may be a clearance related parameter that corresponds to clearance between a surface of a bearing and a surface of a shaft that faces the surface of the bearing or a surface of a component mounted to a shaft that faces the surface of the bearing. Over a period of operational time, expected wear may cause the clearance to increase in a linear fashion with respect to time; whereas, unexpected wear may cause the clearance to increase in a non-linear fashion with respect to time.

As an example, an action taken based on a change in a parameter value with respect to time may change the way an ESP operates, for example, consider changing shaft speed. As an example, a method that monitors changes in one or more parameter values with respect to time may monitor for one or more types of monotonic trends, which may be associated with expected wear, and/or may monitor for one or more types of non-monotonic trends, which may be associated with unexpected wear. As an example, types of non-monotonic trends, types of non-linear trends, etc., in one or more parameter values with respect to time can correspond to an undesirable operational state (e.g., a poor health state, etc.) where a controller may respond via taking one or more actions as to operation of an electric motor that drives a shaft. In such an example, an alarm may be issued and optionally an expected trend line or curve adjusted based at least in part on a change in state and/or a change in operation (e.g., per one or more actions). As an example, alarm and/or action limits may be adjusted that correspond to an adjusted expected trend line or curve.

As an example, a system can include one or more sensor and one or more redundant sensors to produce redundant measurements that may be used to reduce uncertainty in error that may exist in one or more measurements.

As an example, a system can include more than two sensors where one or more of the sensors may be utilized, in addition to knowledge of shaft diameter, to monitor and adjust for drift (e.g., changing error over time) in one or more measurements.

As an example, a system can include two or more groups of sensors at different axial locations along a length of a shaft, which may be a pump shaft or a shaft operatively coupled to a pump shaft (e.g., via collar, etc.). As an example, such an approach may aim to avoid making measurements at a node (e.g., of a type of shaft motion), for example, where shaft lateral motion may be close to zero.

As an example, a system can include one or more targets positioned on a shaft where the one or more targets are detectable by at least one sensor. In such an example, a target may be circular in form when viewed looking radially at the shaft. As an example, a target may be triangular in form when viewed looking radially at the shaft. As an example, one or more target can be shaped to logically determine a position of a shaft axially and/or azimuthally and/or radially.

As an example, a shaft can be shaped so that a response of a sensor can be used for calibration; for example, consider a shape with defined waves or ripples in a shape of a shaft.

As an example, a target area of a shaft may be coated with a material that protects the target area from erosion or other damage where the material does not interfere with sensing of the target by a sensor or sensors. For example, a material may be a material that does not form eddy currents when subjected to a field (e.g., a time varying or moving electromagnetic field).

As an example, a system can include sensors that can be operated without mutual interference, for example, via operation in different regimes. For example, consider operation at different electromagnetic frequencies. In such an example, the sensors may be eddy current sensors and/or operate based at least in part on generation of eddy currents in a material. As an example, one or more characteristics of an eddy current or eddy currents may depend on excitation (e.g., generation) frequency. In such an example, a sensor may operate at one frequency and another sensor may operate at another frequency. In such an example, signals measured may be discriminated based at least in part on the operational frequencies. As an example, such sensors may be two sensors that are directed toward a shaft.

As an example, a sensor can include an aperture that is larger than undesirable non-uniformities in a shaft shape. In such an example, the aperture may tend to average out such non-uniformities. As an example, a first sensor may include a first aperture and a second sensor may include a second aperture where the apertures differ in size. In such an example, the apertures may sense different characteristics of a shaft and/or a target or targets. For example, a smaller aperture may aim to sense features associated with a first target where the features include features of a first scale and a larger aperture may aim to sense features associated with a second target where the features include features of a larger, second scale and/or the larger aperture may aim to average the smaller features associated with the first target, which may effectively be a form of filtering.

As an example, filtering of features of a target or target may be achieved using different aperture sizes for different sensors. In such an example, one sensor may be a signal averaging sensor while another sensor may be a raw signal sensor. As an example, such signals may be utilized in an approach such as the approach of the plot 1590 of FIG. 15 where various types of shaft related phenomena may be derived based at least in part on a raw signal and an averaged signal (e.g., using one or more sensors).

As an example, a parameter value can correspond to shaft rotational speed, optionally including direction. As an example, a lateral distance may be used to determine a rotational speed. As an example, shaft speed may be initially estimated to be within a particular range, for example, within about +/−5 Hz of an electrical driving frequency of an electrical motor that drives the shaft. In such an example, a method can include analyzing that part of the spectrum of the lateral distance measurement (e.g., a part of the spectrum that is based at least in part on an electrical driving frequency of a multiphase electric motor). As an example, a peak location of a peak in a spectrum can be used as an indicator of shaft rotational speed. As an example, a frequency resolution of a spectrum of lateral distance measurement can be reduced to less than the reciprocal of the length of a sample, using one or more signal analysis techniques, which may allow for a more accurate estimate of shaft rotational speed.

As an example, a spectral analysis of distance may be used and magnitude and phase of individual harmonics may be compared to noted trends (e.g., as may be available for a type of system that includes a shaft driven by an electric motor). As an example, a spectral analysis of distance may be used and magnitude and phase of individual harmonics may be compared to those of an early time in a life of a system, for example, to help determine a state of the system (e.g., a health state as may be associated with wear, etc.).

As an example, a system can include a shaft that includes a longitudinal axis; a submersible electric motor operatively coupled to the shaft; proximity sensors directed at the shaft; and circuitry that receives information from the proximity sensors and that determines runout values of the shaft with respect to time. In such an example, the circuitry can include circuitry that receives information from the sensors and that determines axial shift values of the shaft with respect to time.

As an example, circuitry can include circuitry that receives information from sensors and that determines rotational speed values of a shaft with respect to time. As an example, circuitry can include circuitry that receives information from sensors and that determines orbit of a shaft (e.g., in 2D or 3D).

As an example, circuitry can include circuitry that receives information from sensors and that adjusts error associated with curvature of an outer surface of the shaft.

As an example, a system can include proximity sensors that include at least two proximity sensors disposed in a plane where a longitudinal axis of a shaft is substantially normal to the plane.

As an example, a system can include a housing where one or more proximity sensors are operatively coupled to the housing. As an example, a sensor package can include at least two of proximity sensors. As an example, a sensor package may be an annulus or a portion of an annulus.

As an example, a system can include a sensor unit that includes a housing, at least one flange and at least two of the proximity sensors. For example, consider a unit that can be bolted between two other units to form a string that can be part of a string of submersible equipment (see, e.g., FIG. 3). As an example, a sensor unit can include a pump inlet section that connects to a pump via a flange.

As an example, circuitry can include circuitry that compares at least one runout value to at least one expected runout value. As an example, circuitry can include circuitry that issues an alarm based at least in part on a comparison of at least one runout value to at least one expected runout value. As an example, a system can include memory that stores expected runout value information.

As an example, a system can include circuitry that includes circuitry that performs a Fast Fourier Transform such as, for example, a Zoom Fast Fourier Transform.

As an example, a system can include a wheel connected to a shaft where one or more proximity sensors are directed at a rim of the wheel.

As an example, a system can include at least one bearing that rotatably supports a shaft. As an example, a system can include at least one bearing that supports a reciprocating shaft. As an example, a system can include a shaft that rotates and/or reciprocates. In such an example, the system can include one or more proximity sensors and associated circuitry.

As an example, a system can include circuitry that includes circuitry that associates runout values to at least one bearing that supports a shaft that can be driven by an electric motor. As an example, a system can include at least one ceramic bearing.

As an example, a system can be an electric submersible pump system that includes one or more proximity sensors.

As an example, a method can include receiving parameter values based on measurements acquired by proximity sensors adjacent to a shaft driven by a submersible electric motor of a system; and determining an operational state of the system based at least in part on the parameter values. In such an example, the parameter values can include runout values.

As an example, a method can include operating two proximity sensors positioned orthogonally or at a known azimuthal separation to define an intersection point with respect to a rotating component such as a shaft. In such an example, the intersection point can correspond to a longitudinal axis of a shaft in a stationary state where, for example, wear may be a minimal due to the system being new, refurbished, at a surface prior to deployment downhole in a fluid environment, etc. As an example, parameter values can correspond to distances between an intersection point and a longitudinal axis of a shaft.

As an example, a method can include acquiring measurements via a single analog to digital converter operatively coupled to a multiplexer where the multiplexer is operatively coupled to outputs of a plurality of sensors.

As an example, a method can include determining parameter values via circuitry operatively coupled to one or more proximity sensors and transmitting the parameter values via transmission circuitry.

As an example, an operational state of a system can be determined based at least in part on a trend in parameter values with respect to time.

As an example, a method can include determining drift as to at least one proximity sensor. In such an example, a method can include compensating for drift as to at least one proximity sensor.

As an example, a method can include adjusting for curvature of a surface of a shaft. For example, a shift in a shaft laterally may cause an aperture of a sensor to be directed at a smaller chord of the shaft (e.g., a chord as a line passing through the shaft that is less than a shaft diameter) that may inherently cause an increase in distance between a surface of the shaft the aperture of the sensor. In such an example, a method can adjust one or more signals, measurements, parameter values, etc. to compensate for an increase in distance.

As an example, a method can include operating at least two proximity sensors at at least two different frequencies.

As an example, a method can include determining rotational speed of a shaft based at least in part on lateral distances measured by proximity sensors.

As an example, a method can include estimating rotational speed of a shaft as being within a predefined range of an electrical driving frequency of an electric motor and analyzing a corresponding spectrum of lateral distance measurements with respect to time. In such an example, a peak in the spectrum can correspond to an estimate of rotational speed of the shaft. As an example, a frequency resolution of a spectrum of lateral distance measurements with respect to time may be reduced to be less than the reciprocal of a length of a sample.

As an example, a method can include performing a spectral analysis of proximity distance and comparing magnitude and phase of individual harmonics to stored information. As an example, a method can include performing a spectral analysis of proximity distance and comparing magnitude and phase of individual harmonics to prior data.

As an example, one or more methods described herein may include associated computer-readable storage media (CRM) blocks. Such blocks can include instructions suitable for execution by one or more processors (or cores) to instruct a computing device or system to perform one or more actions. As an example, a computer-readable storage medium may be a storage device that is not a carrier wave (e.g., a non-transitory storage medium that is not a carrier wave).

Figure 34:
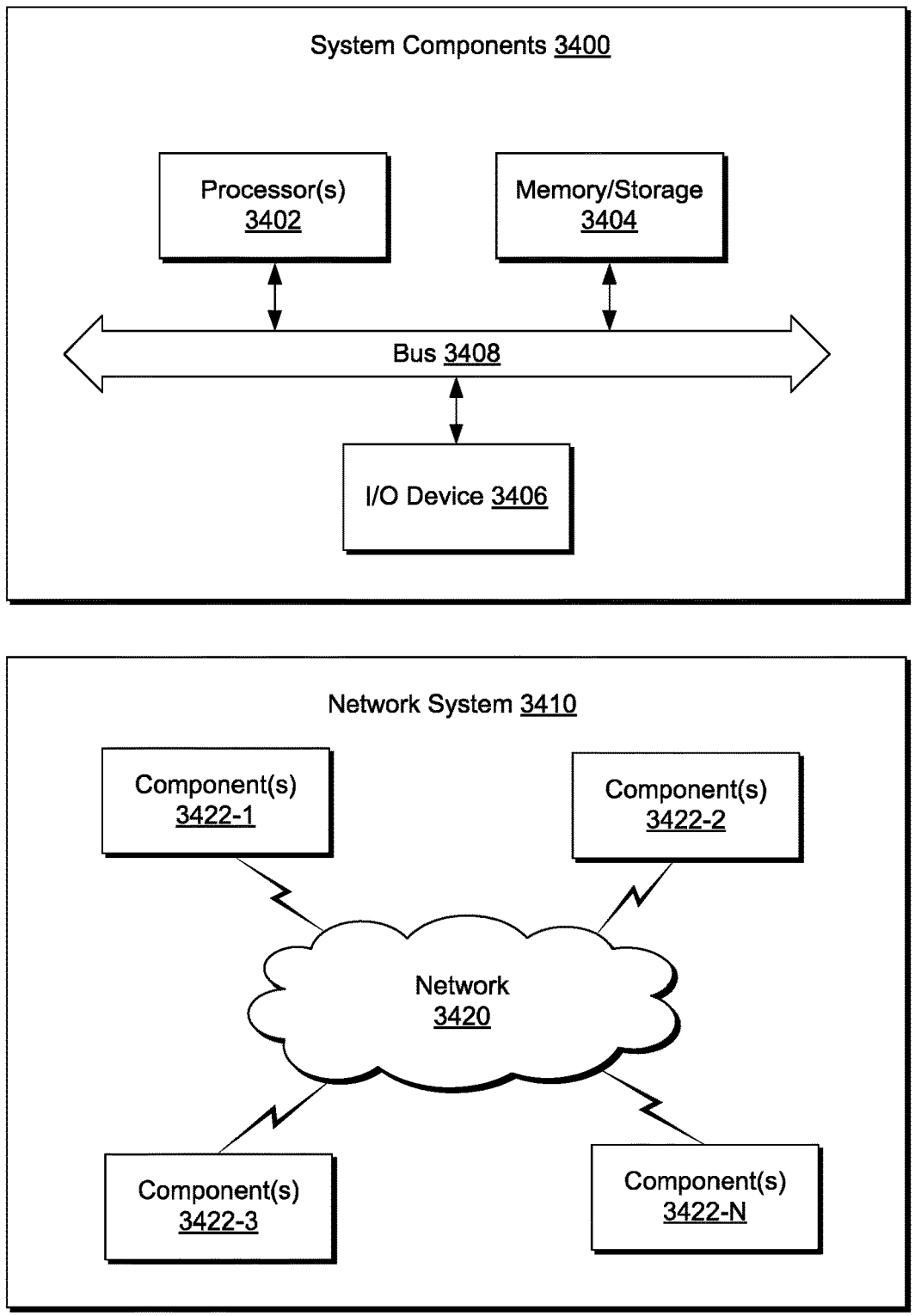
FIG. 34 illustrates example components of a system and a networked system.

FIG. 34 shows components of a computing system 3400 and a networked system 3410. The system 3400 includes one or more processors 3402, memory and/or storage components 3404, one or more input and/or output devices 3406 and a bus 3408. According to an embodiment, instructions may be stored in one or more computer-readable media (e.g., memory/storage components 3404). Such instructions may be read by one or more processors (e.g., the processor(s) 3402) via a communication bus (e.g., the bus 3408), which may be wired or wireless. The one or more processors may execute such instructions to implement (wholly or in part) one or more attributes (e.g., as part of a method). A user may view output from and interact with a process via an I/O device (e.g., the device 3406). According to an embodiment, a computer-readable medium may be a storage component such as a physical memory storage device, for example, a chip, a chip on a package, a memory card, etc.

According to an embodiment, components may be distributed, such as in the network system 3410. The network system 3410 includes components 3422-1, 3422-2, 3422-3, . . . 3422-N. For example, the components 3422-1 may include the processor(s) 3402 while the component(s) 3422-3 may include memory accessible by the processor(s) 3402. Further, the component(s) 3422-2 may include an I/O device for display and optionally interaction with a method. The network may be or include the Internet, an intranet, a cellular network, a satellite network, etc.

Although only a few examples have been described in detail above, those skilled in the art will readily appreciate that many modifications are possible in the examples. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words "means for" together with an associated function.

What is claimed is:

1. A system comprising:
    a housing that defines an interior space wherein the housing comprises a longitudinal axis;
    a shaft disposed at least in part in the interior space of the housing wherein the shaft comprises a longitudinal axis, a curved surface, an end surface, and at least one target;
    a submersible electric motor operatively coupled to the shaft wherein the submersible electric motor comprises a cable connector;
    two proximity sensors wherein each of the two proximity sensors comprises a sensor aperture disposed in the interior space of the housing;
    a medium disposed between each of the two proximity sensors and the shaft, the medium comprising one or more non-magnetic materials configured to reduce interference between each sensor and the at least one target; and
    circuitry operatively coupled to the two proximity sensors that determines position values of the shaft with respect to time based at least in part on output of the two proximity sensors.

2. The system of claim 1 wherein the circuitry is disposed in the interior space of the housing.

3. The system of claim 1 wherein the circuitry determines the position values based at least in part on curvature of the curved surface.

4. The system of claim 1 wherein the shaft comprises a wheel and wherein the curved surface corresponds to a surface of a rim of the wheel.

5. The system of claim 1 wherein the two proximity sensors are disposed in a transverse plane, directed toward an intersection point and separated by an arc distance.

6. The system of claim 1 wherein the sensor aperture is defined at least in part by a coil wherein the coil comprises a substantially circular coil or a substantially rectangular coil.

7. The system of claim 1 wherein the circuitry determines runout based at least in part on the position values.

8. The system of claim 1 wherein the circuitry determines an orbit of the longitudinal axis of the shaft based at least in part on the position values.

9. The system of claim 1 wherein the circuitry determines direction of rotation of the shaft based at least in part on the position values, rotation speed of the shaft based at least in part on the position values or direction of rotation and rotation speed of the shaft based at least in part on the position values.

10. The system of claim 1 wherein the circuitry determines an axial shift of the shaft based at least in part on the position values.

11. The system of claim 1 wherein the circuitry comprises frequency domain conversion circuitry.

12. The system of claim 1 wherein the circuitry is electrically coupled to the cable connector of the submersible electric motor for transmission of information from the circuitry to the cable connector.

13. The system of claim 1 comprising at least one redundant proximity sensor, at least one reference proximity sensor or at least one redundant proximity sensor and at least one reference proximity sensor.

14. The system of claim 1, the housing comprising two recesses, the medium comprising two window plugs, one of the two window plugs seated in an end of each of the two recesses, and one of the two proximity sensors disposed in each of the two recesses, such that each of the two window plugs is positioned radially between the respective one of the two proximity sensors and the shaft.

15. A method comprising:
    receiving parameter values for a shaft disposed at least in part in a housing and driven by a submersible electric motor wherein the parameter values are based at least in part on measurements acquired by proximity sensors disposed in the housing, a medium disposed between each of the proximity sensors and the shaft, the medium comprising one or more non-magnetic materials configured to reduce interference; and
    determining an operational state of the system based at least in part on the parameter values.

16. The method of claim 15 wherein the parameter values comprise at least one member selected from a group consisting of runout values, orbit values, direction of rotation values, rotation speed values and axial shift values.

17. The method of claim 15 wherein the parameter values are based at least in part on a frequency domain conversion.

18. The method of claim 15 comprising two proximity sensors positioned at a known azimuthal separation to define an intersection point wherein the intersection point corresponds to a longitudinal axis of the shaft in a stationary state and wherein the parameter values correspond to distances between the intersection point and the longitudinal axis.

19. The method of claim 15 wherein the receiving comprises receiving the parameter values via a cable electrically coupled to the submersible electric motor.

20. A protector of an electric submersible pump system, the protector comprising:
- a shaft that comprises a longitudinal axis;
- a thrust bearing;
- a runner;
- a proximity sensor comprising a proximity detection circuit and a body, wherein the proximity sensor is directed axially such that the proximity detection circuit and the body are aligned along an axis parallel to the longitudinal axis; and
- circuitry that determines axial distance between a surface of the thrust bearing and a surface of the runner based at least in part on output of the proximity sensor.

* * * * *